United States Patent
Kato et al.

(10) Patent No.: US 11,081,799 B2
(45) Date of Patent: Aug. 3, 2021

(54) ANTENNA DEVICE

(71) Applicant: Murata Manufacturing Co., Ltd., Nagaokakyo (JP)

(72) Inventors: Noboru Kato, Nagaokakyo (JP); Masahiro Ozawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 43 days.

(21) Appl. No.: 16/287,367

(22) Filed: Feb. 27, 2019

(65) Prior Publication Data

US 2019/0199001 A1 Jun. 27, 2019

Related U.S. Application Data

(63) Continuation of application No. PCT/JP2017/041679, filed on Nov. 20, 2017.

(30) Foreign Application Priority Data

Nov. 29, 2016 (JP) .............................. JP2016-231640

(51) Int. Cl.
*H01Q 11/12* (2006.01)
*G06K 7/10* (2006.01)
(Continued)

(52) U.S. Cl.
CPC .............. *H01Q 11/12* (2013.01); *G06K 7/10* (2013.01); *H01Q 1/2216* (2013.01); *H01Q 1/24* (2013.01);
(Continued)

(58) Field of Classification Search
CPC . H01Q 11/12; H01Q 1/38; H01Q 3/24; H01Q 25/00; H01Q 9/0407; H01Q 9/065; H01Q 11/02; G06K 7/10
See application file for complete search history.

(56) References Cited

U.S. PATENT DOCUMENTS

| 2,039,988 A | 5/1936 | Graves, Jr. |
| 4,427,984 A * | 1/1984 | Anderson ................ H01Q 3/32 343/764 |

(Continued)

FOREIGN PATENT DOCUMENTS

| CA | 2963899 | * | 4/2016 |
| JP | S63260302 A | | 10/1988 |

(Continued)

OTHER PUBLICATIONS

International Search Report issued for PCT/JP2017/041679, dated Feb. 6, 2018.

(Continued)

*Primary Examiner* — Daniel I Walsh
(74) *Attorney, Agent, or Firm* — Arent Fox LLP

(57) ABSTRACT

An antenna device is provided that can be designed easily and includes a flat antenna of which communication characteristics do not change significantly even when there exist metallic objects or the like in the surroundings. Moreover, the flat antenna is provided with an antenna-side signal line path conductor, an antenna-side first ground conductor, a matching circuit part, and an antenna-side connector part which are provided in an antenna-side insulator. The antenna device further includes a signal transmission cable that is provided with a radiation area setting part in the vicinity of a cable-side connector part. The antenna device is designed such that, by connecting the antenna-side connector part and the cable-side connector part to each other, substantially the entire surface of the flat antenna serves as a radiation part that radiates electromagnetic waves.

22 Claims, 35 Drawing Sheets

(51) Int. Cl.
*H01Q 9/06* (2006.01)
*H01Q 25/00* (2006.01)
*H01Q 3/24* (2006.01)
*H01Q 1/24* (2006.01)
*H01Q 1/22* (2006.01)
*H01Q 1/50* (2006.01)
*H04B 5/02* (2006.01)
*H01Q 1/38* (2006.01)
*H01Q 11/02* (2006.01)
*H01Q 5/35* (2015.01)
*H03H 7/00* (2006.01)
*H01P 3/08* (2006.01)

(52) U.S. Cl.
CPC ............... *H01Q 1/38* (2013.01); *H01Q 1/50* (2013.01); *H01Q 5/35* (2015.01); *H01Q 9/065* (2013.01); *H01Q 11/02* (2013.01); *H04B 5/02* (2013.01); *H01P 3/085* (2013.01); *H01Q 3/24* (2013.01); *H01Q 25/001* (2013.01); *H03H 7/00* (2013.01)

(56) References Cited

U.S. PATENT DOCUMENTS

| | | | | |
|---|---|---|---|---|
| 5,363,114 A * | 11/1994 | Shoemaker | H01Q 1/1271 | 343/713 |
| 5,402,136 A * | 3/1995 | Goto | H01Q 1/38 | 343/700 MS |
| 5,541,610 A * | 7/1996 | Imanishi | H01Q 1/242 | 343/702 |
| 5,825,334 A * | 10/1998 | Gherardini | H01Q 1/085 | 343/830 |
| 5,929,812 A * | 7/1999 | Aminzadeh | H01Q 1/3291 | 343/700 MS |
| 6,917,333 B2 * | 7/2005 | Ikegaya | H01Q 1/1221 | 343/700 MS |
| 8,704,725 B2 * | 4/2014 | Xu | H01Q 9/30 | 343/847 |
| 9,570,784 B2 * | 2/2017 | Baba | H01P 5/028 | |
| 10,374,304 B2 * | 8/2019 | Taniguchi | H01Q 1/52 | |
| 10,734,736 B1 * | 8/2020 | McCandless | H01Q 1/38 | |
| 10,971,813 B2 * | 4/2021 | McCandless | H01Q 1/364 | |
| 2002/0027528 A1 * | 3/2002 | Okabe | H01Q 13/106 | 343/702 |
| 2002/0060647 A1 * | 5/2002 | Masuda | H01Q 1/243 | 343/767 |
| 2002/0135525 A1 * | 9/2002 | Ikegaya | H01Q 9/0421 | 343/767 |
| 2002/0186169 A1 * | 12/2002 | Iwai | H01Q 9/0414 | 343/702 |
| 2003/0034932 A1 * | 2/2003 | Huebner | H01Q 9/40 | 343/795 |
| 2004/0183733 A1 * | 9/2004 | Aoyama | H01Q 1/243 | 343/702 |
| 2005/0200556 A1 * | 9/2005 | Lin | H01Q 9/42 | 343/904 |
| 2006/0290578 A1 * | 12/2006 | Wang | H01Q 9/42 | 343/702 |
| 2007/0103367 A1 * | 5/2007 | Wang | H01Q 9/42 | 343/700 MS |
| 2007/0262903 A1 | 11/2007 | Yamada et al. | | |
| 2007/0268143 A1 | 11/2007 | Copeland et al. | | |
| 2008/0284654 A1 * | 11/2008 | Burnside | G06K 7/0008 | 343/700 MS |
| 2008/0316111 A1 * | 12/2008 | Aoyama | H01Q 9/40 | 343/700 MS |
| 2010/0049261 A1 * | 2/2010 | Bare | A61N 1/40 | 607/1 |
| 2010/0188306 A1 * | 7/2010 | Kitayoshi | H01Q 13/18 | 343/767 |
| 2010/0194500 A1 | 8/2010 | Suzuki et al. | | |
| 2011/0199920 A1 | 8/2011 | Takei et al. | | |
| 2012/0026067 A1 * | 2/2012 | Parsche | H01Q 1/38 | 343/904 |
| 2012/0161938 A1 * | 6/2012 | Kilian | G06K 7/10425 | 340/10.1 |
| 2012/0274529 A1 | 11/2012 | Yoshino et al. | | |
| 2013/0050042 A1 | 2/2013 | Yoshino et al. | | |
| 2013/0088398 A1 * | 4/2013 | Utagawa | H05K 1/0243 | 343/745 |
| 2013/0265205 A1 * | 10/2013 | Okano | H01Q 1/40 | 343/787 |
| 2016/0197408 A1 * | 7/2016 | Kilian | H01Q 1/2208 | 343/793 |
| 2018/0241433 A1 * | 8/2018 | Kilian | H01Q 9/16 | |
| 2019/0199001 A1 * | 6/2019 | Kato | G06K 7/10 | |
| 2019/0221914 A1 * | 7/2019 | Kato | H01Q 9/30 | |

FOREIGN PATENT DOCUMENTS

| | | |
|---|---|---|
| JP | 2002228698 A | 8/2002 |
| JP | 2004311334 A | 11/2004 |
| JP | 2005192172 A | 7/2005 |
| JP | 2007306438 A | 11/2007 |
| JP | 2008519571 A | 6/2008 |
| JP | 2010183361 A | 8/2010 |
| JP | 2011103643 A | 5/2011 |
| JP | 2011182380 A | 9/2011 |
| JP | 2012028968 A | 2/2012 |
| JP | 2013214909 | * 10/2013 |
| JP | 2014090383 A | 5/2014 |
| JP | 2014143593 A | 8/2014 |
| JP | 2014179671 A | 9/2014 |
| WO | 2004068737 A1 | 8/2004 |
| WO | 2011142231 A1 | 11/2011 |

OTHER PUBLICATIONS

Written Opinion of the International Searching Authority issued for PCT/JP2017/041679, dated Feb. 6, 2018.

* cited by examiner

ANTENNA DEVICE

CROSS REFERENCE TO RELATED APPLICATIONS

The present application is a continuation of PCT/JP2017/041679 filed Nov. 20, 2017, which claims priority to Japanese Patent Application No. 2016-231640, filed Nov. 29, 2016, the entire contents of each of which are incorporated herein by reference.

TECHNICAL FIELD

The present invention relates to an antenna device that includes a flat antenna having a flat shape, and an electronic instrument and a rack for displaying merchandise, that each use the antenna device.

BACKGROUND

A thin-type flat antenna configured by processing a leaky coaxial cable to have a flat plate shape is present as a typical thin-type flat antenna, as described in Patent Documents 1 and 2, for example.

Patent Document 1: Japanese Laid-Open Patent Publication No. 2012-28968.

Patent Document 2: Japanese Laid-Open Patent Publication No. 2010-183361.

In such configurations, the attenuation amount of a leaky coaxial cable is increased as the length of the cable is increased. For the leaky coaxial cable, precision is demanded to the shape and the position of its slot for leaking an electric wave, and designing the slot is therefore complicated and troublesome. When a metal item or the like is present on the periphery of the leaky coaxial cable, a problem arises that the communication property thereof is significantly varied.

SUMMARY OF THE INVENTION

An object of the present invention is to provide an antenna device configured for easy design and that includes a flat antenna whose communication property is not significantly varied even when a metal item or the like is present on the periphery thereof. In addition, the present disclosure provides for an electronic instrument and a rack for displaying merchandise, that each use the antenna device.

Accordingly, an antenna device is disclosed that includes a flat antenna including an antenna-side insulator that has a flat shape, a band-like antenna-side signal line path conductor that is disposed on the antenna-side insulator, an antenna-side first ground conductor that is disposed on the antenna-side insulator along the antenna-side signal line path conductor and that is arranged at a predetermined interval or distance from the antenna-side signal line path conductor, and a matching circuit part that matches the impedance of the antenna-side signal line path conductor to an impedance of the antenna-side first ground conductor. Moreover, a signal transmission cable is provided including a cable-like cable-side insulator, a cable-side signal line path conductor that is disposed along a longitudinal direction of the cable-side insulator and whose one end is connected to a power feeding circuit, and a cable-side ground conductor that is arranged at a predetermined interval from the cable-side signal line path conductor and whose one end is connected to the ground, and a radiation area setting part that is disposed in a signal path from the signal transmission cable to the flat antenna, that demarcates the flat antenna as a radiation area, and that sets a signal path in the signal transmission cable to be a non-radiation area.

The electronic instrument according to the present invention includes a housing, in which an antenna device is disposed inside the housing, and in which the antenna device includes a flat antenna including an antenna-side insulator that has a flat shape, a band-like antenna-side signal line path conductor that is disposed on the antenna-side insulator, a band-like antenna-side first ground conductor that is disposed on the antenna-side insulator along the antenna-side signal line path conductor and that is arranged at a predetermined interval or distance from the antenna-side signal line path conductor, and a matching circuit part that matches the impedance of the antenna-side signal line path conductor to an impedance of the antenna-side first ground conductor. Moreover, a signal transmission cable is provided including a cable-like cable-side insulator, a cable-side signal line path conductor that is disposed along a longitudinal direction of the cable-side insulator and whose one end is connected to a power feeding circuit, and a cable-side ground conductor that is arranged at a predetermined interval from the cable-side signal line path conductor and whose one end is connected to the ground, and a radiation area setting part that is disposed in a signal path from the signal transmission cable to the flat antenna, that demarcates the flat antenna as a radiation area, and that sets a signal path in the signal transmission cable to be a non-radiation area.

The rack for displaying merchandise according to the present invention is provided for displaying merchandise each having an RFID tag attached thereto, and the rack includes an antenna device to communicate with the RFID tag, that is laid in a space having the merchandise displayed therein or is laid facing the space, and the antenna device includes a flat antenna including an antenna-side insulator that has a flat shape, a band-like antenna-side signal line path conductor that is disposed on the antenna-side insulator, a band-like antenna-side first ground conductor that is disposed on the antenna-side insulator along the antenna-side signal line path conductor and that is arranged at a predetermined interval or distance from the antenna-side signal line path conductor, and a matching circuit part that matches the impedance of the antenna-side signal line path conductor to an impedance of the antenna-side first ground conductor. Moreover, a signal transmission cable is provided including a cable-like cable-side insulator, a cable-side signal line path conductor that is disposed along a longitudinal direction of the cable-side insulator and whose one end is connected to a power feeding circuit, and a cable-side ground conductor that is arranged at a predetermined interval or distance from the cable-side signal line path conductor and whose one end is connected to the ground, and a radiation area setting part that is disposed in a signal path from the signal transmission cable to the flat antenna, that demarcates the flat antenna as a radiation area, and that sets a signal path in the signal transmission cable to be a non-radiation area.

According to the present invention, an antenna device that has a configuration easy to be designed and that includes a flat antenna whose communication property is not significantly varied even when a metal item or the like is present on the periphery thereof can be provided, and an electronic instrument and a rack for displaying merchandise, that each use the antenna device can be provided.

DETAILED DESCRIPTION

Figure 1:
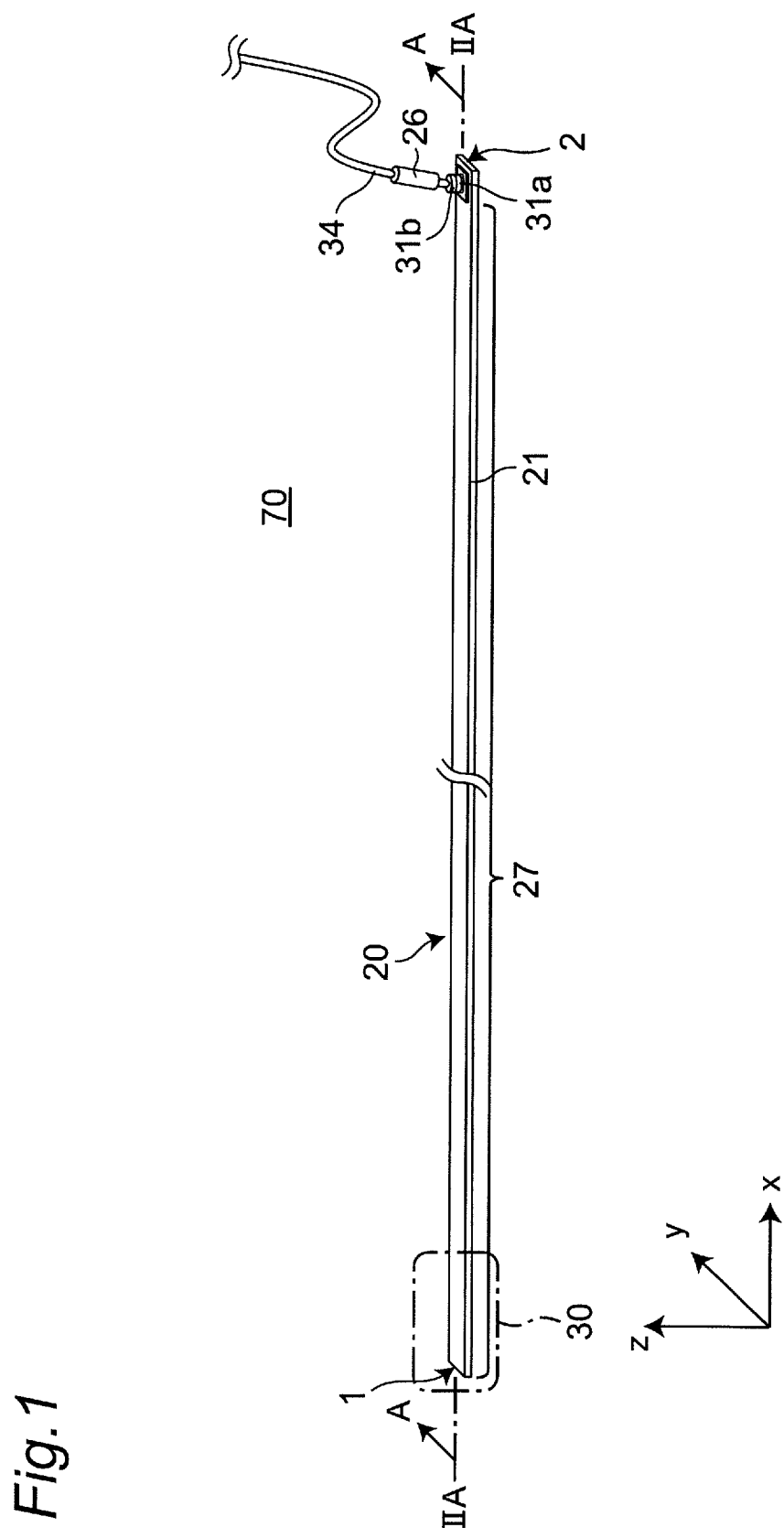
FIG. 1 is a schematic perspective diagram of the configuration of an antenna device of a first exemplary embodiment.

An antenna device of a first exemplary embodiment includes a flat antenna including an antenna-side insulator that has a flat shape, a band-like antenna-side signal line path conductor that is disposed on the antenna-side insulator, a band-like antenna-side first ground conductor that is disposed on the antenna-side insulator along the antenna-side signal line path conductor and that is arranged at a predetermined interval from the antenna-side signal line path conductor, and a matching circuit part that matches the impedance of the antenna-side signal line path conductor to the impedance of the antenna-side first ground conductor A signal transmission cable is provided including a cable-like cable-side insulator, a cable-side signal line path conductor that is disposed along a longitudinal direction of the cable-side insulator and whose one end is connected to a power feeding circuit, and a cable-side ground conductor that is arranged at a predetermined interval from the cable-side signal line path conductor and whose one end is connected to the ground, and a radiation area setting part that is disposed in a signal path from the signal transmission cable to the flat antenna, that demarcates the flat antenna as a radiation area, and that sets a signal path in the signal transmission cable to be a non-radiation area The antenna device of the first embodiment configured as above has the configuration easy to be designed and is established as a highly reliable antenna whose communication property is not significantly varied even when a metal item or the like is present on the periphery thereof.

An antenna device of a second exemplary embodiment can be configured such that the cable-side signal line path conductor is electrically connected to the antenna-side signal line path conductor and the cable-side ground conductor is electrically connected to the antenna-side first ground conductor, and the radiation area setting part may be a magnetic member disposed to cover a portion of the cable-side ground conductor, in the configuration of the first embodiment.

The antenna device of the second embodiment configured as above is established as a highly reliable antenna whose communication property is not significantly varied even when a metal item or the like is present on the periphery thereof.

An antenna device of a third exemplary embodiment can be configured such that the radiation area setting part includes a balanced-to-unbalanced transformer, a balanced terminal of the balanced-to-unbalanced transformer is connected to each of the antenna-side signal line path conductor and the antenna-side first ground conductor, and an unbalanced terminal of the balanced-to-unbalanced transformer is connected to each of the cable-side signal line path conductor and the cable-side ground conductor, in the configuration of the first embodiment.

The antenna device of the third embodiment configured as above is established as a highly reliable antenna whose communication property is not significantly varied even when a metal item or the like is present on the periphery thereof.

An antenna device of a fourth exemplary embodiment, further includes a band-like antenna-side second ground conductor that is disposed on the antenna-side insulator along the antenna-side signal line path conductor and that is arranged at a predetermined interval from the antenna-side signal line path conductor, has one end of the antenna-side second ground conductor connected to the matching circuit part, has the other end of the antenna-side second ground conductor connected to a ground line path, and can have the antenna-side first ground conductor disposed to face the antenna-side signal line path conductor in the thickness direction on the side of one principal surface of the antenna-side signal line path conductor, in the configuration of any one of the first to the third embodiments.

The antenna device of the fourth embodiment configured as above is established as a highly reliable antenna whose communication property is not significantly varied even when a metal item or the like is present on the periphery thereof.

An antenna device of a fifth exemplary embodiment can have the antenna-side first ground conductor disposed therein to face the antenna-side signal line path conductor in the thickness direction on the side of one principal surface of the antenna-side signal line path conductor, and can include, on the side of the other principal surface of the antenna-side signal line path conductor, an antenna-side second ground conductor that faces the antenna-side signal line path conductor in the thickness direction along the antenna-side signal line path conductor, in the configuration of any one of the first to the third embodiments.

The antenna device of the fifth embodiment configured as above is established as a highly reliable antenna whose communication property is not significantly varied even when a metal item or the like is present on the periphery thereof.

An antenna device of a sixth exemplary embodiment has the antenna-side first ground conductor and the antenna-side second ground conductor are electrically connected to each other by an interlayer connection conductor disposed on the antenna-side insulator, in the configuration of the fourth or the fifth embodiment.

The antenna device of the sixth embodiment configured as above is established as a highly reliable antenna whose communication property is not significantly varied even when a metal item or the like is present on the periphery thereof.

An antenna device of a seventh exemplary embodiment can be configured such that the antenna-side second ground conductor includes plural openings that face the antenna-side signal line path conductor in the thickness direction along the longitudinal direction of the antenna-side signal line path conductor, in the configuration of the fourth or the fifth embodiment.

The antenna device of the seventh embodiment configured as above can reduce any floating capacity between the antenna-side signal line path conductor and the antenna-side second ground conductor, and can reduce the thickness of the overall flat antenna.

An antenna device of an eighth exemplary embodiment can be configured such that the matching circuit part includes a capacitance part that is disposed between the antenna-side signal line path conductor and the antenna-side first ground conductor, and an inductance part that is disposed on the antenna-side signal line path conductor, in the configuration of any one of the first to the seventh embodiments.

The antenna device of the eighth embodiment configured as above has the configuration with which the impedance of the antenna-side signal line path conductor and that of the antenna-side first ground conductor can easily be matched with each other by the matching circuit part.

An antenna device of a ninth exemplary embodiment can be configured such that the antenna-side first ground conductor includes an opening or a cutout in an area that faces the inductance part in the thickness direction, in the configuration of the eighth embodiment.

The antenna device of the ninth embodiment configured as above can easily form the function of the matching circuit part of matching the impedance of the antenna-side signal line path conductor and that of the antenna-side first ground conductor with each other.

An antenna device of a tenth exemplary embodiment can have the antenna-side first ground conductor arranged therein to be present next to the antenna-side signal line path conductor in the width direction to sandwich the antenna-side signal line path conductor therebetween, in the configuration of any one of the first to the third embodiments.

In the antenna device of the tenth embodiment configured as above, a coplanar line path can easily be formed by the antenna-side signal line path conductor and the antenna-side first ground conductor.

An antenna device of an eleventh exemplary embodiment can be configured such that the antenna-side first ground conductor is disposed to face in the thickness direction the antenna-side signal line path conductor on the side of one principal surface of the antenna-side signal line path conductor, and that can further include an antenna-side second ground conductor that is arranged next to the antenna-side signal line path conductor in the width direction to sandwich the antenna-side signal line path conductor therebetween, in the configuration of any one of the first to the third embodiments.

In the antenna device of the eleventh embodiment configured as above, a coplanar line path and a micro-strip line path can easily be formed by the antenna-side signal line path conductor, the antenna-side first ground conductor, and the antenna-side second ground conductor.

An antenna device of a twelfth exemplary embodiment can be configured such that the antenna-side first ground conductor includes plural openings that face in the thickness direction the antenna-side signal line path conductor along the longitudinal direction of the antenna-side signal line path conductor, in the configuration of the eleventh embodiment.

The antenna device of the twelfth embodiment configured as above can reduce any floating capacity between the antenna-side signal line path conductor and the antenna-side first ground conductor, and can reduce the thickness at the flat antenna in the antenna device.

An antenna device of a thirteenth exemplary embodiment can be configured such that the antenna-side insulator has a laminated structure of plural insulating layers, in the configuration of any one of the first to the twelfth embodiments.

The antenna device of the thirteenth embodiment configured as above has the configuration easy to be designed and can construct a highly reliable antenna.

An antenna device of a fourteenth exemplary embodiment can be configured such that the radiation part has a meander shape, in the configuration of any one of the first to the thirteenth embodiments.

The antenna device of the fourteenth embodiment configured as above can easily and highly precisely form the inductance in the matching circuit part.

An antenna device of a fifteenth exemplary embodiment can be configured such that antenna-side insulator has a band-like shape along the antenna-side signal line path conductor, in the configuration of any one of the first to the fourteenth embodiments.

The antenna device of the fifteenth embodiment configured as above has a configuration that has the flat antenna shaped in a band-like elongated shape, and the flat antenna can therefore be easily laid at, for example, any one of various positions for displaying merchandise.

An antenna device of a sixteenth exemplary embodiment can be configured such that the antenna-side insulator includes a substantially flat face that has predetermined broadening and the antenna-side signal line path conductor is arranged on the antenna-side insulator to have a meander or a spiral shape, in the configuration of any one of the first to the thirteenth embodiments.

The antenna device of the sixteenth embodiment configured as above can set a communication area for identification to be wide and can facilitate, for example, merchandise management in displaying the merchandise.

An antenna device of a seventeenth exemplary embodiment can have a configuration formed by stacking at least two flat antennas on each other that each include the antenna-side insulator, the antenna-side signal line path conductor, the antenna-side first ground conductor, the matching circuit part, and an antenna-side connector part, and can have a configuration that has the pattern shapes of the antenna-side signal line path conductors in both of the flat antennas are arranged avoiding overlapping on each other, in the configuration of the sixteenth embodiment.

The antenna device of the seventeenth embodiment configured as above can execute further highly precise merchandise management by, for example, setting the merchandise recognition to be reliable in displaying the merchandise, in an identified communication area.

An antenna device of an eighteenth exemplary embodiment can be configured such that a high frequency signal from the power feeding circuit to both of the flat antennas is switched therebetween every predetermined time period, in the configuration of the seventeenth embodiments.

The antenna device of the eighteenth embodiment configured as above can execute further highly precise merchandise management by, for example, setting the merchandise recognition to be further reliable in displaying the merchandise, in an identified communication area.

An antenna device of a nineteenth exemplary embodiment has the radiation area setting part configured to include a balanced-to-unbalanced transformer of a wire-wound transformer type, a merchant type, or a lumped-parameter type, in the configuration of the third embodiment.

The antenna device of the nineteenth embodiment configured as above is established as a highly reliable antenna whose communication property is not significantly varied even when a metal item or the like is present on the periphery thereof.

An electronic instrument of a twentieth exemplary embodiment is an electronic instrument including a housing, and can include an antenna device that is disposed inside the housing, with the antenna device including a flat antenna including an antenna-side insulator that has a flat shape, a band-like antenna-side signal line path conductor that is disposed on the antenna-side insulator, a band-like antenna-side first ground conductor that is disposed on the antenna-side insulator along the antenna-side signal line path conductor and that is arranged at a predetermined interval from the antenna-side signal line path conductor, and a matching circuit part that matches the impedance of the antenna-side signal line path conductor to the impedance of the antenna-side first ground conductor. Moreover, a signal transmission cable is provided including a cable-like cable-side insulator, a cable-side signal line path conductor that is disposed along a longitudinal direction of the cable-side insulator and whose one end is connected to a power feeding circuit, and a cable-side ground conductor that is arranged at a predetermined interval from the cable-side signal line path conductor and whose one end is connected to the ground, and a radiation area setting part that is disposed in a signal path from the signal transmission cable to the flat antenna, that demarcates the flat antenna as a radiation area, and that sets a signal path in the signal transmission cable to be a non-radiation area.

The electronic instrument of the twentieth embodiment configured as above has the configuration easy to be designed and is established as a highly reliable instrument whose communication property is not significantly varied even when a metal item or the like is present on the periphery thereof.

An electronic instrument of a twenty-first exemplary embodiment can be configured such that a battery pack is included inside the housing and the flat antenna is disposed on the battery pack as a flat antenna for communication in an RFID system, in the configuration of the twentieth embodiment.

The electronic instrument of the twenty-first embodiment configured as above has the configuration for the electronic instrument to be easily designed and can construct a highly reliable electronic instrument.

A rack for displaying merchandise of a twenty-second exemplary embodiment is a rack for displaying merchandise to display the merchandise that each has an RFID tag attached thereto, and includes an antenna device to communicate with the RFID tag, that is laid in a space having the merchandise displayed therein or is laid facing the space. Moreover, the antenna device may include a flat antenna including an antenna-side insulator that has a flat shape a band-like antenna-side signal line path conductor that is disposed on the antenna-side insulator, a band-like antenna-side first ground conductor that is disposed on the antenna-side insulator along the antenna-side signal line path conductor and that is arranged at a predetermined interval from the antenna-side signal line path conductor, and a matching circuit part that matches the impedance of the antenna-side signal line path conductor to the impedance of the antenna-side first ground conductor. Moreover, a signal transmission cable is provided including a cable-like cable-side insulator, a cable-side signal line path conductor that is disposed along a longitudinal direction of the cable-side insulator and whose one end is connected to a power feeding circuit, and a cable-side ground conductor that is arranged at a predetermined interval from the cable-side signal line path conductor and whose one end is connected to the ground, and a radiation area setting part that is disposed in a signal path from the signal transmission cable to the flat antenna, that demarcates the flat antenna as a radiation area, and that sets a signal path in the signal transmission cable to be a non-radiation area.

The rack for displaying merchandise of the twenty-second embodiment configured as above is established as a highly reliable rack that has the configuration easy to be designed and whose communication property is not significantly varied even when a metal item or the like is present on the periphery thereof.

The exemplary embodiments of the antenna device will be described below with reference to the accompanying drawings. In the accompanying drawings, members having the substantially same functions and configurations are given the same reference numerals and may not again be described herein. To facilitate understanding, the accompanying drawings each schematically depict mainly the constituent elements therein.

It should be appreciated that the exemplary embodiments described below represent specific examples of the present invention and the present invention is not limited to these configurations. The values, the shapes, the configurations, and the like specifically presented in the embodiments below each only represent an example and do not limit the present invention. Of the constituent elements of the embodiments below, the constituent elements not described in any of the independent claims each presenting the highest concept will be described each as an optional constituent element. In all the embodiments, the same will be applied to the configuration in each of the modification examples and the configurations described in the modification examples may each be combined with each other.

First Exemplary Embodiment

The antenna device of the first embodiment will be described with reference to a flat cable-like antenna as the flat antenna. FIG. 1 is a schematic perspective diagram of an antenna device 70 that includes a flat cable-like antenna 20 of the first embodiment. In FIG. 1, for convenience, an x-axis, a y-axis, and a z-axis intersecting each other each at a right angle are depicted and the longitudinal direction (i.e., the x-direction), the width direction (i.e., the y-direction), and the thickness direction (i.e., the z-direction) of the flat cable-like antenna 20 of the first embodiment will be described using the x-axis, the y-axis, and the z-axis.

As depicted in FIG. 1, the overall flat cable-like antenna 20 in the antenna device 70 is formed into an elongated flat shape and has a bendable configuration. An antenna-side connector part 31a is disposed on one end of the flat cable-like antenna 20 and the other end of the flat cable-like antenna 20 is the tip thereof. For the flat cable-like antenna 20 of the first embodiment, the description will be made for the tip to be referred to as "first end 1" and the end portion having the antenna-side connector part 31a disposed thereon on the opposite side to be referred to as "second end 2".

The substantially overall flat cable-like antenna 20 having the elongated, flat, and flat plate-like shape acts as a radiation part 27 that is configured to radiate an electromagnetic wave to execute communication in the RFID system. The antenna-side connector part 31a of the flat cable-like antenna 20 is connected to a cable-side connector part 31b of a coaxial cable 34 and is connected to a power feeding circuit (e.g., a reader device or a reader and writer device) described later through the coaxial cable 34 that is a signal transmission cable. The power feeding circuit (i.e., the reader device or the reader and writer device) supplies a predetermined high frequency signal to a conductor layer forming the radiation part 27 of the flat cable-like antenna 20 through the coaxial cable 34. The RFID system used in this case is a UHF-band RFID system that uses, for example, a 900 MHz-band and the antenna 20 functions as an antenna for a UHF-band reader device.

As depicted in FIG. 1, a magnetic member 26 is disposed in the vicinity of (i.e., adjacent to) the cable-side connector part 31b of the coaxial cable 34 that is the signal transmission cable. The magnetic member 26 has a cylindrical shape and is penetrated by the coaxial cable 34. For example, ferrite and the like are usable each as the material of the magnetic member 26. The magnetic member 26 may be disposed at a predetermined position of the coaxial cable 34 such as, for example, the one in the vicinity of the cable-side connector part 31b using not only hard ferrite such as a sintered block but also soft ferrite formed by kneading ferrite in a resin. The shape and the material quality of the magnetic material 26 is select as a material that can suppress any radiation of the electromagnetic wave from the coaxial cable 34 that attenuates the high frequency signal flowing through a cable-side external conductor of the coaxial cable 34 such that the substantially overall face of the flat cable-like antenna 20 acts as the radiation part 27. The magnetic member 26 is configured as the radiation area setting part that demarcates the radiation part 27 in the antenna device of the first embodiment.

Figure 2:
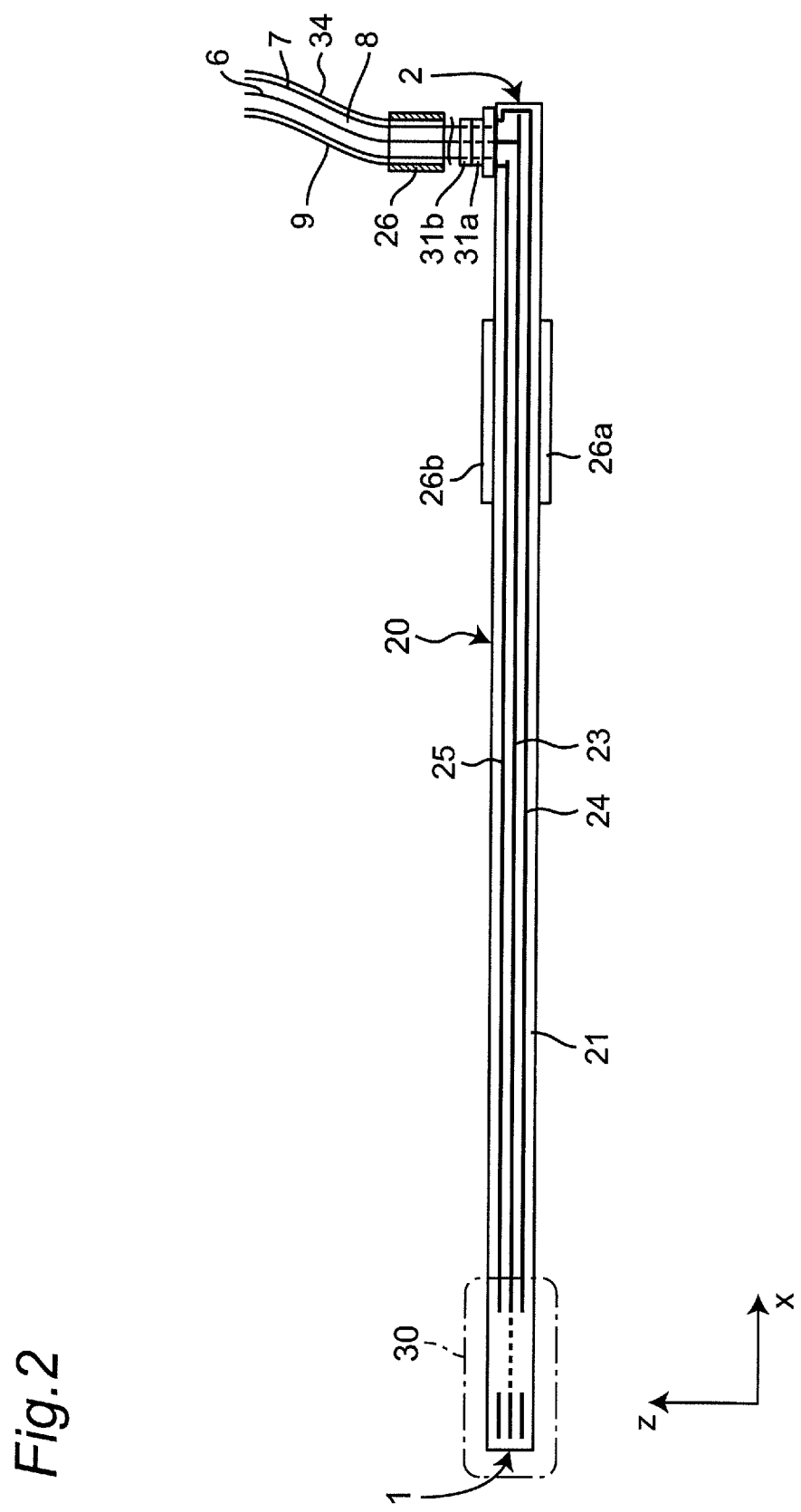
FIG. 2 is a cross-sectional diagram of a flat antenna in the antenna device in FIG. 1, taken along a longitudinal direction thereof.
Figure 3:
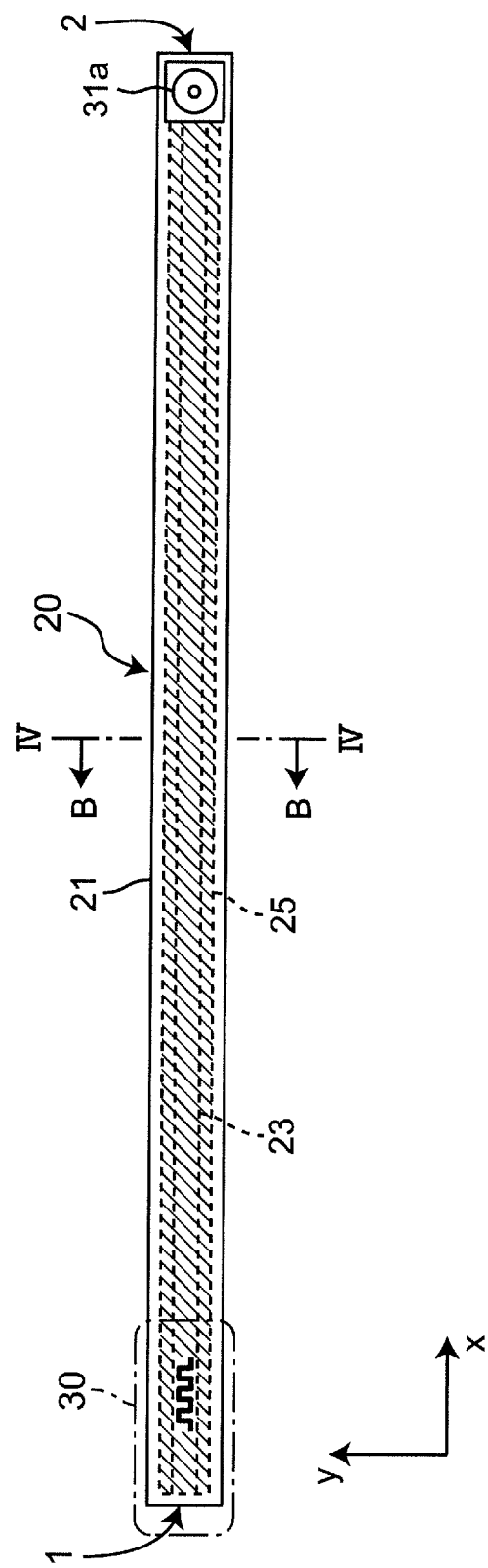
FIG. 3 is a plan diagram of the flat antenna in the antenna device in FIG. 1.
Figure 4:
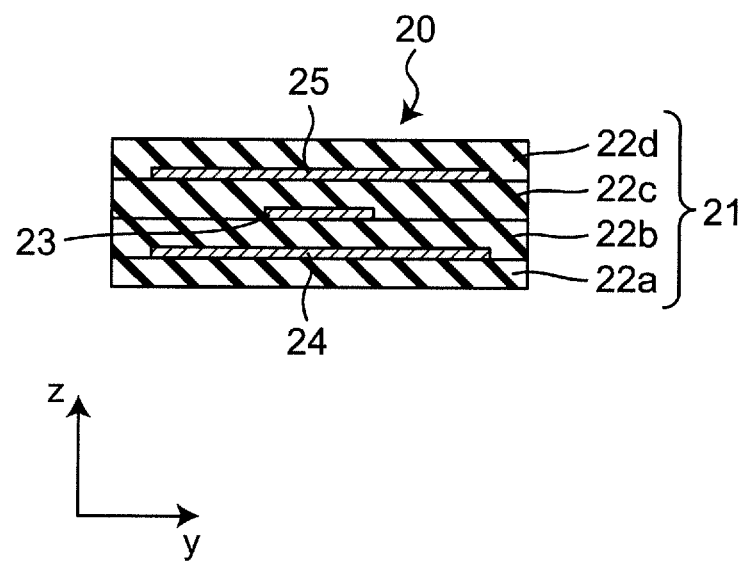
FIG. 4 is a cross-sectional diagram taken by cutting the flat antenna in FIG. 3 along a lateral direction thereof.
Figure 5:
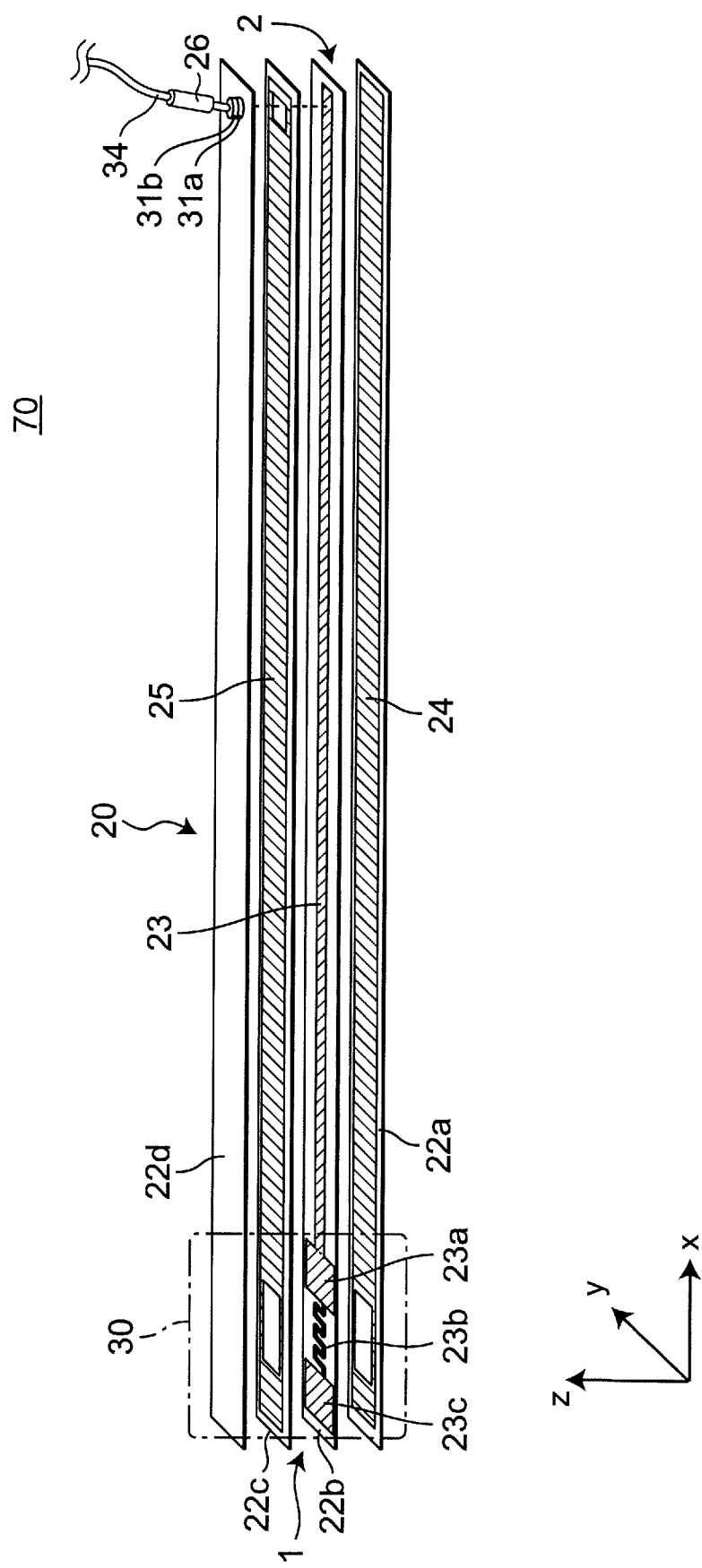
FIG. 5 is an exploded perspective diagram of the flat antenna in the antenna device in FIG. 1.

FIG. 2 is a cross-sectional diagram of the flat cable-like antenna 20 depicted in FIG. 1 taken by cutting along a II-II line thereof. The cross-sectional diagram of FIG. 2 is a cross-sectional diagram taken by cutting the flat cable-like antenna 20 in FIG. 1 along the longitudinal direction (the x-direction) thereof and seeing the flat cable-like antenna 20 in an A direction. FIG. 3 is a plan diagram of the flat cable-like antenna 20 in FIG. 1. FIG. 4 is a cross-sectional diagram of the flat cable-like antenna 20 depicted in FIG. 3 taken by cutting along a IV-IV line and seen in a B direction. FIG. 5 is an exploded perspective diagram of the flat cable-like antenna 20 in the antenna device 70 depicted in FIG. 1.

As depicted in FIG. 4 and FIG. 5, the flat cable-like antenna 20 of the first embodiment includes plural insulating layers 22a, 22b, 22c, and 22d and plural conductor layers 23, 24, and 25 that are stacked on each other. The plural insulating layers 22a, 22b, 22c, and 22d form one insulator 21 (an antenna-side insulator) by being stacked on each other. The flat cable-like antenna 20 has the longitudinal direction (i.e., the x-direction), the width direction (i.e., the y-direction), and the thickness direction (i.e., the z-direction).

The flat cable-like antenna 20 of the antenna device 70 of the first embodiment includes the insulator 21 that is a flat plate-like antenna-side insulator having an elongated and thin band-like shape, and the first conductor layer 23, the second conductor layer 24, the third conductor layer 25, and a matching circuit part 30 are disposed inside the insulator 21. The first conductor layer 23 is disposed from the first end 1 (the tip) in the longitudinal direction (the x-direction) of the insulator 21 along the second end 2 (the connection end) and is configured such that the cable-side connector part 31b of the coaxial cable 34 is connected to the antenna-side connector part 31a (i.e., a matching circuit) that is disposed on the second end 2 at the tip of the flat cable-like antenna 20. The first conductor layer 23 is connected to the antenna-side connector part 31a and the cable-side connector part 31b and is connected to the power feeding circuit (the reader device or the reader and writer device) described later through the coaxial cable (the signal transmission cable) 34. The power feeding circuit (the reader device or the reader and writer device) supplies a predetermined high frequency signal to the first conductor layer 23 through the coaxial cable 34.

The first conductor layer 23 will herein be also referred to as "antenna-side internal conductor" or "antenna-side signal line path conductor" in the flat cable-like antenna 20. The second conductor layer 24 will be referred to as "antenna-side first external conductor" or "antenna-side first ground conductor", and the third conductor layer 25 will be referred to as "antenna-side second external conductor" or "antenna-side second ground conductor".

In the flat cable-like antenna 20, the second conductor layer 24 also referred to as "antenna-side first external conductor (the antenna-side first ground conductor)" connected to the substantial ground line path is disposed from the first end 1 as the tip in the longitudinal direction (the x-direction) of the insulator (the antenna-side insulator) 21 to the second end 2 along the first conductor layer (the antenna-side signal line path conductor) 23. The second conductor layer (the antenna-side first ground conductor) 24 is disposed to face the first conductor layer 23 in the thickness direction (the z-direction) at a predetermined interval (i.e., a predetermined or set distance) therefrom on the side of one principal surface (the lower face side in FIG. 5) of the first conductor layer 23.

In the flat cable-like antenna 20, similar to the second conductor layer (the antenna-side first ground conductor) 24, the third conductor layer 25 also referred to as "second external conductor (the antenna-side second ground conductor)" connected to the substantial ground line path is disposed from the first end 1 as the tip in the longitudinal direction (the x-direction) of the insulator 21 to the second end 2 along the first conductor layer 23. The third conductor layer 25 (the antenna-side second ground conductor) is arranged to face the first conductor layer (the antenna-side signal line path conductor) 23 in the thickness direction (the z-direction) at a predetermined interval therefrom on the side of the other principal surface (the upper face side in FIG. 5) of the first conductor layer 23.

As depicted in the cross-sectional diagram of FIG. 4, in the flat cable-like antenna 20 of the first embodiment, the first conductor layer 23, the second conductor layer 24, and the third conductor layer 25 are arranged in the plural insulating layers 22a, 22b, 22c, and 22d that are stacked on each other, and the first conductor layer 23, the second conductor layer 24, and the third conductor layer 25 are arranged to each face each other through the insulating layer. Referring to the plural insulating layers 22a, 22b, 22c, and 22d as "first insulating layer 22a", "second insulating layer 22b", "third insulating layer 22c", and "fourth insulating layer 22d" sequentially from the lower side in FIG. 4, the first conductor layer 23 is arranged between the second insulating layer 22b and the third insulating layer 22c, the second conductor layer 24 is arranged between the first insulating layer 22a and the second insulating layer 22b, and the third conductor layer 25 is arranged between the third insulating layer 22c and the fourth insulating layer 22d. In other words, the inside of the insulator 21 has a configuration according to which the first conductor layer 23 is sandwiched by the second conductor layer 24 and the third conductor layer 25 in the thickness direction (the z-direction) being faced thereby each at a predetermined interval. As a result, in the flat cable-like antenna 20 of the first embodiment, a micro-strip line path is configured for the first conductor layer 23 by each of the second conductor layer 24 and the third conductor layer 25.

In the flat cable-like antenna 20 configured as above, the length of the first conductor layer 23 in the width direction (the y-direction) is shorter than the length of each of the second conductor layer 24 and the third conductor layer 25 and the width of the first conductor layer 23 is smaller than those thereof. Both edge positions of each of the second conductor layer 24 and the third conductor layer 25 in the width direction (the y-direction) are arranged on the side more external than those of the first conductor layer 23. Advantageously, any influence of the electro-magnetic wave from the exterior to the first conductor layer 23 is suppressed by forming the second conductor layer 24 and the third conductor layer 25 than the width of the first conductor layer 23. An effect is achieved that any self-interference can be suppressed in the case where the flat cable-like antenna 20 is folded and the first conductor layer 23 overlaps on itself, by configuring as above.

The matching circuit part 30 is disposed on the side of the first end 1 as the tip side of the insulator 21 and matches the impedance of the first conductor layer 23 with the impedance of each of the second conductor layer 24 and the third conductor layer 25. The matching circuit part 30 of the first embodiment includes conductor patterns whose partial shapes are each changed on the side of the first end 1 of each of the first conductor layer 23, the second conductor layer 24, and the third conductor layer 25. The details of the matching circuit part 30 will be described later.

The flat cable-like antenna 20 of the first embodiment has the antenna-side connector part 31a disposed therein to externally connect each of the first conductor layer 23, the second conductor layer 24, and the third conductor layer 25 to the second end 2. As described later, the antenna-side connector part 31a is configured to be connectable to the cable-side connector part 31b disposed on the coaxial cable 34 that is the signal transmitting cable. The antenna-side connector part 31a includes an antenna-side signal terminal connected to the first conductor layer 23 and an antenna-side ground terminal connected to the second conductor layer 24 and the third conductor layer 25.

The length of the flat cable-like antenna 20 can properly be increased when necessary. For example, the length may be increased by connecting in series plural flat cable-like antennas each having the same cross-sectional structure, each through a coaxial cable. In this case, the matching circuit part is disposed on the flat cable-like antenna at the head position and no matching circuit part needs to be disposed on other flat cable-like antennas. The magnetic member 26 functioning as the radiation area setting part is disposed on the coaxial cable that is connected to the flat cable-like antenna at the tail position and can thereby expand all the flat cable-like antennas as an area of the radiation part.

The first conductor layer 23, the second conductor layer 24, and the third conductor layer 25 each couple the extended plural flat cable-like antennas through no coaxial cable and can thereby also form one flat antenna through no coaxial cable. In this case, the second conductor layer 24, the first conductor layer 23, and the third conductor layer 25 only have to be configured to be derived from an end face of each of the flat cable-like antennas and to respectively be electrically connected to the second conductor layer 24, the first conductor layer 23, and the third conductor layer 25 each derived from an end face of another flat cable-like antenna. In this case, the matching circuit part 30 is disposed on the flat cable-like antenna at the head position and no matching circuit part needs to be disposed on the other flat cable-like antennas. The magnetic member 26 is disposed on the coaxial cable connected to the flat cable-like antenna at the tail position. For example, the configuration thereof only has to be employed according to which a shape capable of fitting with the end face of the flat cable-like antenna is included and each of the conductor layers is electrically connected when the fitting is established. In this case, the connection only has to be established such that a signal can be transmitted to the conductor layers to which the first conductor layer 23, the second conductor layer 24, and the third conductor layer 25 correspond, in each of the flat cable-like antennas.

For a traditional leaky coaxial cable, designing of the shape of the slot and the like is conducted in advance in accordance with the length of the leaky coaxial cable and it is therefore not easy to increase the length after the designing. On the other hand, as above, the flat cable-like antenna of the first embodiment advantageously has the configuration with which the length can easily be increased properly in accordance with the environment for the flat cable-like antenna to be arranged in.

As depicted in FIG. 4 and FIG. 5, noting each portion forming the overall flat cable-like antenna 20 in the antenna device 70, the flat cable-like antenna 20 is formed by stacking on each other the plural insulating layers 22a, 22b, 22c, and 22d and the plural conductor layers 23, 24, and 25 as above. For example, the flat cable-like antenna 20 is formed by sequentially stacking on each other the first insulating layer 22a having the second conductor layer 24 (the antenna-side first ground conductor) disposed therein, the second insulating layer 22b having the first conductor layer (the antenna-side signal line path conductor) 23 disposed therein, the third insulating layer 22c having the third conductor layer 25 (the antenna-side second ground conductor) disposed therein, and the fourth insulating layer 22d. The one insulator 21 (the antenna-side insulator) is formed by stacking on each other the first insulating layer 22a, the second insulating layer 22b, the third insulating layer 22c, and the fourth insulating layer 22d. The first insulating layer 22a, the second insulating layer 22b, the third insulating layer 22c, and the fourth insulating layer 22d are each a flexible insulating layer. The thickness of each of these layers in the z-direction is, for example, 10 µm to 100 µm. Moreover, the thickness of the overall flat cable-like antenna 20 in the z-direction is, for example, 50 µm to 500 µm. The width (the y-direction) of the first conductor layer 23 connected to the signal line path is about 100 µm, and the widths of the second conductor layer 24 and the third conductor layer 25 connected to the ground line path are each about 1 mm (1,000 µm).

Figure 6:
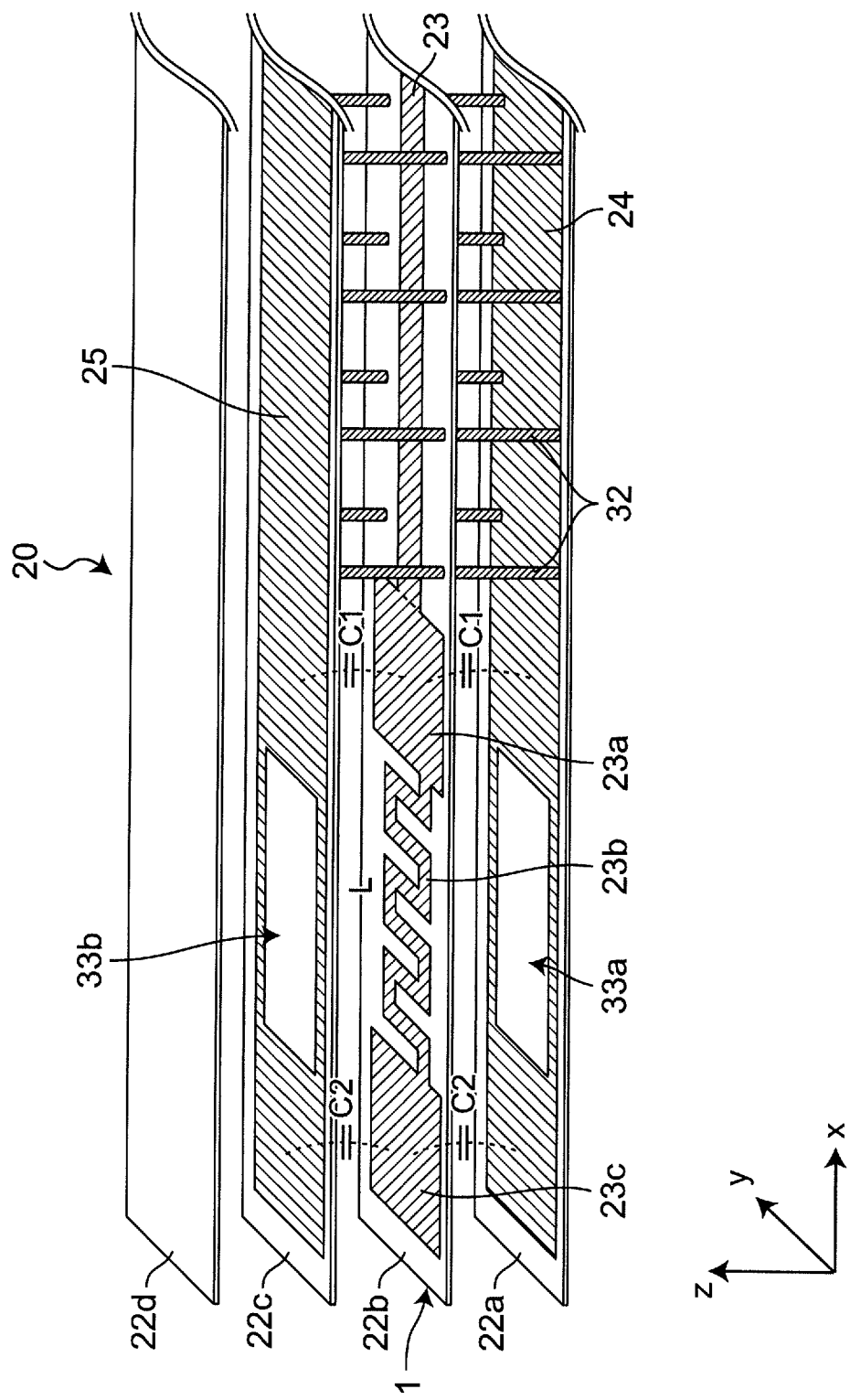
FIG. 6 is an enlarged perspective diagram of a matching circuit part of the flat antenna in FIG. 5.
Figure 7:
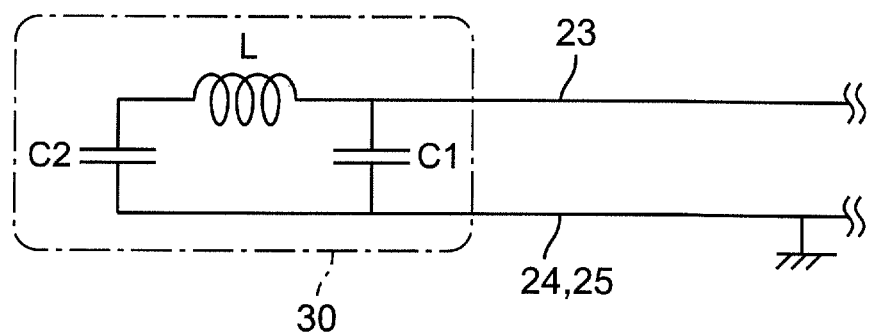
FIG. 7 is a diagram of an equivalent circuit of the matching circuit part in FIG. 6.

FIG. 6 is an enlarged schematic perspective diagram of the configuration of the matching circuit part 30 of the flat cable-like antenna 20 in FIG. 5. FIG. 7 is a diagram of an equivalent circuit of the matching circuit part 30 in FIG. 6.

As described above, the matching circuit part 30 is disposed on the side of the first end 1 to be the tip side of the insulator 21, and matches the impedance of the first conductor layer 23 with the impedance of each of the second conductor layer 24 and the third conductor layer 25. As depicted in FIG. 6, the second conductor layer 24 and the third conductor layer 25 are electrically connected to each other by an interlayer connection conductor 32. In FIG. 2, FIG. 5, and the like, the interlayer connection conductor 32 is not depicted.

The interlayer connection conductor 32 penetrates the second insulating layer 22b and the third insulating layer 22c, and electrically connects the second conductor layer 24 and the third conductor layer 25 to each other. Plural pieces of interlayer connection conductor 32 are disposed. The second conductor layer 24 and the third conductor layer 25 are disposed distant from each other by a predetermined distance through the insulating layers (22b and 22c) in the thickness direction (the z-direction) while the second conductor layer 24 and the third conductor layer 25 are at the equal potential due to the connection by the interlayer connection conductor 32. In FIG. 6, to depict the fact that the interlayer connection conductor 32 penetrates the second insulating layer 22b and the third insulating layer 22c, the interlayer connection conductor 32 is depicted being emphasized by a columnar shape between the layers. As above, the second conductor layer 24 and the third conductor layer 25 are connected to the ground line path that is connected to the ground (GND) through the coaxial cable 34 having the cable-side connector part 31b disposed therein that is connected to the antenna-side connector part 31a, and substantially act as ground line paths.

As above, the matching circuit part 30 of the first embodiment is formed by the conductor patterns formed by partially changing the shapes of the conductor layers on the side of the first end 1 of each of the first conductor layer 23, the second conductor layer 24, and the third conductor layer 25.

As depicted in FIG. 6, on the tip side of the first end 1 of the first conductor layer 23, a first broad width portion 23a, a meander portion 23b, and a second broad width portion 23c are formed. The winding meander portion 23b comprises an inductor and the first broad width portion 23a and the second broad width portion 23c formed being connected to both ends of the meander portion 23b, together with an area faced by the second conductor layer 24 and the third conductor layer 25, constitute a capacitor. The conductor patterns formed by the first broad width portion 23a, the meander portion 23b, and the second broad width portion 23c form a portion of the matching circuit part 30. In the width direction (the y-direction), the first broad width portion 23a and the second broad width portion 23c each have a width that is larger than the width of the first conductor layer 23 that acts as the antenna-side internal conductor. In an exemplary aspect, it is preferred that, in the width direction (the y-direction), the first broad width portion 23a and the second broad width portion 23c each have a width that is substantially equal to the width of each of the second conductor layer 24 and the third conductor layer 25 that each act as the antenna-side external conductor.

On the tip side of the first end 1 of the second conductor layer 24 acting as the antenna-side external conductor, an opening 33a is formed in an area that faces the meander portion 23b in the thickness direction (the z-direction). On the tip side of the first end 1 of the third conductor layer 25 acting as the antenna-side second external conductor, an opening 33b is formed in an area that faces the meander portion 23b in the thickness direction (the z-direction). The openings 33a and 33b formed in the second conductor layer 24 and the third conductor layer 25 as above form a portion of the matching circuit part 30.

With the configuration of the matching circuit part 30 configured as above, a capacitance C1 is formed between the first broad width portion 23a formed by the conductor pattern of the first conductor layer 23 and the second conductor layer 24 facing the first broad width portion 23a through the second insulating layer 22b. Similarly, the capacitance C1 is formed between the first broad width portion 23a and the third conductor layer 25 through the third insulator layer 22c.

A capacitance C2 is formed between the second broad width portion 23c formed by the conductor pattern of the first conductor layer 23 and the second conductor layer 24 facing the second broad width portion 23c through the second insulating layer 22b. Similarly, the capacitance C2 is formed between the second broad width portion 23c and the third conductor layer 25 through the third insulating layer 22c. An inductance L is formed by the meander portion 23b that is formed to wind by the conductor pattern of the first conductor layer 23.

FIG. 7 depicts the equivalent circuit diagram of the matching circuit part 30 in the first embodiment configured as above. As depicted in FIG. 7, the capacitances C1 and C2, and the inductance L constitutes the matching circuit part 30 in the first embodiment. The impedance of the first conductor layer 23 can be matched with the impedance of the second conductor layer 24 and that of the third conductor layer 25 with each other by the matching circuit part 30 configured as above.

In the matching circuit part 30, the high frequency signal is supplied from the first conductor layer 23 to the second conductor layer 24 and the third conductor layer 25, the side of the first end 1 acts as the supply end, and the high frequency signal flows through the second conductor layer 24 and the third conductor layer 25. The intensity of the electric wave radiated from the side of the first end 1 of the flat cable-like antenna 20 is higher than that of the electric wave radiated from the side of the second end 2 that has the magnetic member 26 disposed thereon. FIG. 6 depicts an example of the matching circuit part 30 and the present invention is not limited to this configuration.

The flat cable-like antenna 20 of the first embodiment is an electric-field antenna that uses a standing wave generated in the second conductor layer 24 and the third conductor layer 25, and is not a what-is-called loop antenna that uses an induction field. The flat cable-like antenna 20 is a standing-wave antenna while the length of the radiation part 27 does not necessarily need to be an integral multiple of a half of the wavelength. The communication area is about 1 m in the vicinity of the flat cable-like antenna 20. Because the first conductor layer (the antenna-side signal line path conductor) 23 is sandwiched by the second conductor layer 24 and the third conductor layer 25, the communication property such as the frequency property is not significantly varied even when a metal is present in the vicinity of the flat cable-like antenna 20. According to the flat cable-like antenna 20 in the antenna device 70 of the first embodiment, any self-interference is suppressed between bent portions even when the antenna device 70 is bent to be used.

The flat cable-like antenna 20 of the first embodiment does not need to be terminated using a resistive element at the tip thereof as a leaky coaxial cable does, and therefore has the configuration with a low loss.

When the flat cable-like antenna 20 is disposed on a metal body or the like, it is preferred that the matching circuit part 30 at the tip thereof be not in direct contact with the metal body. Even when the flat cable-like antenna 20 of the first embodiment is arranged on a metal body or the like, the matching circuit part 30 is not brought into direct contact with the metal body or the like because the first insulating layer 22a and the fourth insulating layer 22d are disposed on the upper face and the lower face of the matching circuit part 30.

For example, a ferrite sheet may be disposed in advance on the lower face of the matching circuit part 30. Generation of any floating capacity between the conductor layers 23, 24, and 25 of the flat cable-like antenna 20 and the metal can be suppressed by disposing the ferrite sheet as above. When the flat cable-like antenna 20 is arranged on a metal body, configuring as above avoids any necessity for the matching circuit part 30 at the tip to be arranged away from the metal body.

<Rack for Displaying Merchandise>

Figure 8:
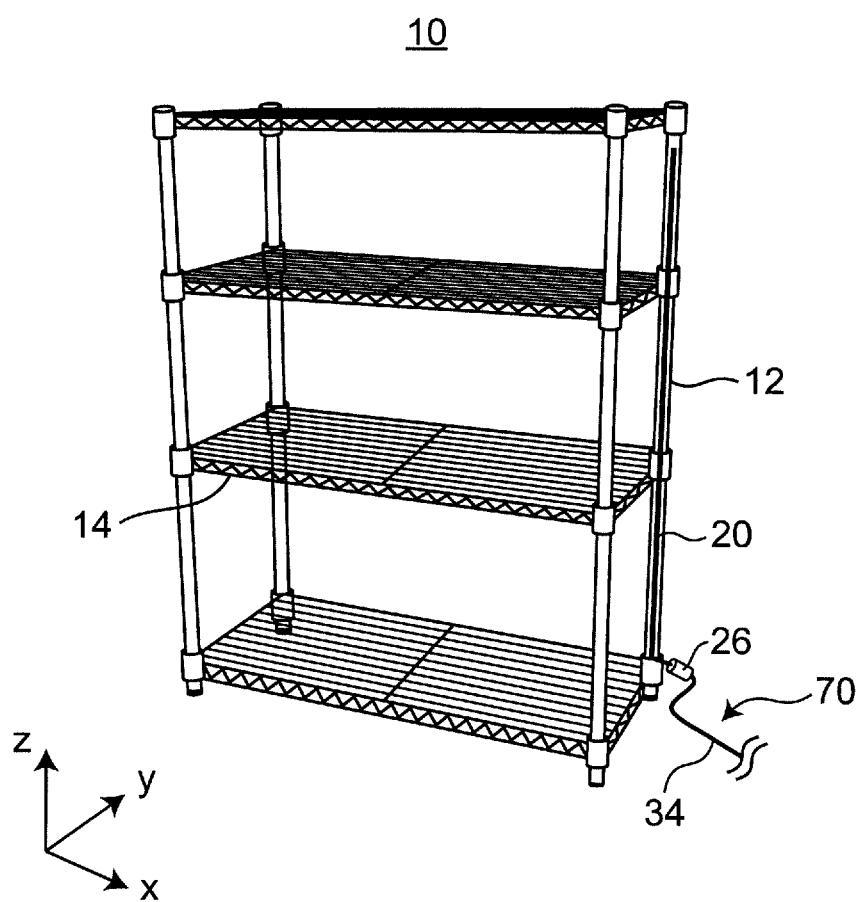
FIG. 8 is a perspective diagram of a rack for displaying merchandise, that has the antenna device in FIG. 1 disposed therein.

FIG. 8 is a perspective diagram of a rack 10 for displaying merchandise that has the antenna device 70 disposed therein that includes the flat cable-like antenna 20 to which the coaxial cable 34 depicted in FIG. 1 is connected.

Figure 9A:
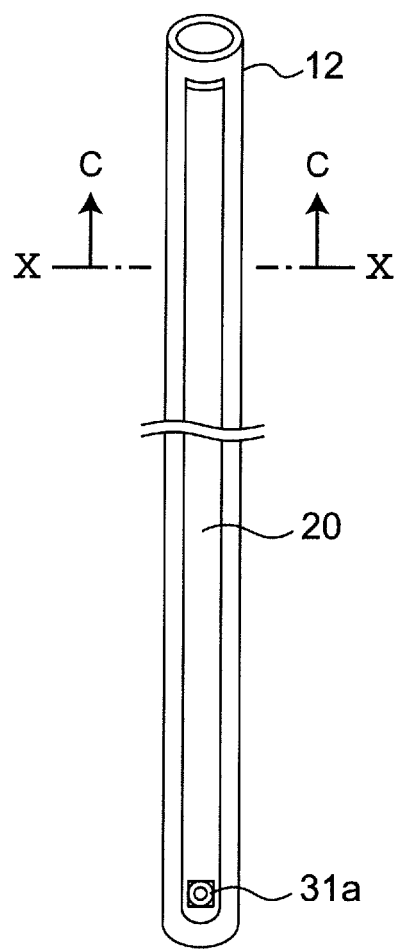
FIGS. 9A-9C are schematic diagrams of components of the antenna device disposed on the rack for displaying merchandise in FIG. 8.
Figure 9B:
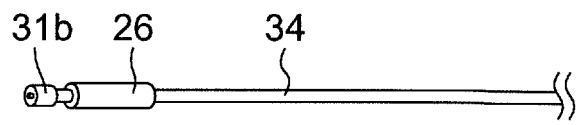
Figure 9C:
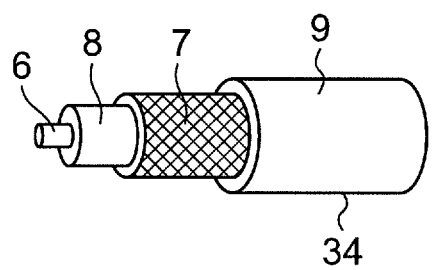

FIG. 9A illustrates is a schematic diagram of the flat cable-like antenna 20 that is connected to the coaxial cable 34 disposed on the rack 10 for displaying merchandise of FIG. 8. FIG. 9B depicts the coaxial cable 34 that is connected to the flat cable-like antenna 20, and the cable-side connector part 31b is disposed on the end portion thereof. The magnetic member 26 is attached in the vicinity of the cable-side connector part 31b. FIG. 9C is a schematic diagram of the internal configuration of the coaxial cable 34. As depicted in FIG. 9C, the coaxial cable 34 used in the first embodiment is a cable whose cross-section has a circular shape, has a cable-side internal conductor 6 arranged therein as the core wire thereof at the center extending in the longitudinal direction, and a cable-side insulator 8 is disposed around the cable-side internal conductor 6 to insulate the cable-side internal conductor 6. For example, a metal foil tape is wound around the cable-side insulator 8 and the outer circumference thereof is covered by a cable-side external conductor 7 of a braided wire that is a net-like conductor. A protective film 9 to protect the coaxial cable 34 is formed on the outer side of the cable-side external conductor 7.

In the coaxial cable 34 configured as above, the cable-side internal conductor 6 acts as the cable-side signal line path conductor and the cable-side external conductor 7 acts as the cable-side ground conductor. The cable-side connector part 31b of the coaxial cable 34 is connected to the antenna-side connector part 31a, the cable-side signal line path conductor is thereby connected to the antenna-side signal line path conductor, and the cable-side ground conductor is connected to the first ground line path (the second conductor layer 24) and the second ground line path (the third conductor layer 25) on the antenna-side. The cable-side connector part 31b includes a cable-side signal terminal connected to the cable-side internal conductor 6 and a cable-side ground terminal connected to the cable-side external conductor 7. The cable-side connector part 31b is connected to the antenna-side connector part 31a, the cable-side signal terminal is thereby connected to the antenna-side signal terminal connected to the first conductor layer 23, and the cable-side ground terminal is connected to the antenna-side ground terminal connected to the second conductor layer 24 and the third conductor layer 25.

The rack 10 for displaying merchandise depicted in FIG. 8 includes four metal support posts 12 and shelf boards 14 for three tiers and, as depicted in FIG. 9, the flat cable-like antenna 20 having the coaxial cable 34 connected thereto is disposed on the support post 12. In the rack 10 for displaying merchandise configured as above, merchandise each having an RFID tag attached thereto are displayed on the shelf board 14 and the like, and the rack 10 for displaying merchandise has a configuration that enables merchandise management and the like using communication between the power feeding circuit described later and the RFID tag of each of the merchandise.

The rack 10 for displaying merchandise is not limited to the metal rack depicted in FIG. 8. The rack 10 for displaying merchandise may be a wooden or a resin rack, or the like. Types of the rack 10 for displaying merchandise include a shelf, a table, a frame, and the like to display merchandise thereon, and also include those each to be used for displaying merchandise such as a hanger rack, a display table, and a display shelf.

The RFID tag is configured to be attached to a merchandise by, for example, a strap or the like while the attachment form is not limited to this and the RFID tag may directly be attached to a merchandise. The RFID tag may include an RFIC element that is an integrated circuit element for the tag in the RFID system, and a dipole antenna that includes two antenna elements extending on both sides of the RFIC element each in a meander-like shape, as an example. The antenna element may be a loop antenna. The configuration of the antenna element of the RFID tag only has to be properly selected in accordance with the frequency band of the communication and the like. The RFIC element may be packaged together with the matching circuit part. The RFID tag is usually attached to the merchandise or is physically connected thereto by strapping or the like while the attachment form is not limited to the above. For example, the RFID tag and the merchandise may be physically separated from each other and may each individually be disposed. In this case, the RFID tag also only has to be related to the merchandise.

The merchandise to which the RFID tag is attached may be, for example, in addition to a garment, food, an eating utensil, a container, small merchandise, or the like. As to jewelry merchandise, foods, eating utensils, and the like each needing careful handling, their inventory management and the management concerning their security can be executed without directly touching each of the merchandise.

Figure 10:
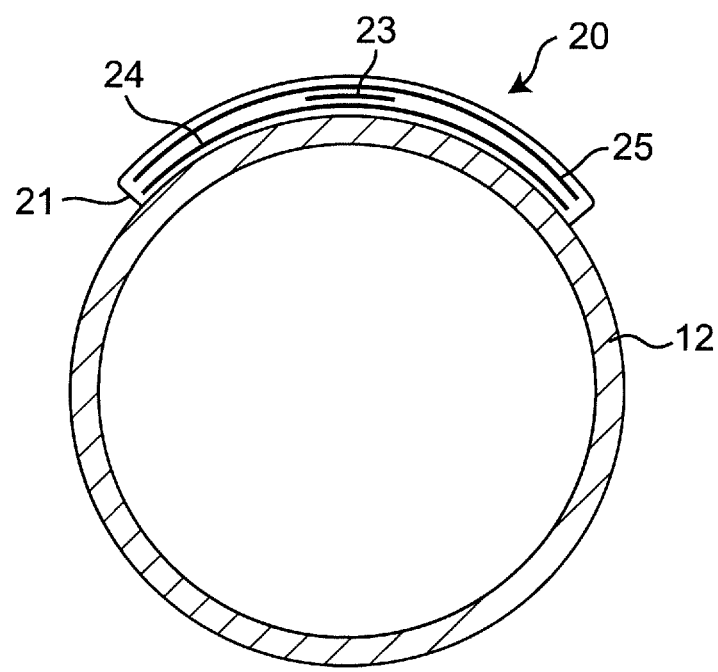
FIG. 10 is a cross-sectional diagram of the flat antenna depicted in FIG. 9A.

FIG. 10 is a cross-sectional diagram of the flat cable-like antenna 20 in FIG. 9, taken by cutting along a X-X line and seeing in a C-direction. As depicted in the cross-sectional diagram of FIG. 10, in the flat cable-like antenna 20 with the coaxial cable 34, the second conductor layer 24 (the first ground line path) and the third conductor layer 25 (the second ground line path) are disposed to sandwich therebetween the first conductor layer 23 (the antenna-side signal line path conductor). Even when the flat cable-like antenna 20 is disposed on the metal support post 12, any influence by the metal support post 12 on the first conductor layer 23 can be suppressed and any variation of the frequency property and the like is significantly suppressed because the antenna-side internal conductor (the first conductor layer 23) is disposed to substantially be covered by the antenna-side external conductor (the second conductor layer 24 and the third conductor layer 25) as above. When the support post is not made from a metal and is a wooden or a resin support post or the like, the flat cable-like antenna 20 can also be disposed inside the support post.

Even when the flat cable-like antenna 20 is disposed to be bonded to the outer face of the support post, the flat cable-like antenna 20 is inconspicuous and can be caused to function as an antenna without degrading its design because the flat cable-like antenna 20 is configured to be thin and flexible.

Second Exemplary Embodiment

Figure 11:
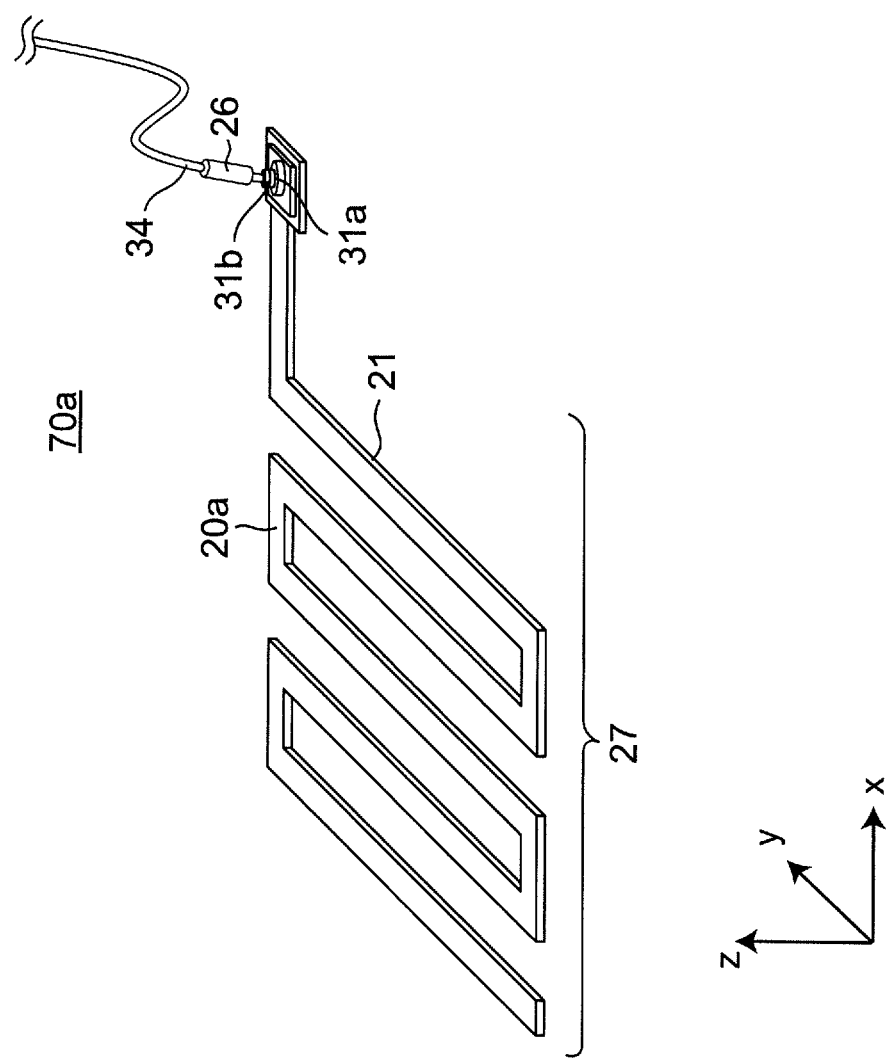
FIG. 11 is a perspective diagram of the configuration for a radiation part to be disposed to have a meander shape in an antenna device of a second exemplary embodiment.
Figure 12:
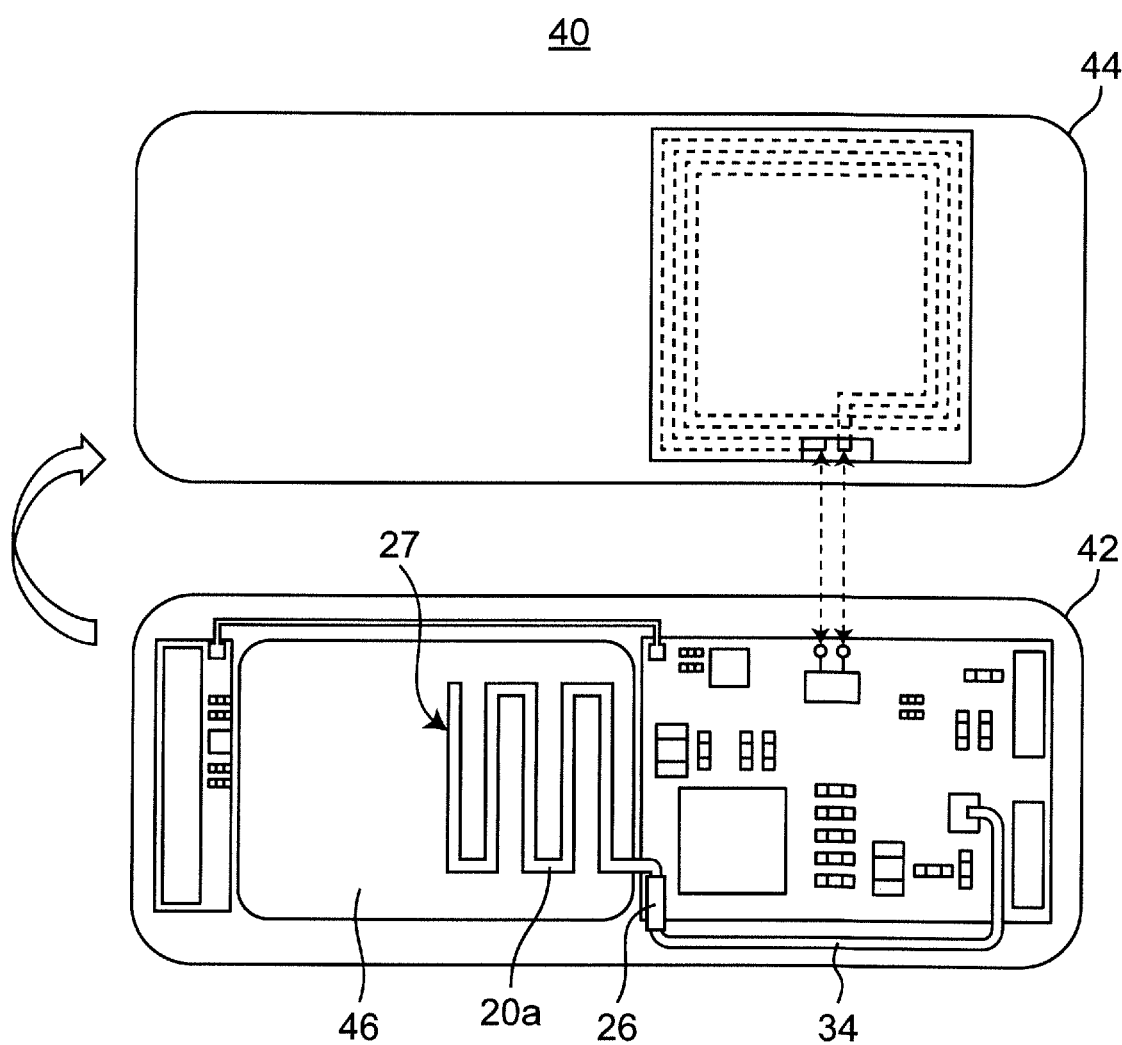
FIG. 12 is a schematic diagram of a smartphone that has the antenna device in FIG. 11 disposed thereon.

A flat cable-like antenna 20*a* as a flat antenna in the antenna device of the second embodiment will be described next with reference to FIG. 11 and FIG. 12 accompanying hereto. In FIG. 11 and FIG. 12, elements having functions and configurations substantially same as those of the above first embodiment are given the same reference numerals. Basic operations in the second embodiment are same as the basic operations in the first embodiment and the points that differ from the first embodiment will therefore be mainly described in the second embodiment.

FIG. 11 is a perspective diagram of an antenna device 70*a* that includes the flat cable-like antenna 20*a* of the second embodiment. As depicted in FIG. 11, the flat cable-like antenna 20*a* of the second embodiment has a configuration according to which the antenna-side internal conductor disposed on the insulator 21 that is the antenna-side insulator and the radiation part 27 including the antenna-side external conductors are each formed to have a meander shape. As depicted in FIG. 11, the magnetic member 26 as the radiation area setting part is disposed in the vicinity of the cable-side connector part 31*b* in the coaxial cable 34 that is the signal transmitting cable. The antenna device 70*a* therefore has a configuration for the overall flat cable-like antenna 20*a* to act as the radiation part 27.

Compared to the flat cable-like antenna 20 of the above first embodiment, the flat cable-like antenna 20*a* of the second embodiment differs therefrom in the point that the radiation part 27 is formed to have a meander shape while the other configurations are substantially same as those of the first embodiment. The radiation part 27 can be expanded in an xy-plane and a large communication area can be formed using the xy-plane as the radiation face, by forming the radiation part 27 to have a meander shape.

FIG. 12 is a schematic diagram of a smartphone 40 that has the flat cable-like antenna 20*a* depicted in FIG. 11 disposed thereon.

The smartphone 40 depicted in FIG. 12 includes an upper housing 42 that includes a battery pack 46, and a lower housing 44. The smartphone 40 is formed by fitting together the upper housing 42 and the lower housing 44 with each other. As depicted in FIG. 12, the flat cable-like antenna 20*a* of the second embodiment is disposed on the battery pack 46. The battery pack 46 is formed by a metal body while the flat cable-like antenna 20*a* of the second embodiment has a configuration with which the frequency property and the like are not significantly varied even when the flat cable-like antenna 20*a* is disposed on a metal body as above.

It is generally said that it is difficult to dispose another antenna disposed on an ordinary smartphone, on the battery pack 46 that is formed by a metal body. The configuration of the flat cable-like antenna 20*a* of the second embodiment is established as the configuration that enables the area on the battery pack 46 of the smartphone 40 to be used as an area to have the antenna disposed thereon.

In the above, the smartphone 40 has been taken as the example while, not limiting to the smartphone, the configuration of the flat cable-like antenna 20a of the second embodiment is applicable to any electronic instrument only when the electronic instrument includes a battery pack including a metal face.

Third Exemplary Embodiment

Figure 13:
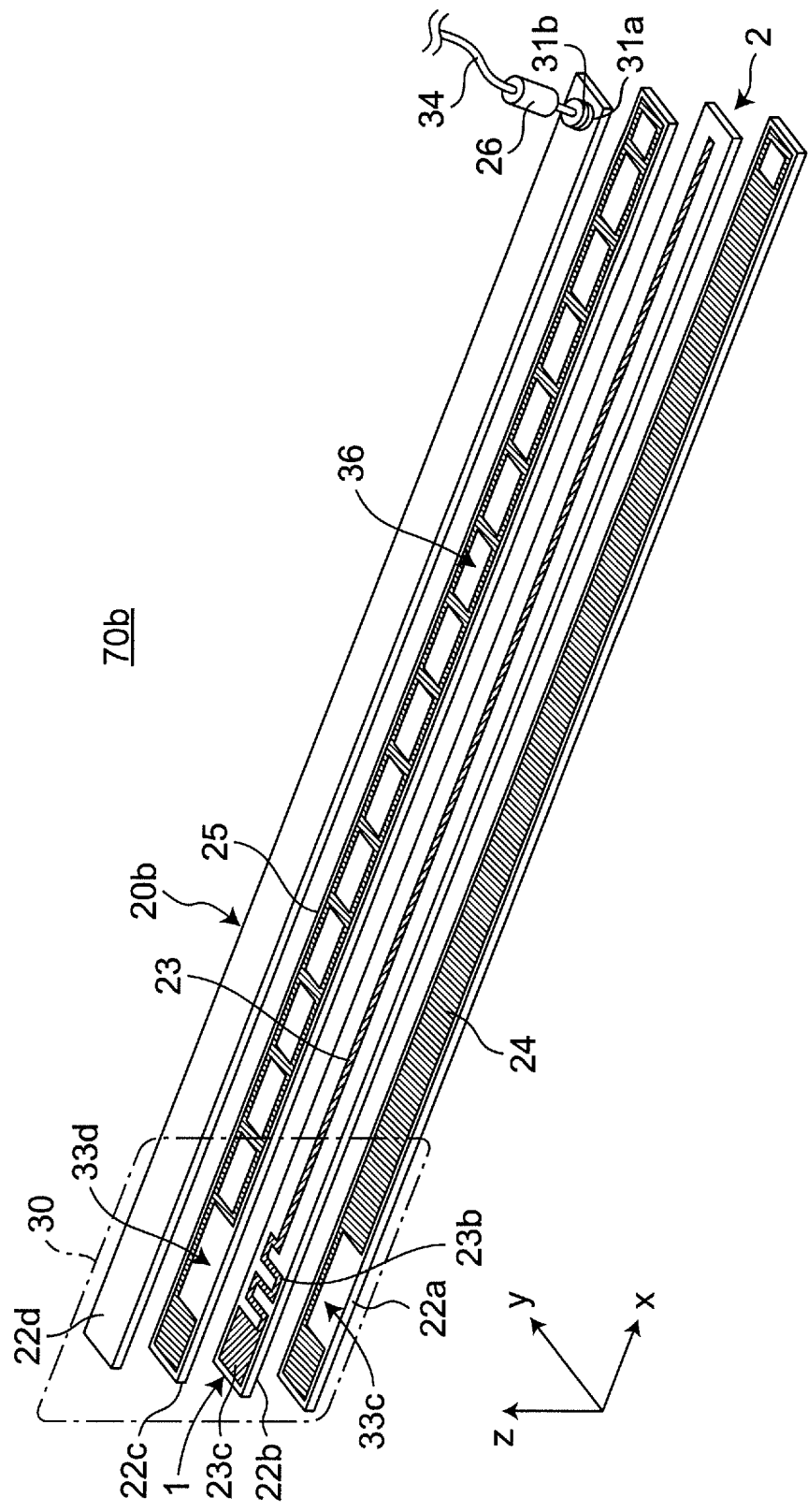
FIG. 13 is a schematic perspective diagram of the configuration of an antenna device of a third exemplary embodiment.

A flat cable-like antenna 20b as a flat antenna in an antenna device of the third embodiment will be described next with reference to FIG. 13 accompanying hereto. In FIG. 13, elements having functions and configurations substantially same as those of the above first embodiment are given the same reference numerals. Basic operations in the third embodiment are same as the basic operations in the first embodiment and the points that differ from the first embodiment will therefore be mainly described in the third embodiment.

FIG. 13 is a schematic perspective diagram of the configuration of an antenna device 70b including the flat cable-like antenna 20b of the third embodiment. As depicted in FIG. 13, the magnetic member 26 as the radiation area setting part is disposed in the vicinity of the cable-side connector part 31b of the coaxial cable 34 that is the signal transmission cable. The antenna device 70b therefore has a configuration for the overall flat cable-like antenna 20b to act as the radiation part 27.

Compared to the flat cable-like antenna 20 of the first embodiment, the flat cable-like antenna 20b of the third embodiment differs therefrom in the point that plural openings 36 are consecutively formed along the longitudinal direction (the x-direction) of the first conductor layer 23 (the antenna-side signal line path conductor) in the third conductor layer 25 that is the antenna-side second ground conductor, and the plural openings 36 are disposed to face the first conductor layer 23 in the thickness direction (the z-direction). Any floating capacity formed between the third conductor layer 25 and the first conductor layer 23 can be reduced by forming the plural openings 36 in the third conductor layer 25. As a result, with the configuration of the flat cable-like antenna 20b of the third embodiment, the third insulating layer 22c between the third conductor layer 25 and the first conductor layer 23 can be made thinner than that in the configuration of the first embodiment. The thickness of the overall flat cable-like antenna 20b can therefore be finally reduced in the z-direction. Because the thickness of the overall flat cable-like antenna 20b of the third embodiment can be reduced, the flexibility thereof as an antenna can be enhanced.

The configuration of the flat cable-like antenna 20b of the third embodiment differs from the flat cable-like antenna 20 in the point that not any opening whose overall opening circumference is surrounded by an edge but a cutout 33c formed by partially cutting off the edge of the opening is disposed in an area that faces in the thickness direction (the z-direction) the meander portion 23b of the first conductor layer 23, in the second conductor layer 24 (the antenna-side first ground conductor). Similarly, the configuration of the flat cable-like antenna 20b differs therefrom in the point that a cutout 33d formed by partially cutting off the edge of the opening is disposed in an area that faces in the thickness direction (the z-direction) the meander portion 23b of the first conductor layer 23, in the third conductor layer 25 (the antenna-side second ground conductor). The configuration of the flat cable-like antenna 20b of the third embodiment differs from the configuration of the first embodiment in the point that the first broad width portion 23a is not disposed on the first conductor layer 23 in the matching circuit part 30. The other configurations of the flat cable-like antenna 20b of the third embodiment are substantially same as those of the first embodiment.

Fourth Exemplary Embodiment

Figure 14:
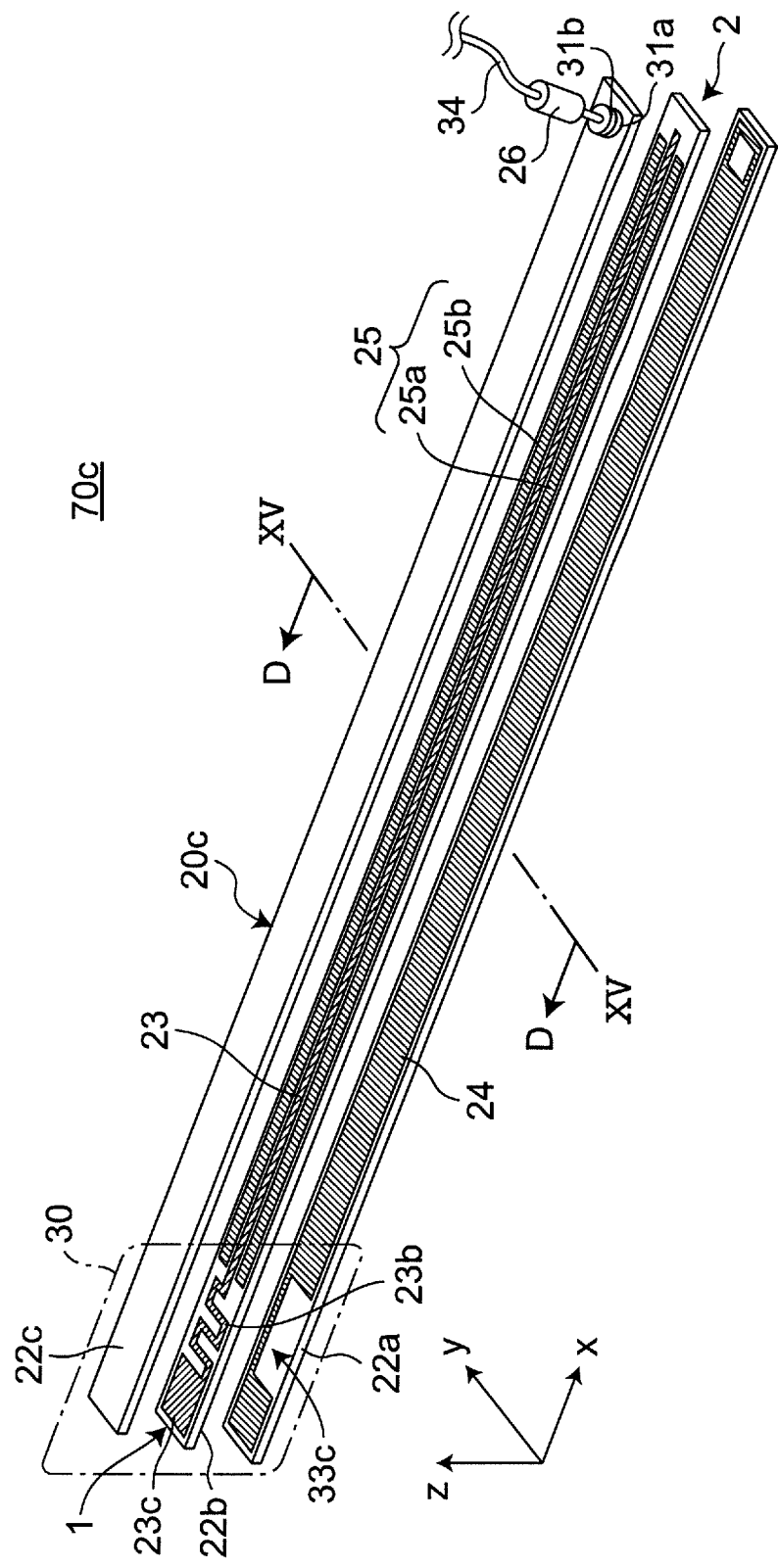
FIG. 14 is a schematic perspective diagram of the configuration of an antenna device of a fourth exemplary embodiment.
Figure 15:
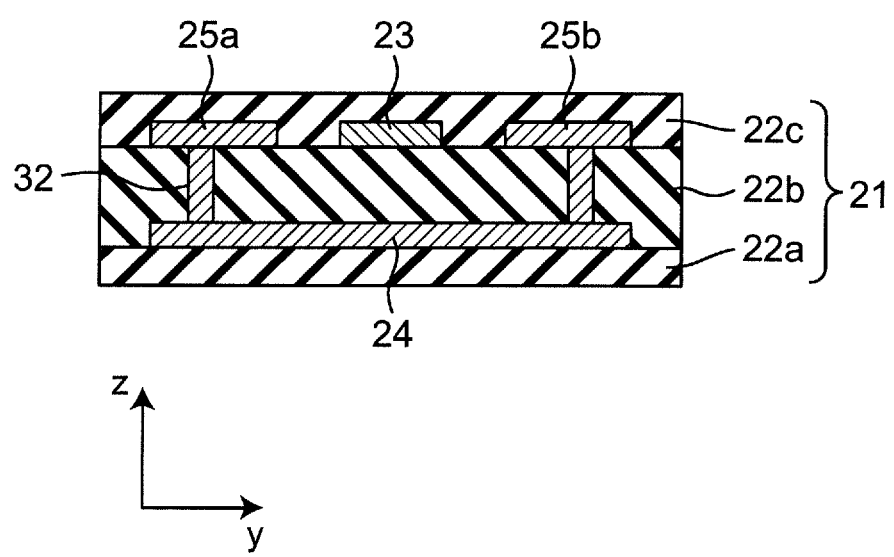
FIG. 15 is a cross-sectional diagram of the flat antenna in the antenna device in FIG. 14.

A flat cable-like antenna 20c as a flat antenna in an antenna device of the fourth embodiment will be described next with reference to FIG. 14 and FIG. 15 accompanying hereto. In FIG. 14 and FIG. 15, elements having functions and configurations substantially same as those of the above first embodiment are given the same reference numerals. Basic operations in the fourth embodiment are same as the basic operations in the first embodiment and the points that differ from the first embodiment will therefore be mainly described in the fourth embodiment.

FIG. 14 is a schematic perspective diagram of the configuration of an antenna device 70c including a flat cable-like antenna 20c of the fourth embodiment. FIG. 15 is a cross-sectional diagram taken by cutting the flat cable-like antenna 20c depicted in FIG. 14 along a XV-XV line and seeing in a D direction. As depicted in FIG. 14, the magnetic member 26 as the radiation area setting part is disposed in the vicinity of the cable-side connector part 31b of the coaxial cable 34 that is the signal transmission cable. The antenna device 70c therefore has a configuration for the overall flat cable-like antenna 20c to act as the radiation part 27.

Compared to the flat cable-like antenna 20 of the first embodiment, the flat cable-like antenna 20c of the fourth embodiment differs therefrom in the point that the third conductor layers 25 (25a and 25b) that are the antenna-side second ground conductors are formed to sandwich therebetween the first conductor layer 23 not on the third insulating layer 22c but on the second insulating layer 22b that has the first conductor layer 23 to be the antenna-side signal line path conductor disposed therein. On the second insulating layer 22b, the third conductor layers 25 (25a and 25b) extend in the x-direction to sandwich therebetween the first conductor layer 23 and are disposed in parallel to each other.

In the flat cable-like antenna 20c of the fourth embodiment, the first conductor layer 23 and the third conductor layer 25 constitute a coplanar line path. On the other hand, the first conductor layer 23 to be the antenna-side signal line path conductor and the second conductor layer 24 to be the antenna-side first ground conductor constitute a micro-strip line path. The flat cable-like antenna 20c of the fourth embodiment is a combined type including the coplanar line path and the micro-strip line path.

Because the flat cable-like antenna 20c of the fourth embodiment is configured as above, as depicted in the cross-sectional diagram of FIG. 15, the insulating layers can be reduced by one layer. The flat cable-like antenna 20c can therefore be formed for the thickness thereof in the z-direction to be thinner compared to that of the configuration of the first embodiment.

The configuration of the flat cable-like antenna 20c of the fourth embodiment differs from the configuration of the first embodiment in the point that the first broad width portion 23a is not disposed in the first conductor layer 23 in the matching circuit part 30. The configuration of the flat cable-like antenna 20c of the fourth embodiment differs from the configuration of the first embodiment in the point that not any opening whose overall opening circumference is surrounded by an edge but a cutout 33c formed by partially cutting off the edge of the opening is disposed in an area that faces in the thickness direction (the z-direction) the meander portion 23b of the first conductor layer 23, in the second conductor layer 24.

In the flat cable-like antenna 20c of the fourth embodiment, similar to each of the configurations of the first embodiment to the third embodiment, the second conductor layer 24 and the third conductor layer 25 are also electrically connected to each other by the interlayer connection conductor 32 that penetrates the second insulating layer 22b and are at the substantially equal potential. In the flat cable-like antenna 20c depicted in FIG. 14, the interlayer connection conductor 32 is not depicted. The other configurations of the flat cable-like antenna 20c of the fourth embodiment are substantially same as those of the first embodiment.

Fifth Exemplary Embodiment

Figure 16:
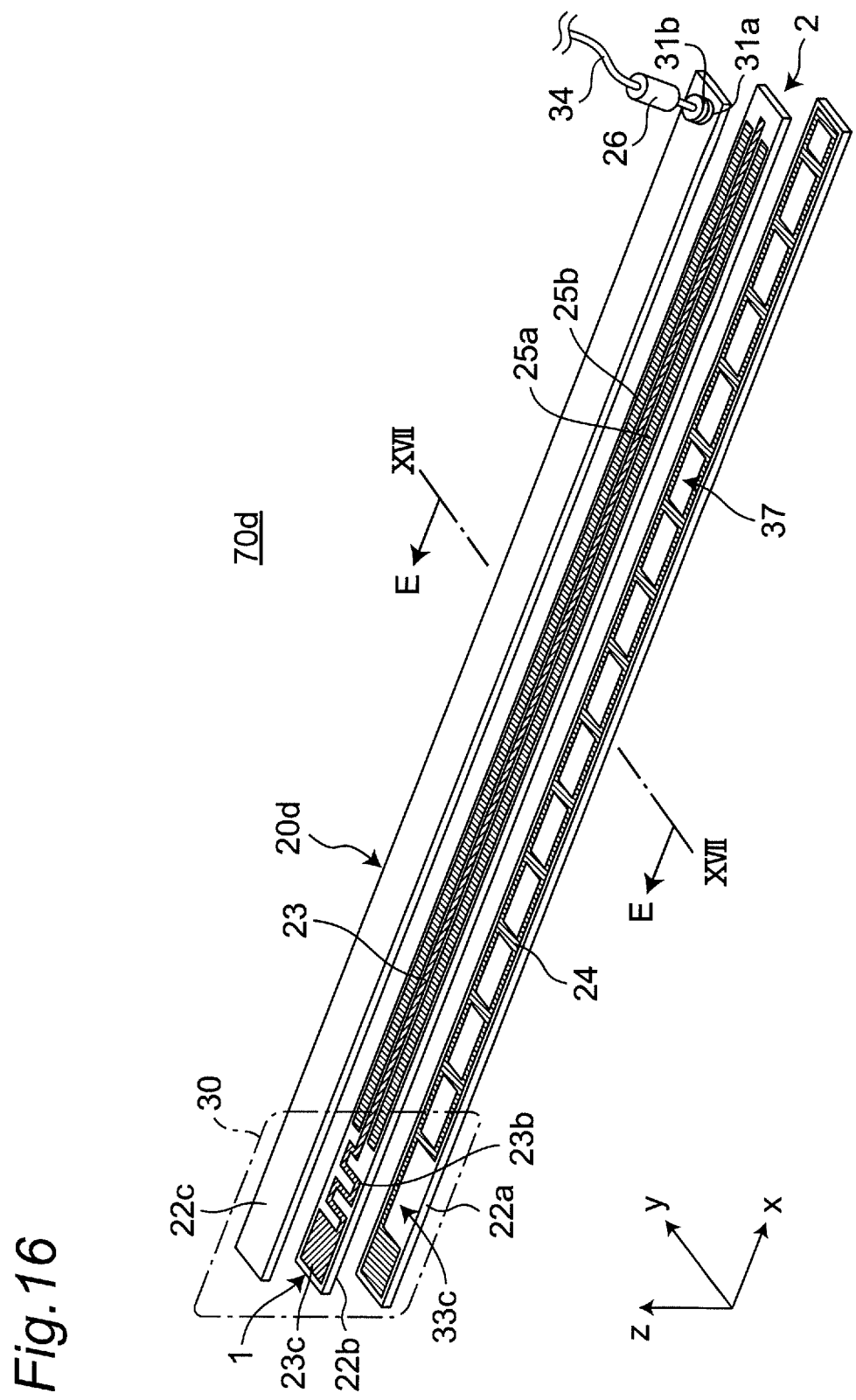
FIG. 16 is a schematic perspective diagram of the configuration of an antenna device of a fifth exemplary embodiment.
Figure 17:
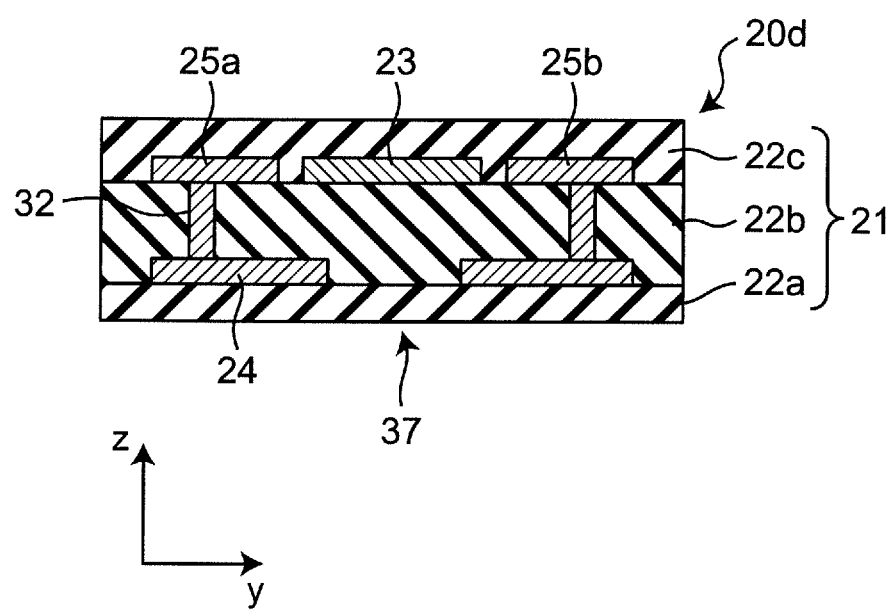
FIG. 17 is a cross-sectional diagram of the flat antenna in the antenna device in FIG. 16.

A flat cable-like antenna 20d as a flat antenna in an antenna device of the fifth embodiment will be described next with reference to FIG. 16 and FIG. 17 accompanying hereto. In FIG. 16 and FIG. 17, elements having functions and configurations substantially same as those of the above first embodiment and the above fourth embodiment are given the same reference numerals. Basic operations in the fifth embodiment are same as the basic operations in the first embodiment and the fourth embodiment, and the points that differ from the first embodiment and the fourth embodiment will therefore be mainly described in the fifth embodiment.

FIG. 16 is a schematic perspective diagram of the configuration of an antenna device 70d that includes the flat cable-like antenna 20d of the fifth embodiment. FIG. 17 is a cross-sectional diagram taken by cutting the flat cable-like antenna 20d depicted in FIG. 16 along a XVII-XVII line and seeing in an E direction. As depicted in FIG. 16, the magnetic member 26 as the radiation area setting part is disposed in the vicinity of the cable-side connector part 31b of the coaxial cable 34 that is the signal transmission cable. The antenna device 70d therefore has a configuration for the overall flat cable-like antenna 20d to act as the radiation part 27.

Compared to the flat cable-like antenna 20c of the above fourth embodiment, the flat cable-like antenna 20d of the fifth embodiment differs therefrom in the point that plural openings 37 are consecutively formed along the longitudinal direction (the x-direction) of the first conductor layer 23 (the antenna-side signal line path conductor) in the second conductor layer 24 (the antenna-side first ground conductor) and the plural openings 37 are disposed to face the first conductor layer 23 in the thickness direction (the z-direction). Any floating capacity formed between the second conductor layer 24 and the first conductor layer 23 can be reduced by forming the plural openings 37 in the second conductor layer 24 as above. As a result, with the configuration of the flat cable-like antenna 20d of the fifth embodiment, the second insulating layer 22b between the second conductor layer 24 and the first conductor layer 23 can be made thinner compared to that in the configuration of the fourth embodiment. The overall flat cable-like antenna 20d can therefore be finally formed for the thickness thereof in the z-direction to be reduced. Because the thickness of the overall flat cable-like antenna 20d of the fifth embodiment can be reduced, the flexibility thereof as an antenna can be enhanced.

In the configuration of the fifth embodiment, the width of the first conductor layer 23 can be increased compared to that of the configuration having no opening formed therein. For example, as above, when no opening is formed, taking into consideration the floating capacity between the plane-like second conductor layer 24 and the plane-like first conductor layer 23, the width of the first conductor layer 23 is about 100 μm at a maximum. On the other hand, in the configuration of the fifth embodiment, because the plural openings 37 are formed in the second conductor layer 24, the width as the width of the first conductor layer 23 may be increased to about 200 μm and further up to about 300 μm, for example. The width of the first conductor layer 23 can be increased as above and the resistance of the first conductor layer 23 can significantly be reduced. As a result, in the flat cable-like antenna 20d of the fifth embodiment, any degradation of the communication property can be suppressed even when the first conductor layer 23 is extended to be long. The other configurations of the flat cable-like antenna 20d of the fifth embodiment are substantially same as those of the fourth embodiment.

Sixth Exemplary Embodiment

Figure 18:
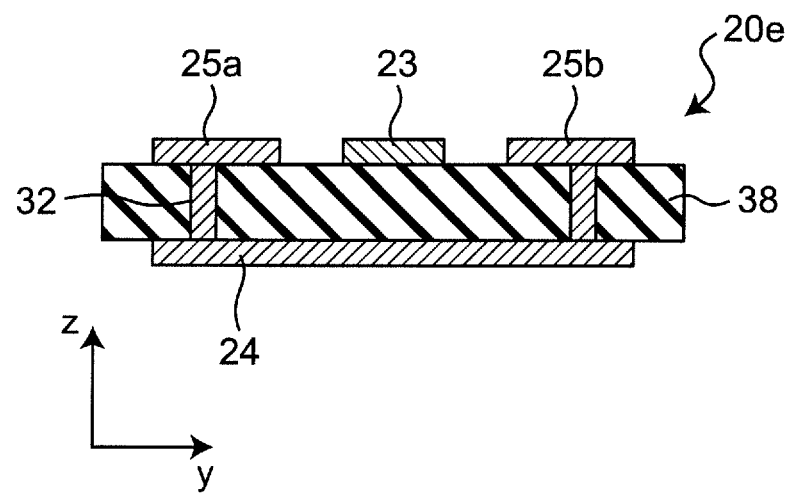
FIG. 18 is a cross-sectional diagram of a flat antenna in the antenna device of a sixth exemplary embodiment.

A flat cable-like antenna 20e as a flat antenna in an antenna device of the sixth embodiment will be described next with reference to FIG. 18 accompanying hereto. In FIG. 18, elements having functions and configurations substantially same as those of the above first embodiment and the above fourth embodiment are given the same reference numerals. Basic operations in the sixth embodiment are same as the basic operations in the first embodiment and the fourth embodiment, and the points that differ from the first embodiment and the fourth embodiment will therefore be mainly described in the sixth embodiment.

FIG. 18 is a cross-sectional diagram of a flat cable-like antenna 20e disposed in the antenna device of a sixth embodiment. Compared to the flat cable-like antenna 20c of the fourth embodiment, the flat cable-like antenna 20e of the sixth embodiment differs therefrom in the point that one insulating layer such as, for example, a PET film 38 is used as the antenna-side insulator instead of the stacked insulator 21. In the flat cable-like antenna 20e of the sixth embodiment, the PET film 38 to be the one insulating layer is used as the antenna-side insulator without using the first insulating layer, the second insulating layer, and the third insulating layer as the antenna-side insulator. The flat cable-like antenna 20e in the antenna device of the sixth embodiment is configured by disposing the first conductor layer 23 and the third conductor layers 25a and 25b to sandwich therebetween the first conductor layer 23 on the front face (the upper face in FIG. 18) of the PET film 38, and the second conductor layer 24 on the back face (the lower face in FIG. 18) of the PET film 38.

As above, in the flat cable-like antenna 20e of the sixth embodiment, the one PET film 38 is used as the antenna-side insulator without using the plural insulating layers. Compared to the configuration of the fourth embodiment, the flat cable-like antenna 20e of the sixth embodiment can be configured to be thinner and the flexibility thereof can further be enhanced. The other configurations of the flat cable-like antenna 20e of the sixth embodiment are substantially same as those of the fourth embodiment.

The example where the PET film 38 is used as the one insulating layer has been described for the configuration of the sixth embodiment while the present invention is not limited to this configuration, and an insulating layer formed using any other dielectric material other than the PET film may be employed as the one insulating layer.

Seventh Exemplary Embodiment

Figure 19:
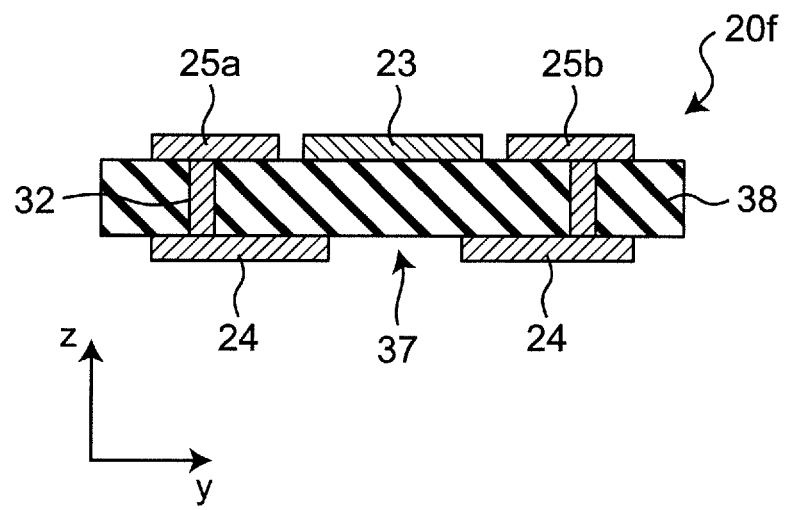
FIG. 19 is a cross-sectional diagram of a flat antenna in an antenna device of a seventh exemplary embodiment.

A flat cable-like antenna 20f in an antenna device of the seventh embodiment will be described next with reference to FIG. 19 accompanying hereto. In FIG. 19, elements having functions and configurations substantially same as those of the above first embodiment and the above sixth embodiment are given the same reference numerals. Basic operations in the seventh embodiment are same as the basic operations in the first embodiment and the sixth embodiment, and the points that differ from the first embodiment and the sixth embodiment will therefore be mainly described in the seventh embodiment.

FIG. 19 is a cross-sectional diagram of the flat cable-like antenna 20f disposed in the antenna device of the seventh embodiment. Compared to the flat cable-like antenna 20e of the sixth embodiment, the flat cable-like antenna 20f of the seventh embodiment differs therefrom in the point that the plural openings 37 are consecutively formed along the longitudinal direction (the x-direction) of the first conductor layer 23 that is the antenna-side signal line path conductor in the second conductor layer 24 to be the antenna-side first ground conductor and the plural openings 37 are disposed to face the first conductor layer 23 in the thickness direction (the z-direction) (see, for example, the openings 37 depicted in FIG. 16). Any floating capacity formed between the second conductor layer 24 and the first conductor layer 23 can be reduced by forming the plural openings 37 in the second conductor layer 24 as above. As a result, in the configuration of the flat cable-like antenna 20f of the seventh embodiment, the PET film 38 as the insulating layer between the second conductor layer 24 and the first conductor layer 23 can further be made thinner compared to that in the configuration of the sixth embodiment. The configuration is established according to which the first conductor layer 23 can be formed to have a larger width, and the resistance of the first conductor layer 23 can therefore be significantly reduced. The other configurations of the flat cable-like antenna 20f of the seventh embodiment are substantially same as those of the sixth embodiment.

The configuration of the seventh embodiment has been described taking the example where the PET film 38 is used as the one insulating layer, similar to the configuration of the sixth embodiment while the present invention is not limited to this configuration and an insulating layer formed using another dielectric material other than the PET film may be employed as the one insulating layer.

Eighth Exemplary Embodiment

A flat cable-like antenna 20g as a flat antenna in an antenna device of the eighth embodiment will be described next with reference to FIG. 20, FIG. 21, FIG. 22, and FIG. 23 accompanying hereto. In FIG. 20, FIG. 21, FIG. 22, and FIG. 23, elements having functions and configurations substantially same as those of the elements of the above embodiments are given the same reference numerals. Basic operations in the eighth embodiment are same as the basic operations in the first embodiments, and the points that differ from the above embodiments will therefore be mainly described in the eighth embodiment.

Figure 20:
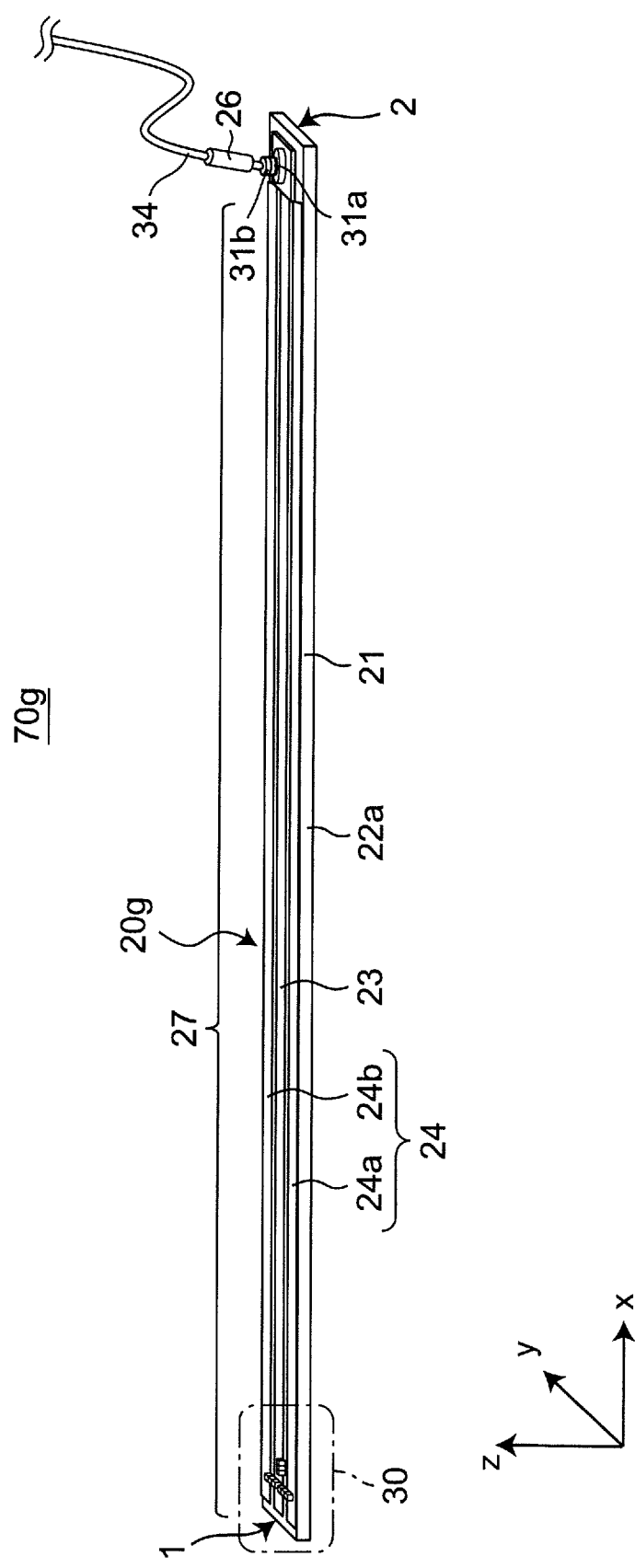
FIG. 20 is a schematic perspective diagram of the configuration of an antenna device of an eighth exemplary embodiment.
Figure 21:
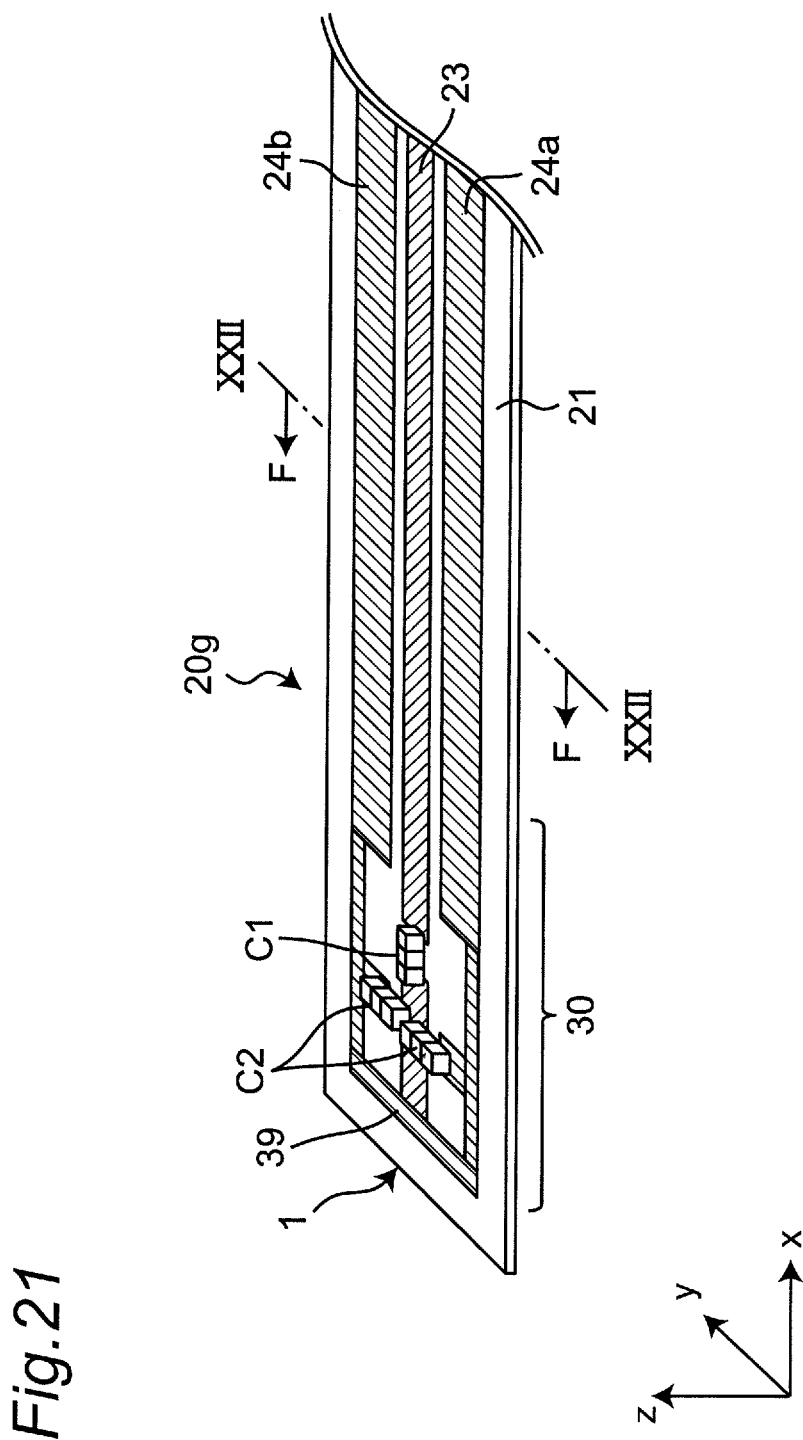
FIG. 21 is an enlarged perspective diagram of a tip portion of the flat antenna in the antenna device in FIG. 20.
Figure 22:
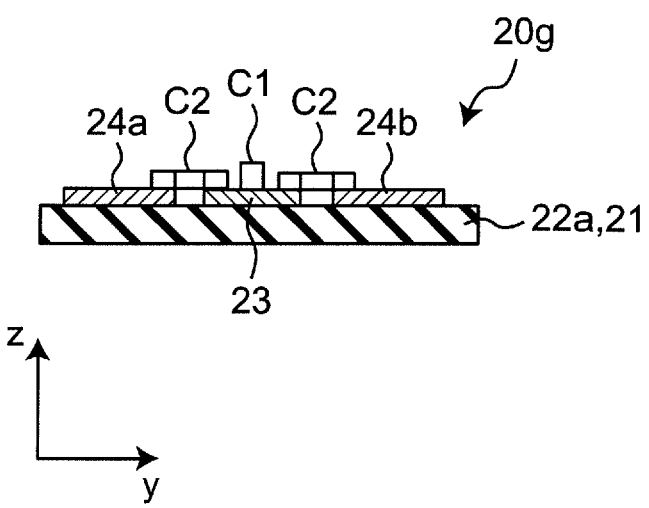
FIG. 22 is a cross-sectional diagram of the flat antenna in FIG. 21.
Figure 23:
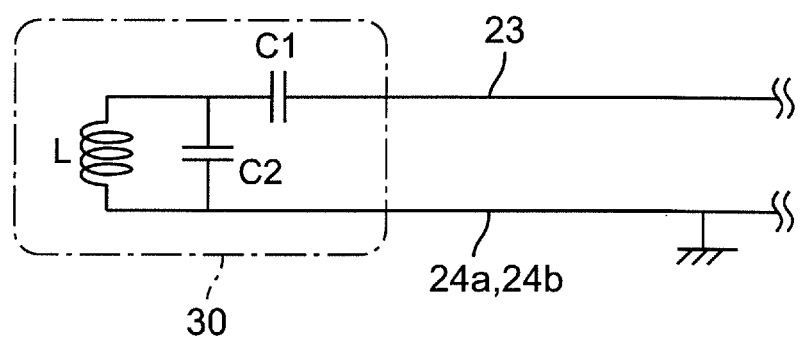
FIG. 23 is a diagram of an equivalent circuit of a matching circuit part in FIG. 21.

FIG. 20 is a schematic perspective diagram of the configuration of an antenna device 70g including a flat cable-like antenna 20g of the eighth embodiment. As depicted in FIG. 20, the magnetic member 26 as the radiation area setting part is disposed in the vicinity of the cable-side connector part 31b of the coaxial cable 34 that is the signal transmission cable. The antenna device 70g therefore has a configuration for the overall flat cable-like antenna 20g to act as the radiation part 27. FIG. 21 is an enlarged perspective diagram of the matching circuit part 30 and the like that are formed in the tip portion of the flat cable-like antenna 20g depicted in FIG. 20. FIG. 22 is a cross-sectional diagram taken by cutting the flat cable-like antenna 20g depicted in FIG. 21 along a XXII-XXII line and seeing in an F direction. FIG. 23 is a diagram of an equivalent circuit of the matching circuit part 30 depicted in FIG. 21.

Compared to the flat cable-like antenna 20c of the fourth embodiment, the flat cable-like antenna 20g of the eighth embodiment differs therefrom in the point that the insulator 21 to be the antenna-side insulator uses only one layer of only the first insulating layer 22a. The flat cable-like antenna 20g of the eighth embodiment also differs therefrom in the point that the configuration is established by the first conductor layer 23 (the antenna-side signal line path conductor) and the second conductor layer 24 (the antenna-side first ground conductor) without using the third conductor layer. The flat cable-like antenna 20g of the eighth embodiment differs therefrom in the point that, in the configuration of the flat cable-like antenna 20g, the two second conductor layers 24 (24a and 24b) are disposed extending along the longitudinal direction (the x-direction) of the first conductor layer 23 to be disposed in parallel to each other to have a predetermined distance therebetween in the width direction (the y-direction) to sandwich therebetween the first conductor layer 23. As depicted in the cross-sectional diagram of FIG. 22, a coplanar line path is formed by the first conductor layer 23 and the second conductor layers 24 (24a and 24b). The flat cable-like antenna 20g of the eighth embodiment configured as above can further reduce the thickness in the z-direction compared to that of the configuration of each of other embodiments.

The flat cable-like antenna 20g of the eighth embodiment differs from the configuration of each of the other embodiments in the point that the capacitance part of the matching circuit part 30 is formed by a surface mounted part (a chip capacitor). As above, for the flat cable-like antenna 20g of the eighth embodiment, the configuration is established according to which the surface mounted part is usable because the thickness thereof in the z-direction is reduced. The matching circuit part 30 having accurate capacitance can be designed by using the surface mounted part (a chip capacitor). The other configurations of the flat cable-like antenna 20g of the eighth embodiment are substantially same as the configurations of the above fourth embodiment.

The matching circuit part 30 in the flat cable-like antenna 20g of the eighth embodiment has been described taking the example where the inductance part is formed by a pattern conductor 39 while the inductance part may also be formed by a surface mounted part (a chip inductor) similar to the capacitance part. The matching circuit part 30 having more accurate inductance can be designed for the flat cable-like antenna 20g of the eighth embodiment by using the surface mounted part (a chip inductor) as the inductance part.

Ninth Exemplary Embodiment

A flat antenna 20h in an antenna device of the ninth embodiment will be described next with reference to FIG. 24 to FIG. 30 accompanying hereto. In FIG. 24 to FIG. 30, elements having functions and configurations substantially same as those of the elements of the flat cable-like antenna exemplifying the flat cable-like antenna described in each of the above first embodiment to the above eighth embodiment are given the same reference numerals. Basic operations in the ninth embodiment are same as the operations in the first embodiment, and the points that differ from the first embodiment will therefore be mainly described in the ninth embodiment.

Figure 24:
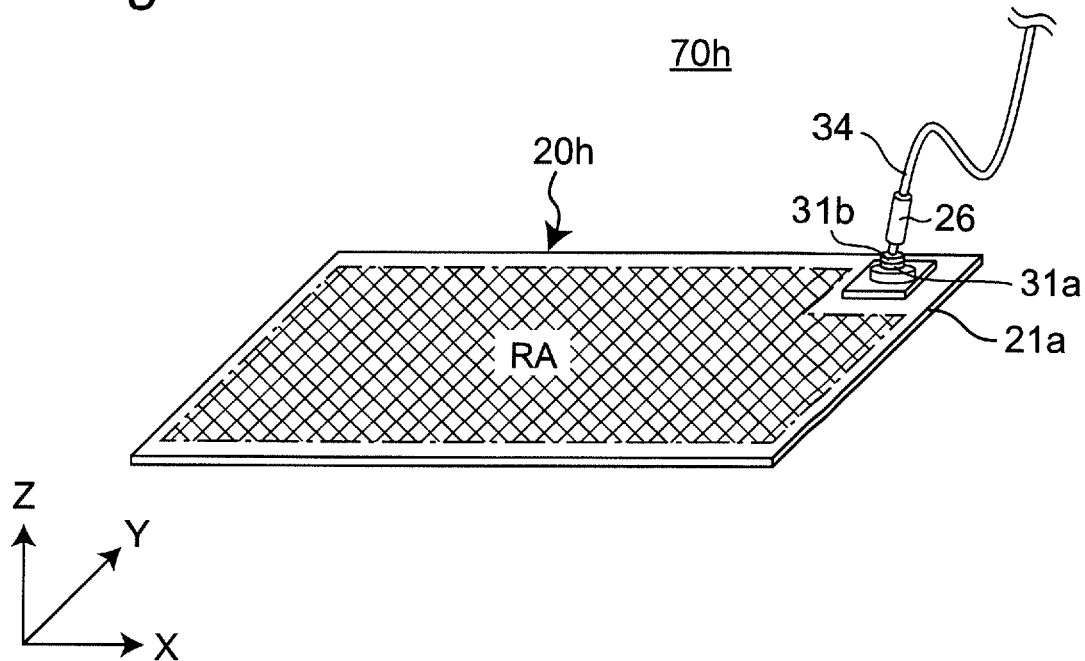
FIG. 24 is a perspective diagram of an antenna device of a ninth exemplary embodiment.

The flat antenna 20h in the antenna device of the ninth embodiment differs from the flat antenna described in the first embodiment to the eighth embodiment in the shape and the configuration of each of the radiation part 27 and an insulator 21a that is the antenna-side insulator having the radiation part 27 disposed therein (see FIG. 24). In the flat antenna 20h of the ninth embodiment, the insulator 21a has predetermined broadening in the width direction (the y-direction) and is configured to be a sheet having an xy-plane that is a wide, large, and substantially flat face. On the other hand, the flat antennas of the first embodiment to the eighth embodiment are each a flat cable-like antenna whose insulator 21 is formed to have the elongated band-like shape and, in this point, each differ from the flat antenna 20h of the ninth embodiment.

Figure 25:
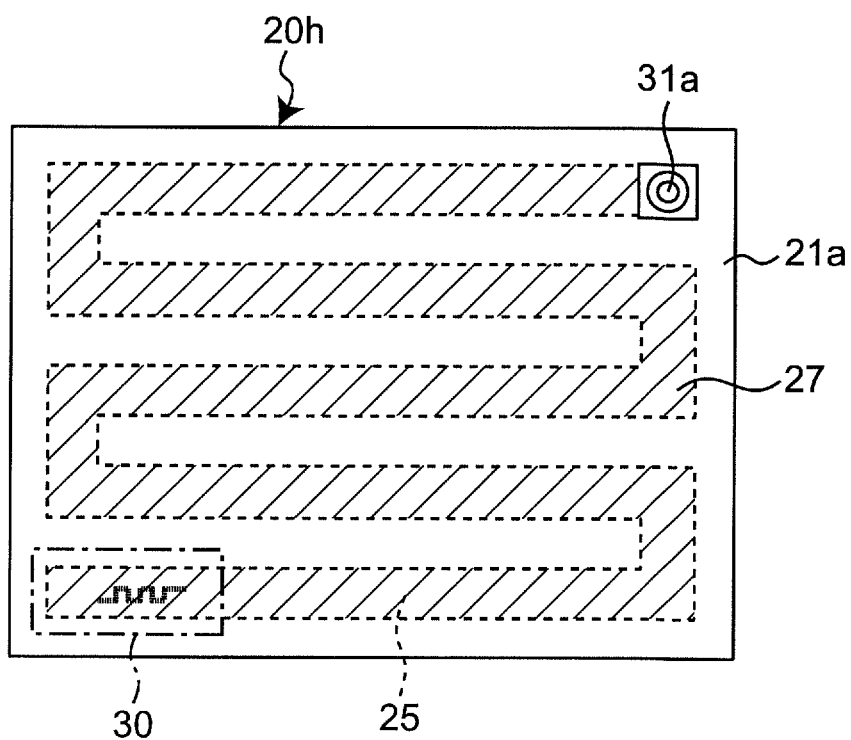
FIG. 25 is a plan diagram of a flat antenna in the antenna device of the ninth embodiment.
Figure 26:
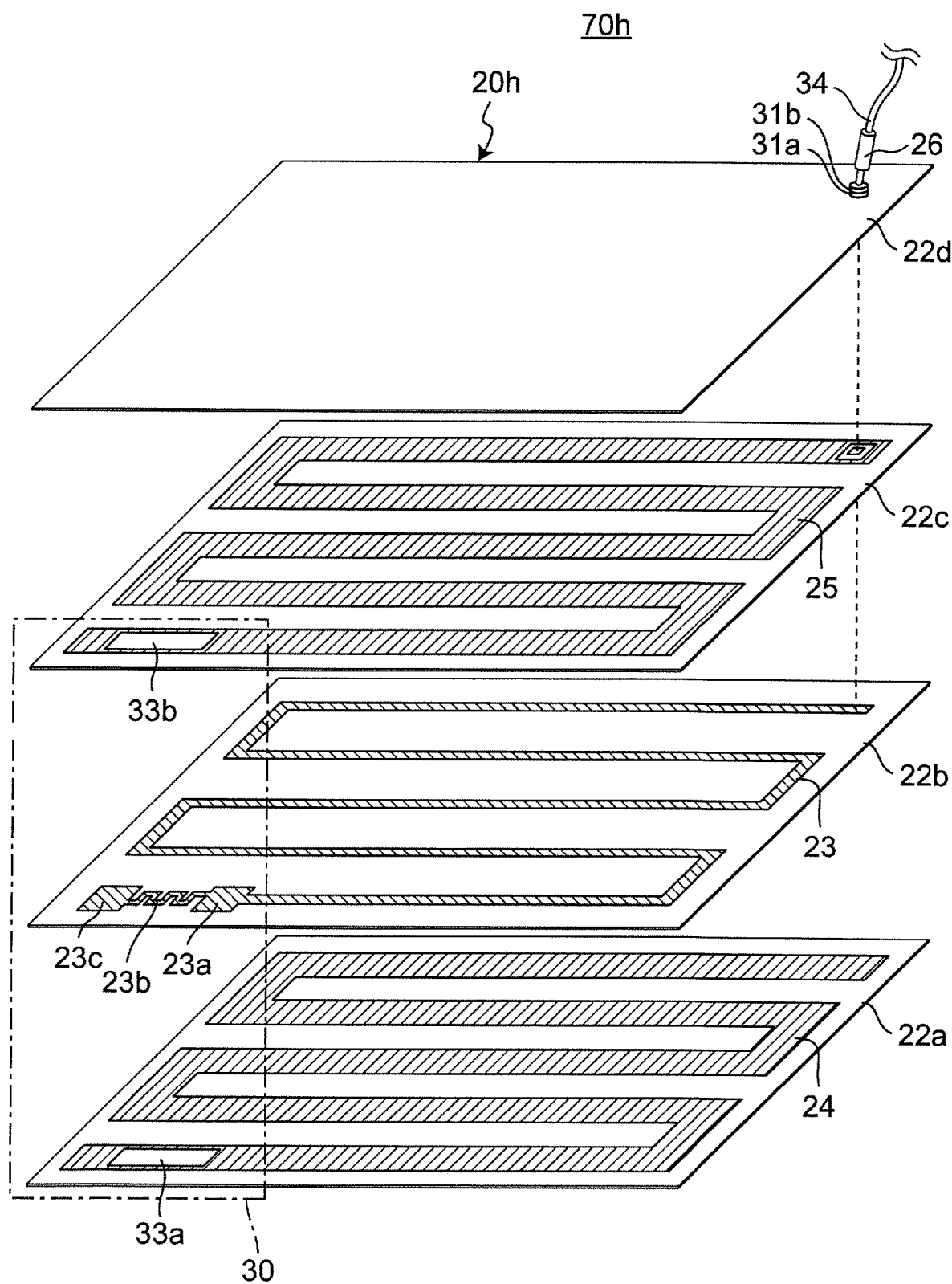
FIG. 26 is an exploded perspective diagram of the flat antenna in the antenna device of the ninth embodiment.

FIG. 24 is a perspective diagram of the antenna device 70h having the flat antenna 20h disposed therein of the ninth embodiment. FIG. 25 is a plan diagram of the flat antenna 20h of the ninth embodiment. FIG. 26 is an exploded perspective diagram of the flat antenna 20h of the ninth embodiment. As depicted in FIG. 24 and FIG. 26, the magnetic member 26 as the radiation area setting part is disposed in the vicinity of the cable-side connector part 31b of the coaxial cable 34 that is the signal transmission cable. The flat antenna 20h therefore has a configuration for the overall flat antenna 20h to act as the radiation part 27.

The flat antenna 20h in the antenna device 70h of the ninth embodiment has a sheet-like insulator 21a (an antenna-side insulator) disposed therein that is formed by stacking on each other the first conductor layer 23 to be the antenna-side signal line path conductor, the second conductor layer 24 to be the antenna-side first ground conductor, and the third conductor layer 25 to be the antenna-side second ground conductor. In the flat antenna 20h of the ninth embodiment, the radiating portion 27 formed by the first conductor layer 23, the second conductor layer 24, and the third conductor layer 25 is formed to have a winding meander shape and is arranged on the substantially overall sheet-like insulator 21a. The flat antenna 20h of the ninth embodiment has a configuration according to which the external conductors (the second conductor layer 24 and the third conductor layer 25) sandwiching therebetween the meander-shaped internal conductor (the first conductor layer 23) is paved on the overall insulator 21a that has a flat face having the broadening.

The flat antenna 20h of the ninth embodiment has the configuration for the radiation part 27 to be formed to have the winding meander shape while the radiation part 27 is depicted in a linear winding shape as exemplification in FIG. 24 and FIG. 26. Examples of the meander shape in the present invention include a general curved winding shape.

Compared to the flat cable-like antenna 20 of the above first embodiment, the flat antenna 20h of the ninth embodiment differs therefrom in the point that the flat antenna 20h is configured for the meander radiation part 27 to be paved on the overall insulator 21a that is formed to have a large width and to be flat while the other configurations thereof are substantially same as those of the first embodiment. The radiation part 27 can be widened in the xy-plane and a large communication area can be formed using the large xy-plane as its radiation face by forming the radiation part 27 to have the meander shape.

For the flat antenna 20h of the ninth embodiment, the shape for the radiation part 27 to be arranged substantially uniformly on the overall insulator 21a is advantageously employed as the shape of the meander radiation part 27. For the meander shape of the radiation part 27, the communication area for the electric wave to be transmittable and receivable therein can be defined by forming the meander shape in accordance with the wavelength (λ) of the electric wave to be radiated. According to an experiment conducted by the inventors, it turned out that the communication area was expanded for the same output by setting the interval between the bent portions and/or the length of the substantially linear portion of the meander shape to be substantially one wavelength (one λ), and the area of the communication area was able to be varied by varying this interval and/or this length.

In the flat antenna 20h of the ninth embodiment, as depicted in FIG. 24, the magnetic member 26 partitioning the radiation part 27 and the non-radiation part from each other is disposed in the vicinity of the cable-side connector part 31b of the coaxial cable 34. The magnetic member 26 is disposed to have, for example, a cylindrical shape and to be penetrated by the coaxial cable 34 in the vicinity of the cable-side connector part 31b. In the flat antenna 20h, the substantially overall face of the insulator 21a therefore acts as a radiation area RA (see FIG. 24).

The antenna-side connector part 31a in the flat antenna 20h of the ninth embodiment is a surface mounted connector, includes terminals that are connected to the antenna-side internal conductor and the antenna-side external conductor, and is mounted on the insulator 21a.

The flat antenna 20h of the ninth embodiment has been described taking the example where the radiation part 27 is formed by the antenna-side internal conductor of the first conductor layer 23 and the antenna-side external conductors of the second conductor layer 24 and the third conductor layer 25, like the radiation part 27 of the first embodiment depicted in FIG. 5 described above while the configuration is not limited to this exemplary configuration. For example, the configuration of the radiation part of the antenna-side internal conductor and the antenna-side external conductors described in the other embodiments may be formed to have a winding meander shape and may be arranged on the substantially overall face of the sheet-like insulator 21a having the large-width and flat face. The same effect is achieved as that of the configuration of the ninth embodiment even when, for example, the configuration of the radiation part of the third embodiment depicted in FIG. 13, the configuration of the radiation part of the fourth embodiment depicted in FIG. 14, the configuration of the radiation part of the fifth embodiment depicted in FIG. 16, the configuration of the radiation part of each of the sixth embodiment and the seventh embodiment depicted in each of FIG. 18 and FIG. 19, the configuration of the radiation part of the eighth embodiment depicted in FIG. 20, or the like is formed to have the meander shape and is configured to be arranged on the substantially overall face of the sheet-like insulator that has the large-width and flat face.

In the flat antenna 20h configured as above, the radiation part 27 has predetermined broadening in the width direction (the y-direction) and the substantially overall face of the sheet-like insulator 21a acts as the radiation area RA that is substantially flat, wide, and large.

<Rack for Displaying Merchandise>

Figure 27:
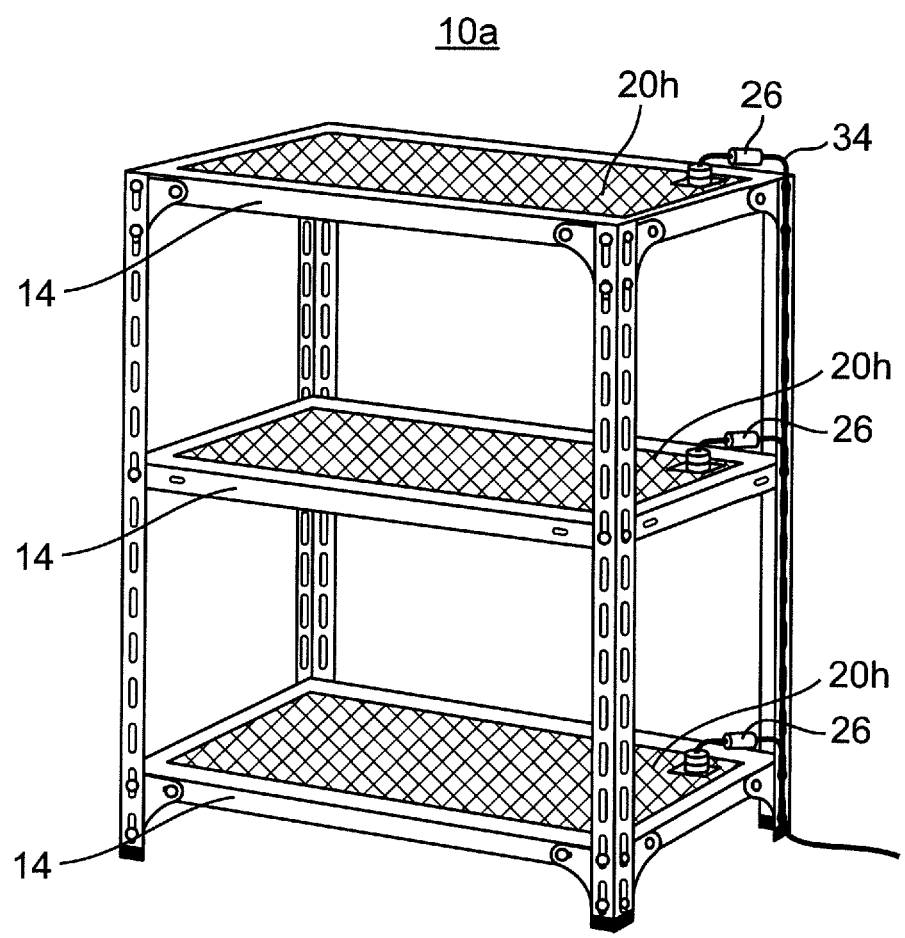
FIG. 27 is a perspective diagram of a rack for displaying merchandise that has the antenna device depicted in FIG. 24 disposed thereon.

FIG. 27 is a perspective diagram of a rack 10a for displaying merchandise, having the antenna device 70h disposed therein that is enabled to transmit and receive signals by connecting the coaxial cable 34 to the flat antenna 20h of the ninth embodiment depicted in FIG. 24.

As depicted in FIG. 27, the rack 10a for displaying merchandise is a metal rack and includes shelf boards 14 in three tiers of upper, middle, and lower ones. In the rack 10a for displaying merchandise depicted in FIG. 27, the flat antenna 20h is arranged to cover the substantially overall face of each of the shelf boards 14 at the upper tier, the middle tier, and the lower tier. In the rack 10a for displaying merchandise configured as above, merchandise each having the RFID tag attached thereto can be displayed on the shelf boards 14 and the merchandise on the shelf boards 14 can reliably be recognized. As a result, communication is executed by the flat antenna 20h with the RFID tag of each of the merchandise displayed on the shelf boards 14 of the rack 10a for displaying merchandise and the management and the like of the merchandise on the shelf boards 14 changing from moment to moment can thereby easily and reliably be executed.

The rack 10a for displaying merchandise is not limited to the one made from a metal, and a wooden or a resin rack or the like can also use the flat antenna 20h. Types of the rack 10a for displaying merchandise include a shelf, a table, a frame, and the like to display merchandise thereon, and also include those each to be used for displaying merchandise such as a hanger rack, a display table, and a display shelf.

Figure 28:
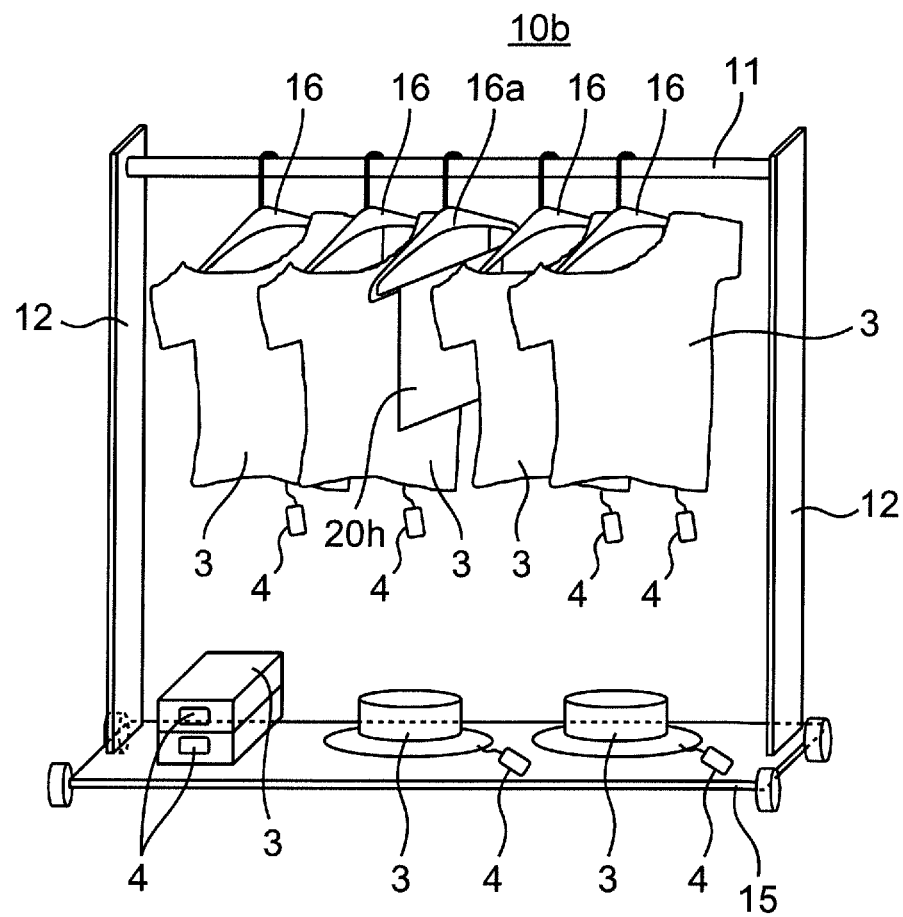
FIG. 28 is a perspective diagram of a hanger rack that has the antenna device depicted in FIG. 24 disposed thereon.
Figure 29:
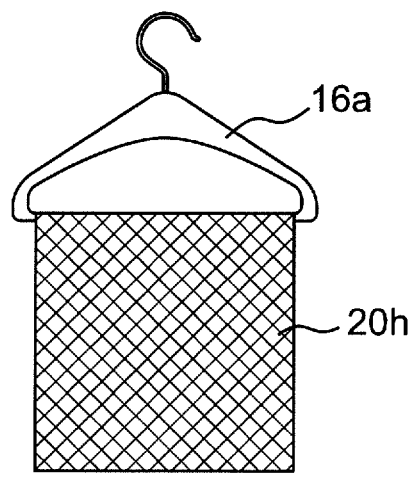
FIG. 29 is a diagram of a hanger that has the antenna device depicted in FIG. 24 disposed thereon.

FIG. 28 depicts a hanger rack 10b as the rack 10a for displaying merchandise that has the antenna device 70h disposed therein. The hanger rack 10b has a configuration according to which at least two support posts 12 are erected and a hanger pipe 11 is supported by the two support posts 12. The hanger rack 10b has a configuration that enables merchandise to be displayed also on a mount 15 to erect the support posts 12 thereon.

In the hanger rack 10b, on the hanger pipe 11, hangers 16 each having a merchandise 3 held thereon are hooked and a hanger 16a (see FIG. 29) having the sheet-like flat antenna 20h having the flat face disposed thereon is also hooked. The management and the like of the merchandise 3 displayed in the hanger rack 10a can be executed by using the sheet-like flat antenna 20h, by hooking the hanger 16a that has the flat antenna 20h as above on the hanger pipe 11.

The RFID tag 4 of the displayed merchandise 3 may be configured to, for example, be attached to the merchandise 3 using a strap or the like while the configuration is not limited to this configuration and the RFID tag 4 may directly be attached to the merchandise 3. The RFID tag 4 may include an RFIC element and a dipole antenna that includes two antenna elements extending on both sides of the RFIC element, as an example. The antenna element may be a loop antenna. The configuration of the antenna element of the RFID tag 4 may properly be selected in accordance with the frequency band of the communication, and the like. The RFIC element may be packaged together with the matching circuit part. The RFID tag 4 is usually attached to the merchandise 3 or is physically connected thereto by strapping or the like while the attachment form is not limited to this. For example, the RFID tag 4 and the merchandise 3 may physically be separated from each other and may each individually be arranged. In this case, the RFID tag 4 also only has to be related to the merchandise 3.

The merchandise 3 to have the RFID tag 4 attached thereto may be, for example, in addition to a garment, a food, an eating utensil, a container, a small merchandize, or the like. As to jewelry merchandise, foods, eating utensils, and the like each needing careful handling, their inventory management and the management concerning their security can be executed without directly touching each of this merchandise 3.

Information on the RFID tag 4 attached to each of the merchandise 3 as above (see FIG. 28) is read by the power feeding circuit to which the flat antenna 20h is connected and the merchandise management is thereby executed.

Figure 30:
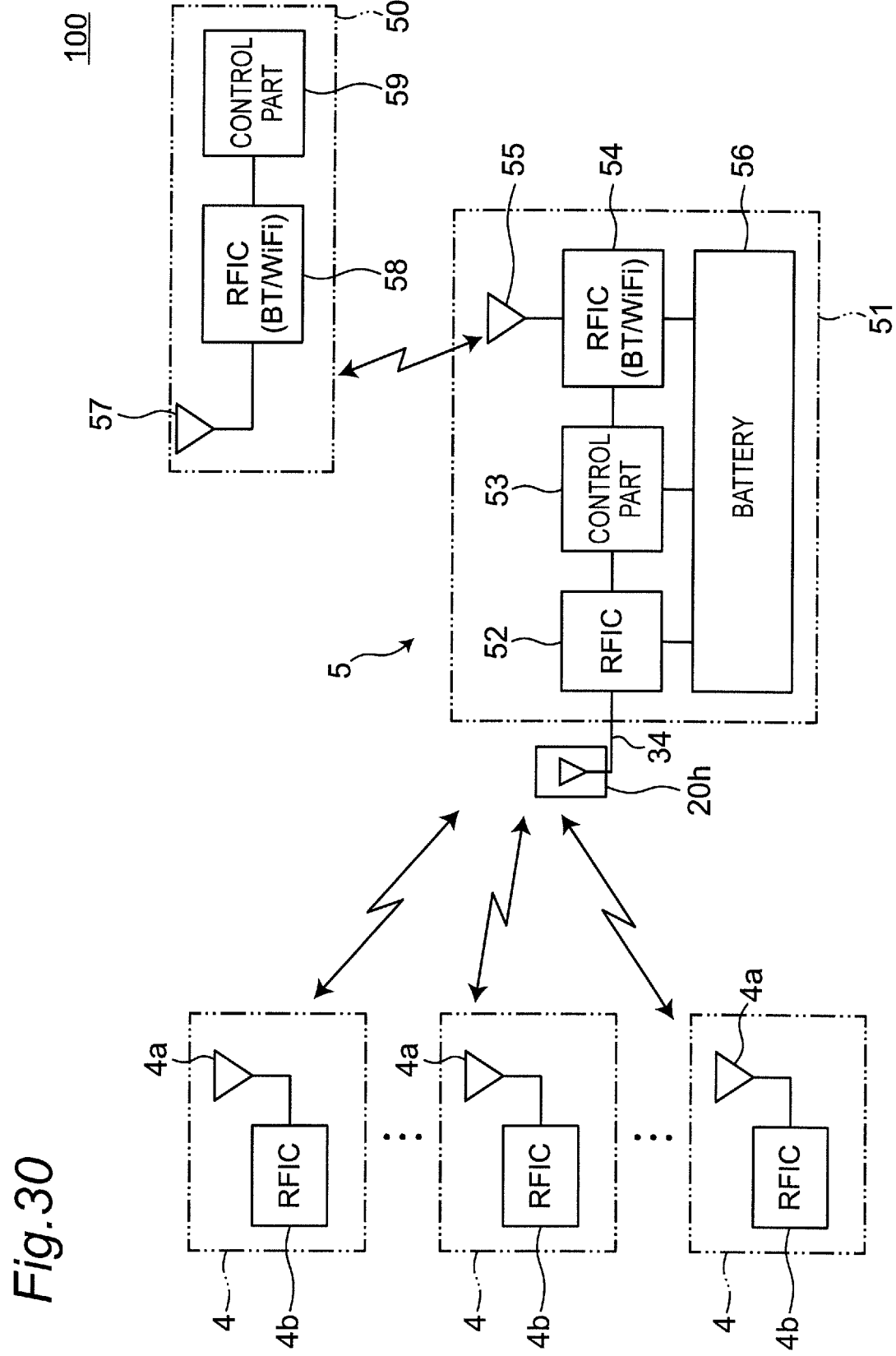
FIG. 30 is a block diagram of a schematic configuration of a merchandise management system that uses the antenna device of the ninth embodiment.

A merchandise management system will be described that executes the merchandise management of the plural merchandise 3 using the flat antenna 20h of the ninth embodiment. FIG. 30 is a block diagram of a schematic configuration of the merchandise management system 100 that uses the flat antenna 20h of the ninth embodiment.

As depicted in FIG. 30, the merchandise management system 100 includes a reader device 5 that is a power feeding circuit including a reader module 51 connected to the flat antenna 20h through the coaxial cable 34, and a store side terminal 50 that executes the merchandise management of the plural merchandise by communicating with the reader device 5.

The reader module 51 of the reader device 5 that is the power feeding circuit includes an RFIC element 52, a control part 53, an RFIC element 54, an external communication antenna 55, and a driving battery 56, for the reader device of the RFID system connected to the flat antenna 20h. The RFIC element 54 is an integrated circuit element for WiFi (a registered trademark)/Bluetooth (a registered trademark) communication and is connected to the external communication antenna 55 of the store side terminal 50.

The external communication antenna 55 is an antenna for a UHF band or an SHF band that communicates with the store side antenna 57 using, for example, WiFi (a registered trademark)/Bluetooth (a registered trademark). The external communication antenna 55 and the store side antenna 57 have therebetween a communication distance of, for example, 10 m to 100 m and execute therebetween short distance radio communication using a communication frequency band of a 2.4 GHz-band or a 5 GHz-band. The flat antenna 20h and the dipole antenna 4a of the RFID tag 4 attached to the merchandise execute communication using a 900 MHz-band.

The communication between the external communication antenna 55 of the reader module 51 and the store side antenna 57 of the store side terminal 50, and the communication between the flat antenna 20h and the dipole antenna 4a of the RFID tag 4 differ from each other in the communication frequency band, and the intensity and the nature of the electric wave. Any property degradation of the antenna due to the interference between the antennas is therefore suppressed. The antenna used in the short distance radio communication system is a resonance-system antenna.

The battery 56 of the reader module 51 supplies electric power to the RFIC element 52, the control part 53, and the RFIC element 54.

The store side terminal 50 includes a store side antenna 57, an RFIC element 58, and a control part 59. The store side antenna 57 in the store side terminal 50 is an antenna to communicate with the external communication antenna 55 of the reader device 5. The store side antenna 57 executes short distance radio communication with the external communication antenna 55 of the reader device 5 in, for example, the UHF band or the SHF band. The RFIC element 58 is an integrated circuit element for WiFi (a registered trademark)/Bluetooth (a registered trademark) communication and is connected to the store side antenna 57.

The control part 59 in the store side terminal 50 manages the information of the RFID tag 4 attached to the merchandise 3. For example, the control part 59 executes merchandise management of the loading and unloading history of the merchandise 3, and the like. For example, the control part 59 detects in real time the acceptance or rejection of reading of a specific RFID tag 4, and thereby manages the history that includes the number of times of taking out the merchandise 3 having the specific RFID tag 4 attached thereto from the hanger rack 10*b* on which the merchandise 3 is hooked and returning the merchandise 3 thereto. The inventory management of the plural merchandise 3 can thereby be more accurately executed. The control part 59 may execute the merchandise management interlocking the accounting process therewith.

The communication between the store side terminal 50 and the reader module 51 of the reader device 5 has been described with reference to the configuration for the communication to be executed using radio communication while the present invention is not limited to this configuration. For example, the communication between the store side terminal 50 and the reader module 51 of the reader device 5 may be executed using wired communication.

The reader module 51 of the reader device 5 includes the battery 56 and the battery 56 is a relatively heavy part in the reader device 5. The reader module 51 is therefore advantageously disposed on a vertical line that passes through the center of gravity of the reader device 5, and the stability of the reader device 5 during the attachment thereof can thereby be improved.

As above, the merchandise management system 100 has the configuration according to which the reader module 51 of the reader device 5 connected to the flat antenna 20*h* through the coaxial cable 34 reads the various types of information from the RFID tag 4 attached to each of the merchandise 3 received by the flat antenna 20*h*, transmits the information to the store side terminal 50, and executes the merchandise management and the like. The reader device 5 may be configured to read the information of the RFID tag 4 and have a reader and writer function to write the information into the RFID tag 4.

In the above rack 10*a* for displaying merchandise depicted in FIG. 27, the reader module 51 in the reader device 5 that is the power feeding circuit is arranged at an inconspicuous position such as the back face of the shelf board 14 or the like from the flat antenna 20*h* on the shelf board 14 through the coaxial cable 34. In the hanger rack 10*b* depicted in FIG. 28, the reader module 51 may be arranged inside the hanger 16*a* (such as, for example, the shoulder portion thereof) that has the flat antenna 20*h* disposed thereon.

The configuration of the merchandise management system 100 described with reference to FIG. 30 is a configuration that is applicable to the merchandise management system that uses each of the flat antennas of the embodiments described herein. The merchandise management system 100 configured as above achieves the same effect as the effect achieved when the flat antenna 20*h* of the ninth embodiment is used.

Tenth Exemplary Embodiment

Figure 31:
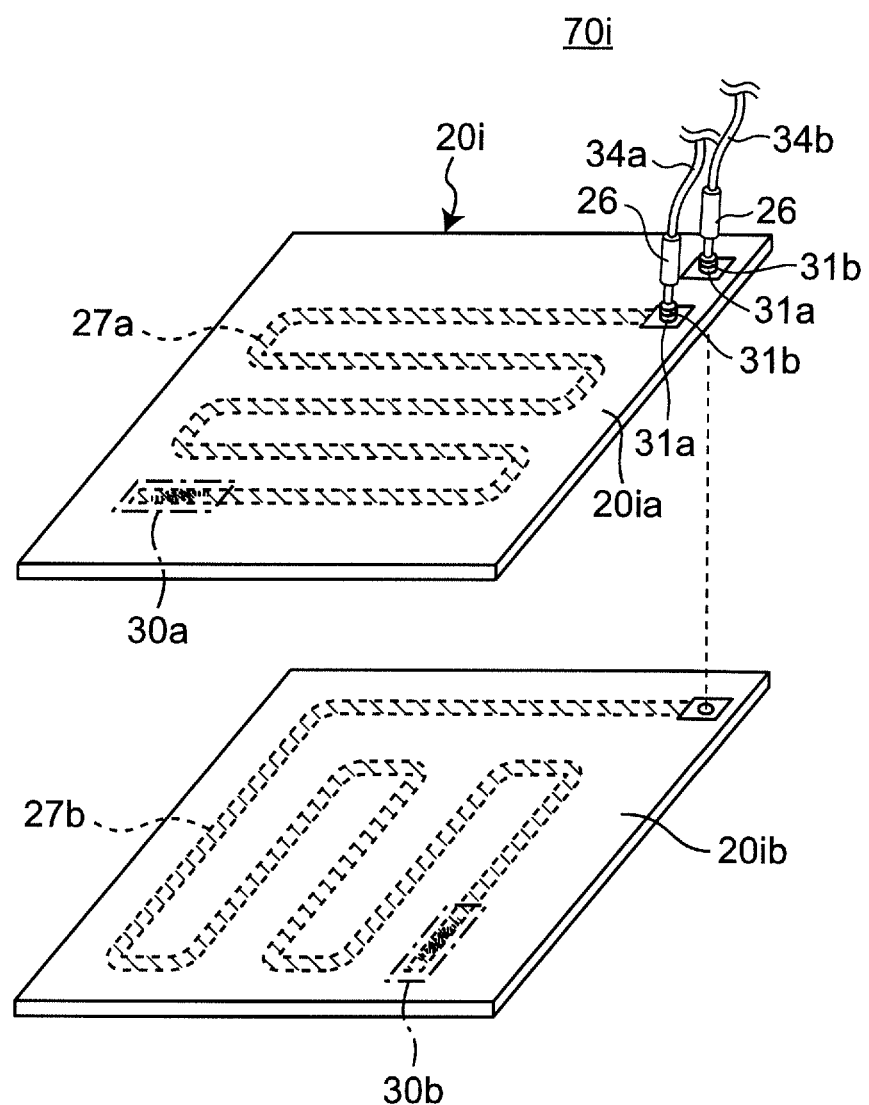
FIG. 31 is an exploded perspective diagram of an antenna device of a tenth exemplary embodiment.
Figure 32:
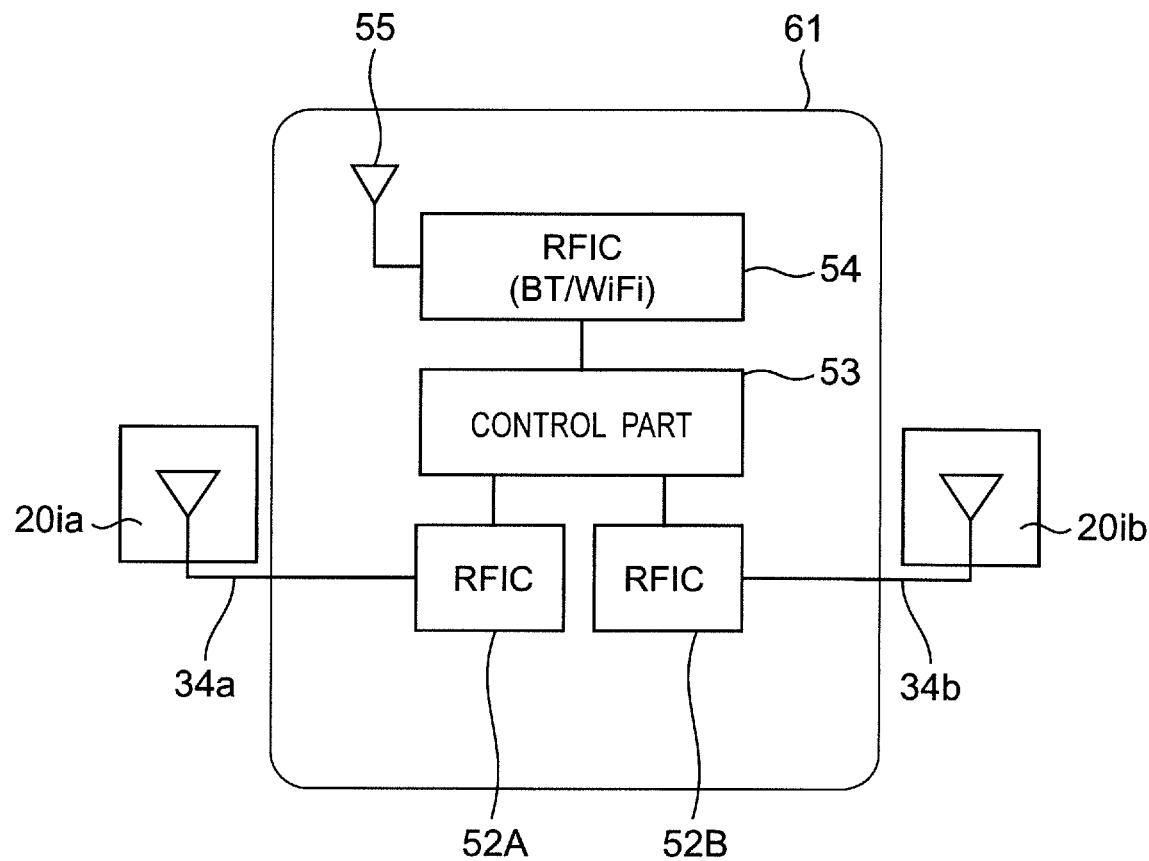
FIG. 32 is a block diagram of the configuration of a reader device that is connected to the antenna device of the tenth embodiment.
Figure 33:
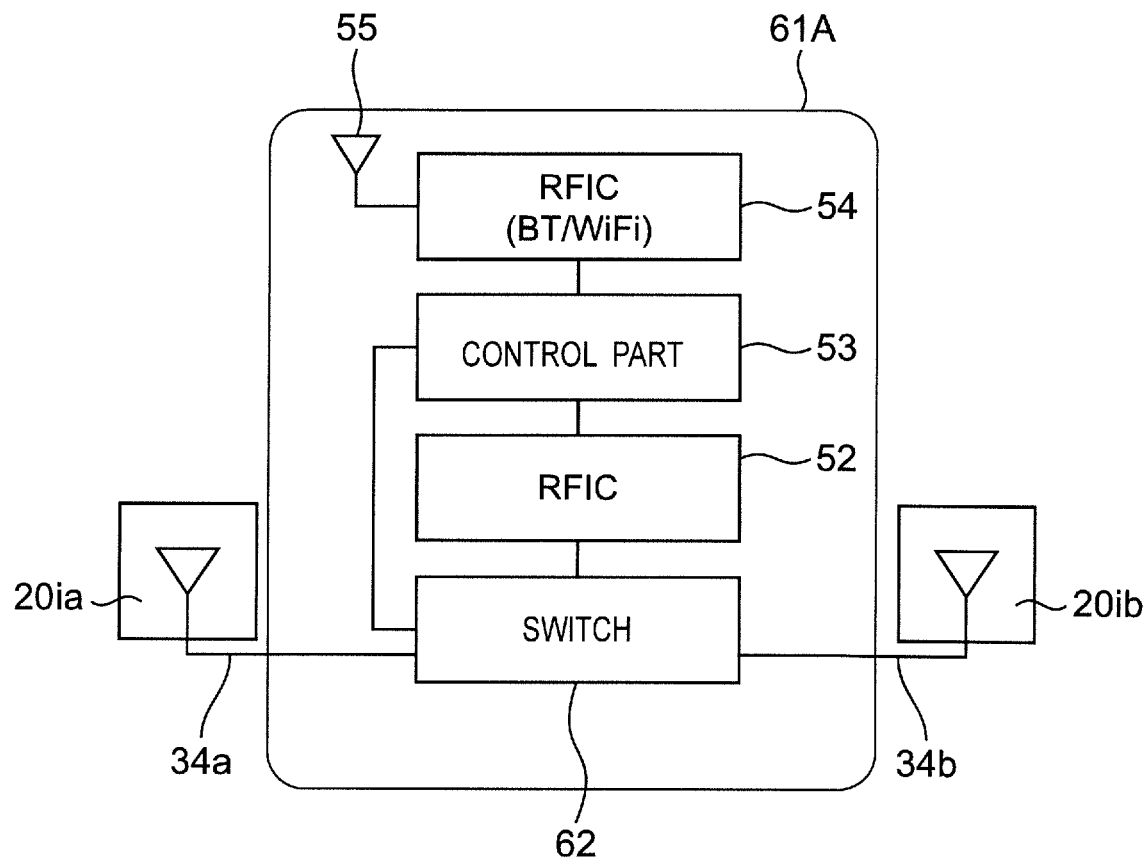
FIG. 33 is a block diagram of a modification example of the reader device that is connected to the antenna device of the tenth embodiment.

A flat antenna 20*i* in an antenna device of the tenth embodiment will be described next with reference to FIG. 31 to FIG. 33 accompanying hereto. In FIG. 31 to FIG. 33, elements having functions and configurations substantially same as those of the elements of the flat antenna described in the above embodiments are given the same reference numerals. Basic operations in the tenth embodiment are same as the operations in the above first embodiment, and the points that differ from the first embodiment and the ninth embodiment will therefore be mainly described in the tenth embodiment.

Compared to the flat antenna 20*h* in the antenna device 70*h* of the above ninth embodiment, the flat antenna 20*i* in the antenna device 70*i* of the tenth embodiment differs therefrom in the point that, handling the flat antenna 20*h* of the ninth embodiment as one set of flat antenna part, the flat antenna 20*i* includes two sets thereof that are stacked on each other. Using the two flat antenna 20*h* each described in the ninth embodiment as a first flat antenna part 20*ia* and a second flat antenna part 20*ib*, the flat antenna 20*i* of the tenth embodiment has these two sets disposed therein being stacked on each other. The flat antenna 20*i* of the tenth embodiment is configured for the pattern shapes of the conductors of the radiation parts 27 in the first flat antenna part 20*ia* and the second flat antenna part 20*ib* to avoid overlapping on each other.

FIG. 31 is an exploded perspective diagram of the flat antenna 20*i* in the antenna device 70*i* of the tenth embodiment, and depicts the fact that the flat antenna 20*i* includes the first flat antenna part 20*ia* and the second flat antenna part 20*ib* that are stacked on each other. As depicted in FIG. 31, the magnetic members 26 and 26 as the radiation area setting parts are disposed in the vicinities of the cable-side connector parts 31*b* and 31*b* of coaxial cables 34*a* and 34*b* that are the signal transmission cables. The flat antenna 20*i* is therefore configured for the overall flat antenna 20*i* to act as the radiation part 27.

The first flat antenna part 20*ia* and the second flat antenna part 20*ib* each has the configuration that is substantially same as that of the flat antenna 20*h* of the ninth embodiment. The meander pattern shape in a radiation part 27*a* of the first flat antenna part 20*ia* and the meander pattern shape in a radiation part 27*b* of the second flat antenna part 20*ib* are however disposed to avoid overlapping on each other in a planar view. For example, as depicted in FIG. 31, in the configuration of the tenth embodiment, the meander pattern shapes of the first conductor layer 23, the second conductor layer 24, and the third conductor layer 25 that constitute the radiation part 27*a* of the first flat antenna part 20*ia* are arranged at positions substantially rotated by 90 degrees relative to and are stacked on the meander pattern shapes of the first conductor layer 23, the second conductor layer 24, and the third conductor layer 25 that constitute the radiation part 27*b* of the second flat antenna part 20*ib*.

Because, in the flat antenna 20*i* formed by at least the two flat antenna parts (20*ia* and 20*ib*) stacked on each other as above, the positions of the pattern shapes of the conductor layers of the flat antenna parts (20*ia* and 20*ib*) differ from each other, the radiation pattern as an antenna is therefore expanded and the recognition operation of the RFID tag 4 attached to the merchandise 3 in the communication area is established to further be reliable.

The flat antenna 20*i* of the tenth embodiment has been described taking the example where the pattern shapes of the conductor layers of the flat antenna parts (20*ia* and 20*ib*) are arranged at positions rotated by substantially 90 degrees relative to each other while the present invention is not limited to this configuration and any configuration may be employed only when, at least, the pattern shapes of the conductor layers in the flat antenna parts are arranged to avoid overlapping on each other in a planar view and the radiation pattern is expanded.

The magnetic members 26 in the antenna device 70*i* of the tenth embodiment are disposed in the vicinities of the cable-side connector parts 31*b* connected to the antenna-side connector parts 31a of the first flat antenna part 20ia and the second flat antenna part 20ib. The antenna-side connector parts 31a of the first flat antenna part 20ia and the second flat antenna part 20ib may be arranged at positions proximal to each other on the face of either thereof, or may be configured for the two coaxial cables 34a and 34b to be disposed in parallel to each other to penetrate the one magnetic member 26.

FIG. 32 is a block diagram of the configuration of a reader device 60 including a reader module 61 that is connected to the flat antenna 20i in the antenna device 70i of the tenth embodiment. As depicted in FIG. 32, in the reader device 60, the reader module 61 is connected to the first flat antenna part 20ia and the second flat antenna part 20ib.

The reader module 61 includes a first RFIC element 52A, a second RFID element 52B, the control part 53, the RFID element 54, and the external communication antenna 55 for the reader device in the RFID system. Though not depicted in FIG. 32, the reader module 61 has the driving battery 56 (see FIG. 30) disposed therein and the driving battery 56 functions as the power source for these elements. The RFIC element 54 is an integrated circuit element for WiFi (a registered trademark)/Bluetooth (a registered trademark) communication and is connected to the external communication antenna 55 to communicate with the store side terminal 50 (see FIG. 30).

The first RFIC element 52A is connected to the first flat antenna part 20ia through the coaxial cable 34a. The second RFIC element 52B is connected to the second flat antenna part 20ib through the coaxial cable 34b. The first RFIC element 52A and the second RFIC element 52B are connected to the control part 53.

The control part 53 executes control of switching the operation of the first RFIC element 52A and the operation of the second RFIC element 52B therebetween every predetermined time period in a time-sharing manner. The configuration for the communication operation to be executed with the first flat antenna part 20ia and the second flat antenna part 20ib is established by executing the control of switching in the time-sharing manner. The first flat antenna part 20ia and the second flat antenna part 20ib each have a large radiation pattern but each have directivity to some extent. The configuration is therefore established for the radiation pattern to further be expanded, by causing the first flat antenna part 20ia and the second flat antenna part 20ib to alternately operate.

For example, when the merchandise are displayed using the hanger rack 10b depicted in FIG. 28, the RFID tag 4 attached to each of the merchandise 3 that are hooked on the hanger pipe 11 may be rotated. As depicted in FIG. 28, the orientation of the RFID tags 4 attached to the merchandise 3 placed on the mount 15 of the hanger rack 10b is not uniform. As a result, some RFID tag 4 may not be read by the first flat antenna part 20ia, of the RFID tags 4.

The flat antenna 20i of the tenth embodiment has the configuration for the first flat antenna part 20ia and the second flat antenna part 20ib whose radiation patterns differ from each other to be stacked on each other to form the radiation pattern having the substantially omnidirectional directivity, and all the RFID tags 4 in the communication area identified by the flat antenna 20i can therefore be reliably read.

As above, the flat antenna 20i of the tenth embodiment is configured such that the first flat antenna part 20ia and the second flat antenna part 20ib are driven being switched therebetween every predetermined time period by the reader device 60 and the configuration is therefore established that enables the RFID tag 4 attached to each of the merchandise 3 to reliably be read when the RFID tag 4 is within the communication area even in the case where the RFID tag 4 is rotated.

The configuration of the reader device to execute the communication control by having the flat antenna 20i of the tenth embodiment connected thereto is not limited to the configuration depicted in FIG. 32. Modification examples of the reader device include, for example, a reader device having the configuration depicted in FIG. 33.

FIG. 33 is a block diagram of the configuration of a reader device 60A that includes a modification example of a reader module 61A connected to the flat antenna 20i of the tenth embodiment. As depicted in FIG. 33, the reader module 61A in the reader device 60A has a switching element 62 disposed therein that has a switching function. The switching element 62 is connected to each of the first flat antenna part 20ia and the second flat antenna part 20ib.

The reader device 60A depicted in FIG. 33 differs from the reader device 60 depicted in FIG. 32 in the point that the reader module 61A is configured such that the operations of the RFIC element 52 is switched by the switching element 62 in the time-sharing manner.

In the reader device 60A depicted in FIG. 33, the reader module 61A includes the RFIC element 52, the switching element 62 that switches the operations of the RFIC element 52, the control part 53, the RFIC element 54, and the external communication antenna 55, for the reader device in the RFID system. Though not depicted in FIG. 33, the reader module 61A has a driving battery to drive the internal elements thereof.

In the reader module 61A, the RFIC element 52 is connected to the switching element 62. The switching element 62 is connected to the flat antenna part 20ia through the coaxial cable 34a and is also connected to the second flat antenna part 20ib through the coaxial cable 34b.

The control part 53 in the reader module 61A controls the switching element 62 to switch the communication between the RFIC element 52 and the first flat antenna part 20ia, and the communication between the RFIC element 52 and the second flat antenna part 20ib therebetween in the time-sharing manner.

The communication operations of the first flat antenna part 20ia and the second flat antenna part 20ib are switched every predetermined time period by using the reader device 60A depicted in FIG. 33 configured as above, and the configuration is therefore established that enables the RFID tag 4 attached to each of the merchandise 3 to reliably be read when the RFID tag 4 is within the communication area even in the case where the RFID tag 4 is rotated.

Eleventh Exemplary Embodiment

Figure 34:
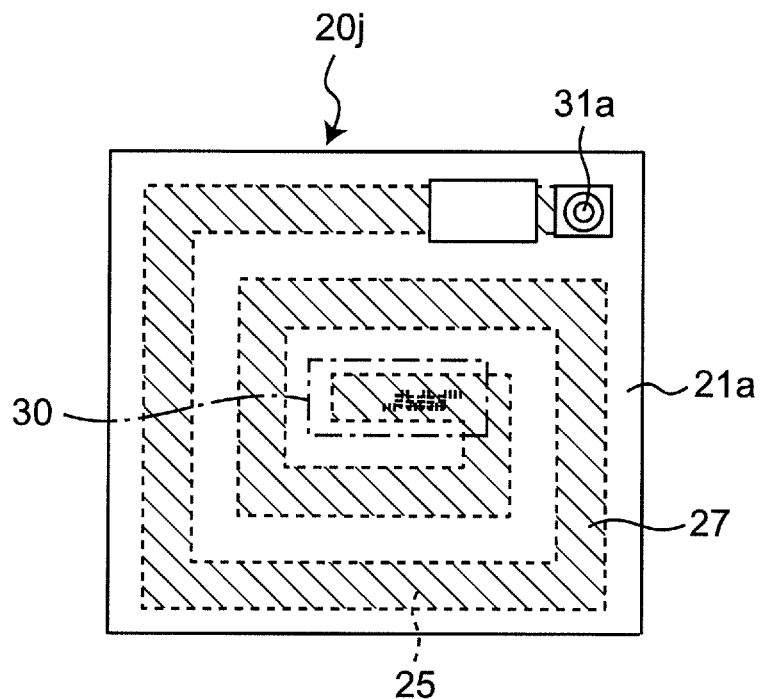
FIG. 34 is a plan diagram of a flat antenna in an antenna device of an eleventh exemplary embodiment.

A flat antenna 20j in an antenna device of the eleventh embodiment will be described next with reference to FIG. 34 accompanying hereto. In FIG. 34, elements having functions and configurations substantially same as those of the elements of the flat antenna 20h described in the above ninth embodiment are given the same reference numerals. Basic operations in the eleventh embodiment are same as the operations in the above first embodiment, and the points that differ from the first embodiment and the ninth embodiment will therefore be mainly described in the eleventh embodiment.

Compared to the flat antenna 20h of the ninth embodiment, the flat antenna 20j of the eleventh embodiment differs therefrom in the point that the pattern shapes of the antenna-side internal conductor and the antenna-side external conductors of the radiation part 27 are spiral shapes. The other configurations of the flat antenna 20j of the eleventh embodiment are same as those of the flat antenna 20h of the ninth embodiment.

FIG. 34 is a plan diagram of the flat antenna 20j of the eleventh embodiment. In the flat antenna 20j of the eleventh embodiment, the radiation part 27 formed by the first conductor layer (the antenna-side signal line path conductor) to be the antenna-side internal conductor, and the second conductor layer (the antenna-side first ground conductor) and the third conductor layer (the antenna-side second ground conductors) to be the antenna-side external conductors is formed to have a spiral shape that is a vortex. The first conductor layer, the second conductor layer, and the third conductor layer have the same configurations respectively as those of the first conductor layer 23, the second conductor layer 24, and the third conductor layer 25 depicted in FIG. 5 and FIG. 26 described above.

As depicted in FIG. 34, the flat antenna 20j of the eleventh embodiment has the configuration according to which the antenna-side external conductors disposed to sandwich therebetween the spiral antenna-side internal conductor is paved on the overall insulator 21a that includes the flat face having the broadening. The flat antenna 20j has the configuration according to which the antenna-side connector part 31a is disposed in the vicinity of the edge of the insulator 21a and the matching circuit part 30 to be the tip portion of the radiation part 27 is arranged in the substantially central portion of the insulator 21a to be the antenna-side insulator. In the flat antenna 20j of the eleventh embodiment, a surface mounted connector is disposed as the antenna-side connector part 31a and the magnetic member 26 is disposed in the vicinity of the cable-side connector part 31b that is connected to the antenna-side connector part 31a. As a result, as depicted in FIG. 34, in the flat antenna 20j of the eleventh embodiment, the substantially overall face of the insulator 21a having the broadened width face thereof substantially acts as the radiation part.

The flat antenna 20j of the eleventh embodiment has been described taking the example where the radiation part 27 is formed by the antenna-side internal conductor of the first conductor layer 23 and the antenna-side external conductors of the second conductor layer 24 and the third conductor layer 25 like the radiation part 27 depicted in FIG. 5 and FIG. 26 while the configuration of the present invention is not limited to this example of the configuration. For example, the radiation part of the antenna-side internal conductor and the antenna-side external conductors described in the other embodiments may each be formed to have a spiral shape and the radiation part may be arranged on the substantially overall face of the insulator that includes the flat face having broadened width. For example, the same effect is achieved as that of the configuration of the eleventh embodiment even when the configuration of the radiation part of the third embodiment depicted in FIG. 13, the configuration of the radiation part of the fourth embodiment depicted in FIG. 14, the configuration of the radiation part of the fifth embodiment depicted in FIG. 16, the configuration of the radiation part of each of the sixth and the seventh embodiments depicted in each of FIG. 18 and FIG. 19, the configuration of the radiation part of the eighth embodiment depicted in FIG. 20, or the like is formed to have the spiral shape and is configured to be arranged on the substantially overall face of the insulator that includes the flat face having the broadened width.

In the flat antenna 20j configured as above, the radiation part has predetermined broadening in the width direction (the y-direction) and the substantially overall face of the insulator 21a substantially acts as the radiation area that is flat, broad, and large.

Twelfth Exemplary Embodiment

Figure 35:
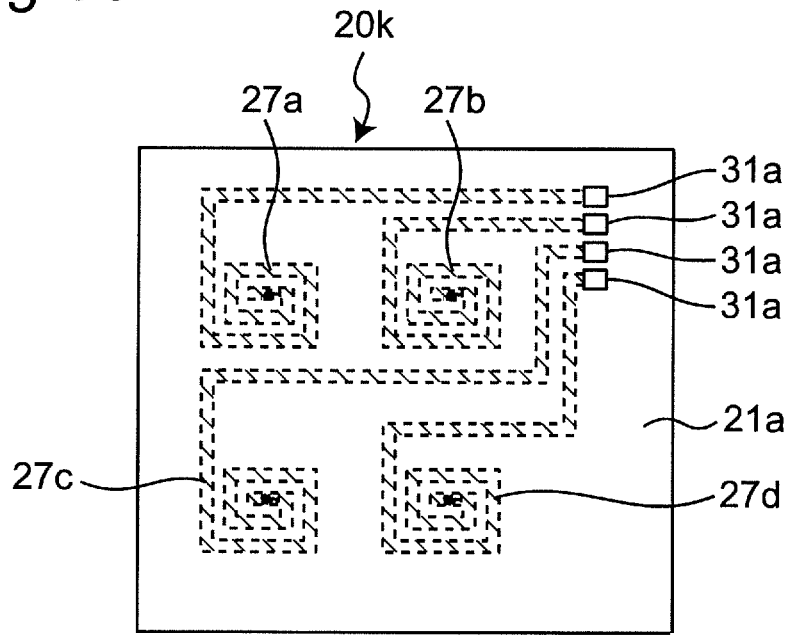
FIG. 35 is a plan diagram of a flat antenna in an antenna device of a twelfth exemplary embodiment.

A flat antenna 20k in an antenna device of the twelfth embodiment will be described next with reference to FIG. 35 accompanying hereto. FIG. 35 is a plan diagram of the flat antenna 20k of the twelfth embodiment. In FIG. 35, elements having functions and configurations substantially same as those of the elements of the flat antenna 20j described in the above eleventh embodiment are given the same reference numerals. Basic operations in the twelfth embodiment are same as the operations in the above first embodiment, and the points that differ from the first embodiment and the eleventh embodiment will therefore be mainly described in the twelfth embodiment.

Compared to the flat antenna 20j of the eleventh embodiment, the flat antenna 20k in the twelfth embodiment differs therefrom in the point that plural radiation parts 27a, 27b, 27c, and 27d are disposed on the insulator 21a that includes the flat face having a broad width. The radiation parts 27a, 27b, 27c, and 27d in the flat antenna 20k of the twelfth embodiment each have the same configuration as that of the radiation part 27 of the eleventh embodiment. The radiation parts 27a, 27b, 27c, and 27d are each formed by the first conductor layer to be the antenna-side internal conductor, and the second conductor layer and the third conductor layer to be the antenna-side external conductors, and are each formed to have the spiral shape.

The flat antenna 20k of the twelfth embodiment has the configuration according to which the radiation parts 27a, 27b, 27c, and 27d therein are each an independent antenna and, as depicted in FIG. 32 or FIG. 33 described above, the communication operations are executed being switched therebetween in the time-sharing manner by the control part/the switching element of the reader device. The radiation parts 27a, 27b, 27c, and 27d in the flat antenna 20k have the same shape, the same functions, and the same configuration, and have the spiral direction arranged in the same direction. Each of the radiation parts 27a, 27b, 27c, and 27d can be configured to have a relatively small shape and the communication performance can further be enhanced. The plural radiation parts 27a, 27b, 27c, and 27d are arranged evenly on the overall insulator 21a.

In the flat antenna 20k of the twelfth embodiment configured as above, the radiation parts 27a, 27b, 27c, and 27d each having the relatively small spiral shape are evenly disposed on the overall large insulator 21a having the broad width and a radiating area that is substantially flat, wide, and large can therefore be formed. As a result, the configuration is established that enables the RFID tag 4 attached to the merchandise 3 in the communication area to be further reliably read.

Thirteenth Exemplary Embodiment

Figure 36:
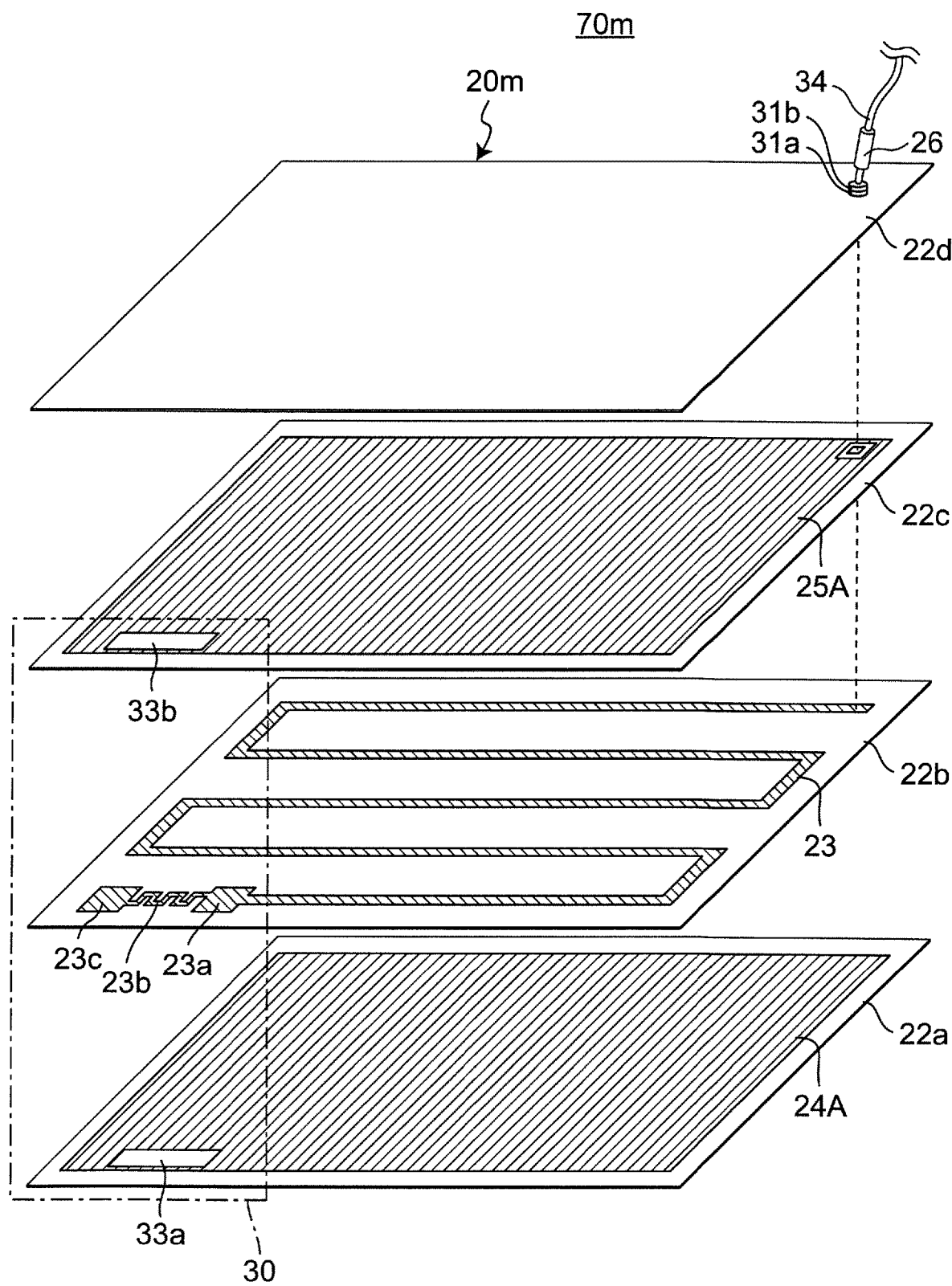
FIG. 36 is an exploded perspective diagram of a flat antenna in an antenna device of a thirteenth exemplary embodiment.

A flat antenna 20m in an antenna device 70m of the thirteenth embodiment will be described next with reference to FIG. 36 accompanying hereto. FIG. 36 is an exploded perspective diagram of the flat antenna 20m of the thirteenth embodiment. As depicted in FIG. 36, the flat antenna 20m of the thirteenth embodiment has a configuration according to which the conductor layers of the second conductor layer 24 and the third conductor layer 25 in the flat antenna 20h of the ninth embodiment depicted in FIG. 26 described above are formed on the substantially overall face of the insulating layer. In FIG. 36, elements having functions and configurations substantially same as those of the elements of the flat antenna 20h described in the above ninth embodiment are given the same reference numerals. Basic operations in the thirteenth embodiment are same as the operations in the above first embodiment, and the points that differ from the first embodiment and the ninth embodiment will therefore be mainly described in the thirteenth embodiment.

In the flat antenna 20m in the thirteenth embodiment, the first conductor layer 23 to be the antenna-side signal line path conductor is formed to have the winding meander shape. On the other hand, the conductor layers of a second conductor layer 24A and a third conductor layer 25A to be the antenna-side ground conductors are each formed in a sheet and are arranged on the substantially overall faces of the sheet-like insulating layers (22a and 22c) and the what-is-called conductor layers (24A and 25A) are solidly formed respectively on the insulating layers (22a and 22c). The second conductor layer 24A to be the antenna-side first ground conductor is formed on the substantially overall face of the first insulating layer 22a, the third conductor layer 25A to be the antenna-side second ground conductor is formed on the substantially overall face of the third insulating layer 22c. The other configurations of the thirteenth embodiment are same as the configurations of the ninth embodiment. As depicted in FIG. 36, the magnetic member 26 as the radiation area setting part is disposed in the vicinity of the cable-side connector part 31b of the coaxial cable 34 that is the signal transmission cable.

In the flat antenna 20m of the thirteenth embodiment configured as above, the substantially overall face of the sheet-like insulator 21a acts as the radiation part 27 that is a substantially flat, wide, and large radiation area.

The configuration of the second conductor layer 24A and the third conductor layer 25A of the flat antenna 20m of the thirteenth embodiment is also applicable to the flat antennas (20i, 20j, and 20k) described in the tenth to the twelfth embodiments, and the substantially overall face of the insulator 21a can be caused to act as the substantially flat, wide, and large radiation area.

Fourteenth Exemplary Embodiment

An antenna device 70n of the fourteenth embodiment will be described next with reference to FIG. 37 and FIG. 38 accompanying hereto. The antenna device 70n of the fourteenth embodiment includes the flat cable-like antenna 20 described in the first embodiment. The antenna device 70n of the fourteenth embodiment will be described with reference to the configuration that includes the flat cable-like antenna 20 of the first embodiment while the configuration of the antenna device 70n is not limited to this configuration and may be a configuration including the flat antenna that is described in each of the above embodiments.

Figure 37:
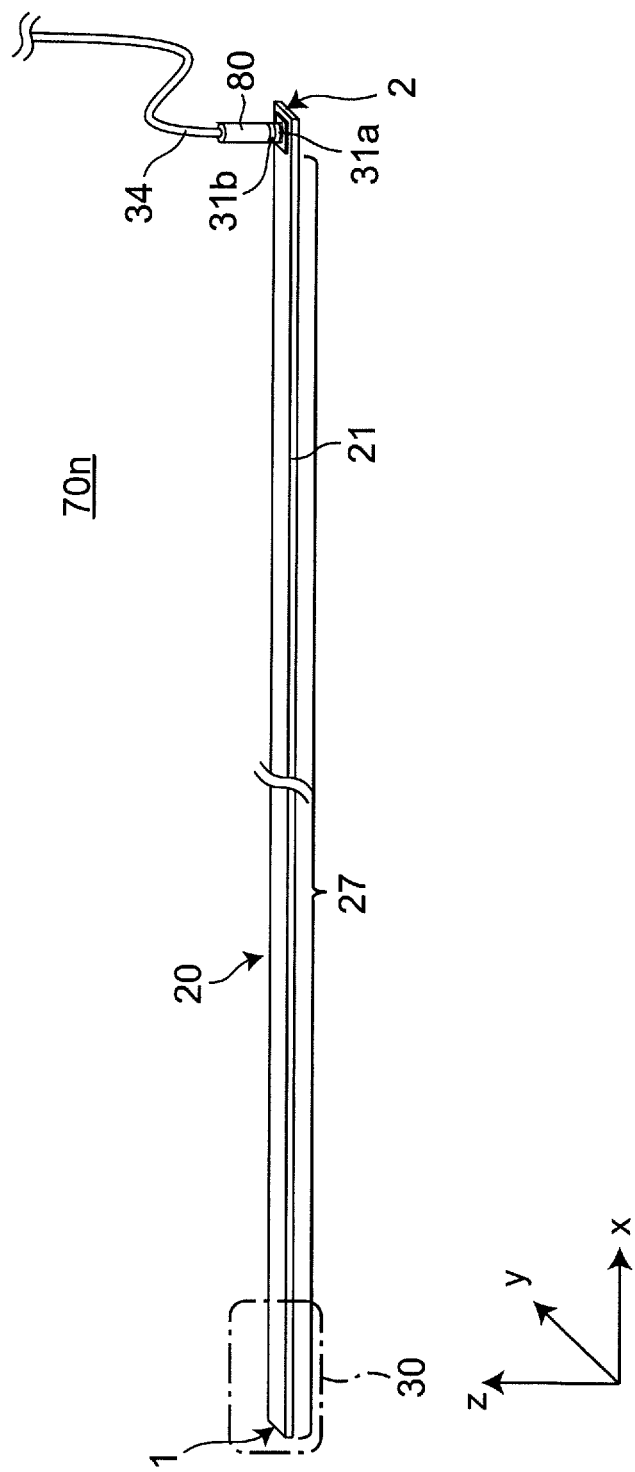
FIG. 37 is a schematic perspective diagram of the configuration of an antenna device of a fourteenth exemplary embodiment.
Figure 38:
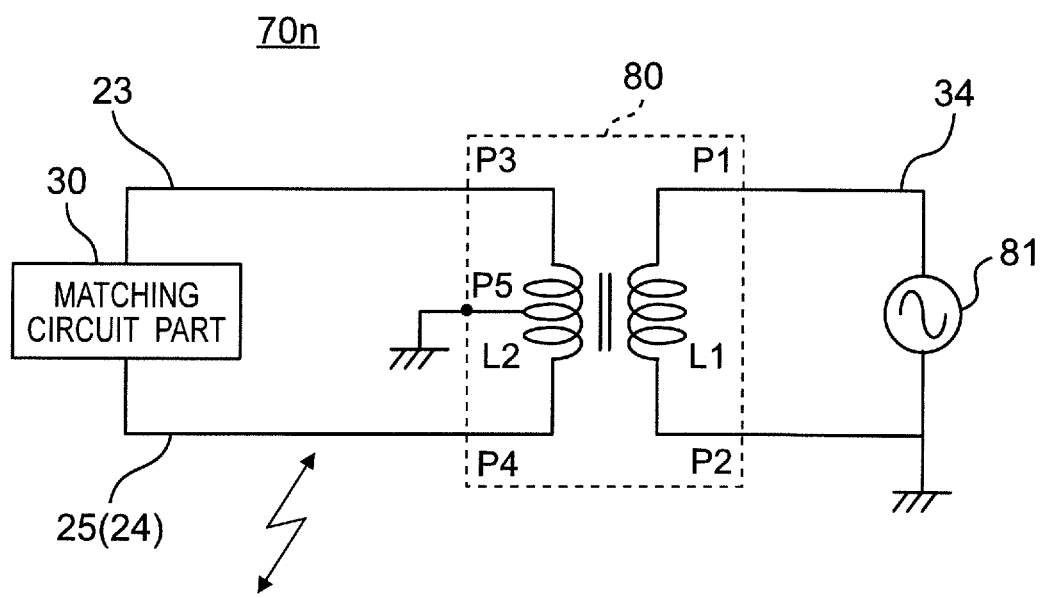
FIG. 38 is an equivalent circuit diagram of the configuration of a balun that is disposed in the antenna device of the fourteenth embodiment.

In FIG. 37 and FIG. 38, elements having functions and configurations substantially same as those of the first embodiment are given the same reference numerals. Basic operations as an antenna in the fourteenth embodiment are same as the basic operations in the first embodiment, and the points that differ from the first embodiment will therefore be mainly described in the fourteenth embodiment.

FIG. 37 is a perspective diagram of the antenna device 70n including the flat cable-like antenna 20. As depicted in FIG. 37, the antenna device 70n of the fourteenth embodiment has a configuration according to which a balun 80 to be a balanced-to-unbalanced transformer as the radiation area setting part demarcating the radiation part 27 and the non-radiation part from each other is disposed in the coaxial cable 34 that is the signal transmission cable to which the flat cable-like antenna 20 is connected through the antenna-side connector part 31a and the cable-side connector part 31b. The balun 80 is disposed in the vicinity of the cable-side connector part 31b of the coaxial cable 34.

Compared to the antenna device 70 of the above first embodiment, the antenna device 70b of the fourteenth embodiment differs therefrom in the point that the balun 80 to be the balanced-to-unbalanced transformer is disposed as the radiation area setting part instead of the magnetic member 26 while the other configurations thereof are substantially same as those of the first embodiment. FIG. 38 is an equivalent circuit diagram of the configuration of the balun 80 that is disposed in the antenna device 70n of the fourteenth embodiment.

As depicted in the equivalent circuit diagram of FIG. 38, the balun 80 of the fourteenth embodiment has a transformer-type configuration, and includes a primary side coil L1 and a secondary side coil L2. The balun 80 has input and output terminals P1 and P2 connected to the primary side coil L1, input and output terminals P3 and P4 connected to the secondary side coil L2, and a ground terminal P5 to connect the intermediate position of the secondary side coil L2 to the ground, disposed therein. The input and output terminals P1 and P2 of the primary side coil L1 are connected to the power feeding circuit 81 through the cable-side connector part 31b. On the other hand, the input and output terminal P3 of the secondary side coil L2 is connected to the antenna-side internal conductor 23 through the cable-side connector part 31b and the antenna-side connector part 31a, and the input and output terminal P4 of the secondary side coil L2 is electrically connected to the antenna-side external conductors 24 and 25 through the cable-side connector part 31b and the antenna-side connector part 31a. As to the balun 80 that is the balanced-to-unbalanced transformer, the balanced terminal thereof is connected to the antenna-side internal conductor 23 that is the antenna-side signal line path conductor and the antenna-side external conductors 24 and 25 that are the antenna-side ground conductors. On the other hand, the unbalanced terminal of the balun 80 that is the balanced-to-unbalanced transformer is connected to the cable-side internal conductor 6 that is the cable-side signal line path conductor and the cable-side external conductor 7 that is the cable-side ground conductor. The impedance of the antenna-side internal conductor 23 and that of the antenna-side external conductors 24 and 25 are matched with each other by the matching circuit part 30 disposed at the position of the antenna tip of the flat cable-like antenna 20.

In the antenna device 70n of the fourteenth embodiment configured as above, the overall face area of the flat cable-like antenna 20 functions as the radiation part 27. On the other hand, the coaxial cable 34 having the balun 80 disposed therein acts as the non-radiation part. The overall face of the flat cable-like antenna 20 can be identified as the radiation part 27 by disposing the balun 80 as the radiation area setting part, and the configuration is therefore established with which the electric length of the antenna line path in the radiation part 27 can easily be set to be an integral multiple of $\lambda/2$ and preferably an even multiple thereof "$\lambda$" represents the wavelength of the frequency in the used frequency band such as, for example, the UHF band. The configuration with which any leakage from the power feeding point of the balun 80 to the side of the power feeding circuit is blocked and a stable communication property is presented by the standing wave in the radiation part 27, is established by setting the electric length of the antenna line path to be an integral multiple of λ/2 and preferably an even multiple thereof as above. As a result, the antenna device 70n of the fourteenth embodiment has the configuration having a highly efficient and highly reliable communication property.

For the antenna device 70n of the fourteenth embodiment, the configuration thereof with which the radiating area to the radiation part 27 and the non-radiation part can definitely be demarcated from each other established by disposing the balun 80 as the radiation area setting part. Compared to the configuration for any leaking signal to be attenuated using the magnetic member as the radiation area setting part described in the above embodiments, the antenna device 70n of the fourteenth embodiment has the configuration for any leakage to the side of the power feeding circuit to be blocked and reflected to the radiation area by disposing the balun 80, and therefore has the configuration for any energy loss to significantly be suppressed. Compared to the configuration using the magnetic member as the radiation area setting part, the configuration enables facilitation of reduction of the size and the weight of the radiation area setting part. The radiation area can definitely be identified by disposing the balun 80 as the radiation area setting part, and the configuration is therefore established that facilitates the setting of the electric length of the antenna line path in the radiation area to be an integral multiple of λ/2 and preferably an even multiple thereof. As above, the antenna device 70n of the fourteenth embodiment is established as a highly reliable antenna device presenting a stable communication property and a low reflection loss.

Fifteenth Exemplary Embodiment

Figure 39:
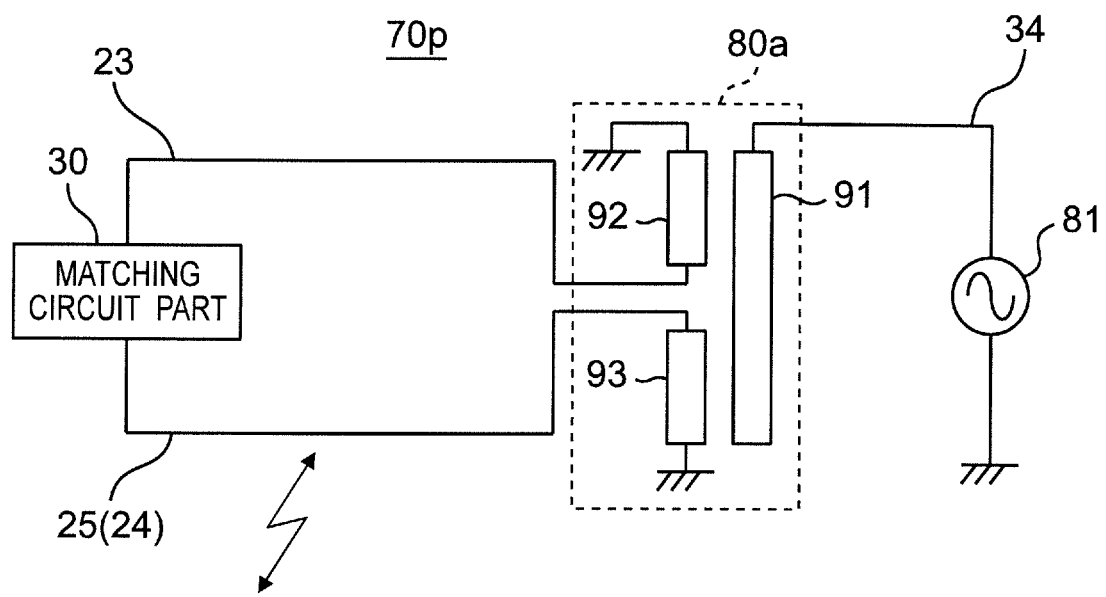
FIG. 39 is an equivalent circuit diagram of the configuration of a balun that is disposed in an antenna device of a fifteenth exemplary embodiment.

An antenna device 70p of the fifteenth embodiment will be described next with reference to FIG. 39 accompanying hereto. FIG. 39 is an equivalent circuit diagram of the configuration of a balun 80a that is disposed in the antenna device 70p of the fifteenth embodiment. In FIG. 39, elements having functions and configurations substantially same as those of the above embodiments are given the same reference numerals. Basic operations as an antenna in the fifteenth embodiment are same as the basic operations in the first embodiment, and the points that differ from the first embodiment will therefore be mainly described in the fifteenth embodiment.

Similar to the antenna device 70n of the fourteenth embodiment, the antenna device 70p of the fifteenth embodiment includes the flat cable-like antenna 20 described in the first embodiment. The point for the antenna device 70p of the fifteenth embodiment to differ from the configuration of the antenna device 70n of the fourteenth embodiment is the configuration of the balun 80a as the radiation area setting part and the other configurations are same as the configurations of the antenna device 70n of the fourteenth embodiment. The antenna device 70p of the fifteenth embodiment will be described with reference to the configuration that includes the flat cable-like antenna 20 of the first embodiment while the configuration of the antenna device 70p is not limited to this configuration and may be a configuration including the flat antenna that is described in each of the above embodiments.

As depicted in the equivalent circuit diagram in FIG. 39, the balun 80a of the fifteenth embodiment has a merchant-type configuration and has the configuration using electromagnetic-field coupling. As depicted in FIG. 39, the balun 80a includes conductor patterns including a first strip conductor 91 connected to the coaxial cable 34 from the power feeding circuit 81, a second strip conductor 92 connected to the first conductor layer 23 to be the antenna-side signal line path conductor (a high side (a hot side) line path), and a third strip conductor 93 connected to the second conductor layer 24 and the third conductor layer 24 to be the antenna-side ground conductor (a low side (a cold side) line path). The balun 80a has a configuration for the first strip conductor 91 and the second strip conductor 92 to be electromagnetic-field-coupled with each other and the first strip conductor 91 and the third strip conductor 93 to be electromagnetic-field-coupled with each other.

For the antenna device 70p of the fifteenth embodiment, the configuration enabling definite demarcation of the radiation area and the non-radiation area from each other is established by disposing the merchant-type balun 80a as the radiation area setting part. Compared to the configuration for any leaking signal to be attenuated using the magnetic member as the radiation area setting part described in the above embodiments, the antenna device 70p of the fifteenth embodiment has the configuration for any leakage to the side of the power feeding circuit to be blocked and reflected to the radiation area by disposing the balun 80a, and therefore has the configuration that significantly suppresses any energy loss. Compared to the configuration using the magnetic member as the radiation area setting part, the configuration enables facilitation of reduction of the size and the weight of the radiation area setting part. As above, the antenna device 70p of the fifteenth embodiment is established as a highly reliable antenna device presenting a stable communication property and a low reflection loss.

Sixteenth Exemplary Embodiment

Figure 40:
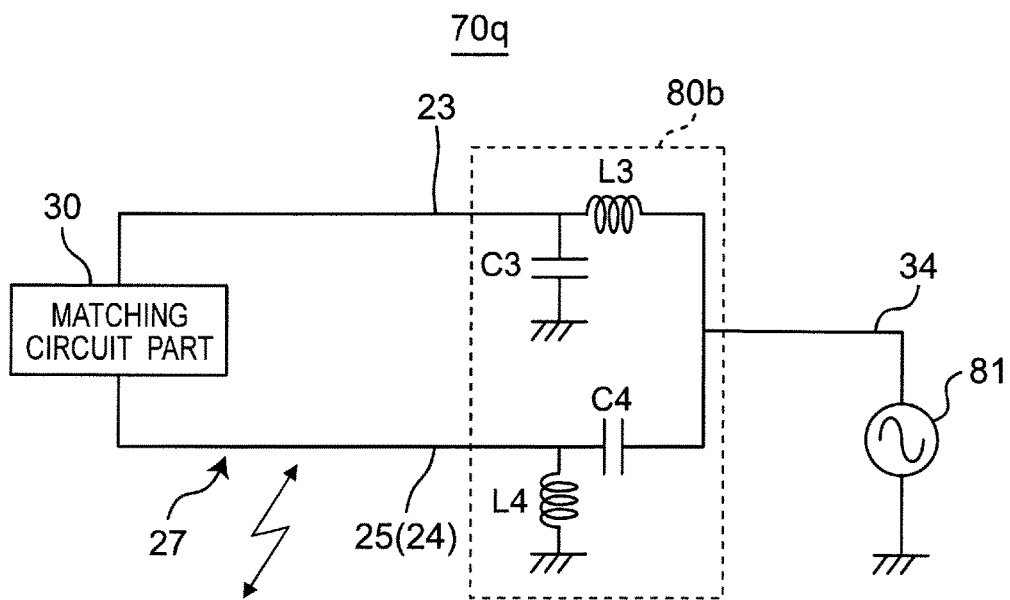
FIG. 40 is an equivalent circuit diagram of the configuration of a balun that is disposed in an antenna device of a sixteenth exemplary embodiment.

An antenna device 70q of the sixteenth embodiment will be described next with reference to FIG. 40 accompanying hereto. FIG. 40 is an equivalent circuit diagram of the configuration of a balun 80b that is disposed in the antenna device 70q of the sixteenth embodiment. In FIG. 40, elements having functions and configurations substantially same as those of the above embodiments are given the same reference numerals. Basic operations as an antenna in the sixteenth embodiment are same as the basic operations in the first embodiment, and the points that differ from the first embodiment will therefore be mainly described in the sixteenth embodiment.

Similar to the antenna device 70n of the fourteenth embodiment, the antenna device 70q of the sixteenth embodiment includes the flat cable-like antenna 20 described in the first embodiment. The point for the antenna device 70q of the sixteenth embodiment to differ from the configuration of the antenna device 70n of the fourteenth embodiment is the configuration of the balun 80b and the other configurations are same as the configurations of the antenna device 70n of the fourteenth embodiment. The antenna device 70q of the sixteenth embodiment will be described with reference to the configuration that includes the flat cable-like antenna 20 of the first embodiment while the configuration of the antenna device 70q is not limited to this configuration and may be a configuration including the flat antenna that is described in each of the above embodiments.

As depicted in the equivalent circuit diagram of FIG. 40, the balun 80b as the radiation area setting part in the antenna device 70*q* of the sixteenth embodiment is a lumped-parameter-type balun configured using lumped parameters (L and C).

Elements in the lumped-parameter-type balun 80*b* of the sixteenth embodiment may each be formed by a surface mounted device as described in, for example, the fourteenth embodiment, or may each be formed by a conductor pattern of an incorporated pattern type as described in the fifteenth embodiment.

As depicted in FIG. 40, the balun 80*b* of the sixteenth embodiment includes an inductor L3 electrically connecting the coaxial cable 34 from the power feeding circuit 81 and the first conductor layer 23 to be the antenna-side signal line path conductor (a high side (a hot side))) line path to each other, a capacitor C3 having one end thereof connected to the side of the high side (the hot side) line path of the inductor L3 and the other end thereof connected to the ground, a capacitor C4 connecting the coaxial cable 34 from the power feeding circuit 81, and the second conductor layer 24 and the third conductor layer 24 to be the antenna-side ground conductors (the low side (the cold side) line path) to each other, and an inductor L4 having one end thereof connected to the side of the low side (the cold side) line path of the capacitor C4 and the other end connected to the ground. Because the lumped-parameter-type balun 80*b* configured as above is disposed in the antenna device 70*q*, the configuration thereof is established, for the phase of the current flowing through the high side (the hot side) line path of the antenna line path to be delayed by 90 degrees (−90°) and the phase of the current flowing through the low side (the cold side) line path to be advanced by 90 degrees (+90°). As a result, the difference in the phase is 180 degrees between the current flowing through the high side (the hot side) line path and the current flowing through the low side (the cold side) line path, the current signals substantially annihilate each other to be cancelled at the power feeding point from the power feeding circuit 81 of the balun 80*b*, and any leaking signal from the balun 80*b* to the side of the power feeding circuit is blocked. As a result, the configuration enabling definite demarcation of the radiation area (the radiation part 27) and the non-radiation area from each other is established by disposing the balun 80*b* as the radiation area setting part to be proximal to the cable-side connector part 31*b* of the coaxial cable 34.

The antenna device 70*q* of the sixteenth embodiment configured as above has a significantly suppressed reflection loss and has a highly efficient communication property. Because the radiation area can definitely be demarcated by the balun 80*b*, the configuration is established for the electric length of the low side (the cold side) line path to substantially be the antenna line path to be able to reliably be set to be an integral multiple of λ/2 and preferably an even multiple thereof. The antenna device 70*q* of the sixteenth embodiment is therefore established as an antenna device that has a standing wave generated in the radiation area of the antenna line path to have a stable communication property.

The configuration of the balun 80*b* as the radiation area setting part is not limited to the configuration depicted in FIG. 40, and any configuration may be employed only when the configuration causes the current flowing through the high side (the hot side) line path and that flowing through the low side (the cold side) line path of the antenna line path to substantially be out-phase relative to each other and the configuration demarcates the radiation area and the non-radiation area from each other.

Figure 41:
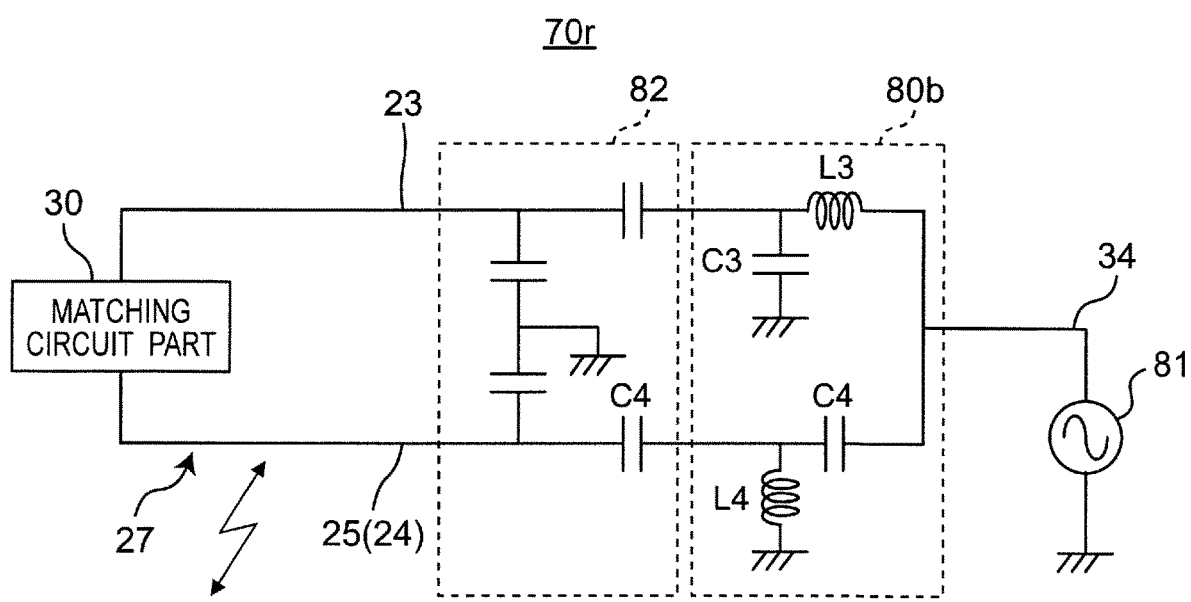
FIG. 41 is an equivalent circuit diagram of the configuration of a balun that is disposed in an antenna device that is a modification example of the sixteenth embodiment.

In the configuration having the balun 80*b* disposed therein as the radiation area setting part, an impedance matching circuit 82 may be disposed to match the impedance of the signal line path on the side of the power feeding circuit and that of the antenna line path on the side of the matching circuit part with each other. FIG. 41 depicts an example of the configuration having the impedance matching circuit 82 disposed therein together with the balun 80*b*, and is an equivalent circuit diagram of the configuration of the balun that is disposed in an antenna device 70*r*, that is a modification example of the sixteenth embodiment. As depicted in FIG. 41, the impedance matching circuit 82 has a configuration having plural capacitors disposed in the high side (the hot side) line path and the low side (the cold side) line path of the antenna line path to thereby match the impedance of the signal line path on the side of the power feeding circuit and that of the antenna line path on the side of the matching circuit part with each other.

The antenna devices 70*q* and 70*r* of the sixteenth embodiment each have the configuration having the balun 80*b* disposed therein to thereby block any leaking signal from the balun 80*b* to the side of the power feeding circuit while a magnetic body to be the magnetic member such as, for example, ferrite may be disposed in the signal line path on the side of the power feeding circuit of the balun 80*b* in addition to the balun 80*b* to cause the blocking of the leaking signal to the side of the power feeding circuit to be more reliable. The configuration is established with which any leaking signal in the signal line path is attenuated by disposing the magnetic member as above and any leaking signal to the signal line path on the side of the power feeding circuit is thereby reliably blocked. The configuration having the magnetic member disposed in the signal line path on the side of the power feeding circuit of the balun as above may be applied to the configuration of each of the other embodiments each having the balun disposed therein.

The antenna devices 70*q* and 70*r* of the sixteenth embodiment can each definitely demarcate the radiation area and the non-radiation area thereof from each other by disposing the balun 80*b* as the radiation area setting part. Compared to the configuration for any leaking signal to be attenuated using the magnetic member as the radiation area setting part, described in each of the first to the thirteenth embodiments, the antenna devices 70*q* and 70*r* of the sixteenth embodiment each have the configuration for any leakage to the side of the power feeding circuit to be blocked and reflected to the radiation area by disposing therein the balun 80*b*, and each have the configuration for the energy loss to significantly be suppressed. The configuration is further established with which, because the radiation area can definitely be identified by disposing the balun 80*b* as the radiation area setting part, the electric length of the antenna line path in the radiation area is easily set to be an integral multiple of λ/2 and preferably an even multiple thereof. As above, the antenna devices 70*q* and 70*r* of the sixteenth embodiment are each established as a highly reliable antenna device that presents a stable communication property and a low reflection loss.

It is noted that the description of the exemplary embodiments has been made taking the configuration example of the coaxial cable as the signal transmission cable in each of the embodiments while the signal transmission cable is not limited to the coaxial cable in the present invention, any flat cable for signal transmission and the like are usable, and the substantially overall face of the flat antenna may be configured to act as the radiation area by disposing the magnetic member in this signal transmission cable.

As has been described with reference to the plural configuration examples in the exemplary embodiments as above, the antenna device of the present invention has the configuration easy to be designed and has the configuration with which the communication property is not significantly varied even when a metal item or the like is present on the periphery thereof. A highly versatile electronic instrument and a highly versatile rack for displaying merchandise can be provided by applying the antenna device that achieves the above excellent effect.

The present invention includes proper combinations each including optional embodiment(s) and/or optional modification example(s) of the various embodiments and/or the various modification examples described above, and those each formed in this manner can each achieve the effects to be achieved by each of the combined embodiment(s) and/or the modification example(s).

The antenna device of the exemplary embodiments of the present invention is easy to be designed and the communication property thereof is not significantly influenced even when a metal item or the like is present on the periphery thereof, and is therefore useful especially for an instrument that uses an antenna of a reader device (a reader and writer device) in an RFID system.

EXPLANATIONS OF LETTERS OR NUMBERS 1 first end
2 second end
3 merchandize
4 RFID tag
5 reader device
6 cable-side internal conductor (cable-side signal line path conductor)
7 cable-side external conductor (cable-side ground conductor)
8 cable-side insulator
9 protective film
10 rack for displaying merchandise
20, 20a, 20b, 20c, 20d, 20e, 20f, 20g, 20h, 20i, 20j, 20k flat antenna
21, 21a insulator (antenna-side insulator)
22a first insulating layer
22b second insulating layer
22c third insulating layer
22d fourth insulating layer
23 first conductor layer (antenna-side signal line path conductor)
23a first broad width portion
23b meander portion
23c second broad width portion
24 second conductor layer (antenna-side first ground conductor)
25 third conductor layer (antenna-side second ground conductor)
26 magnetic member
27 radiation part
30 matching circuit part
31a antenna-side connector part
31b cable-side connector part
32 interlayer connection conductor
34 coaxial cable
36, 37 opening
38 PET film
40 smartphone
42 upper housing
44 lower housing
46 battery pack
50 store side terminal
51 reader module
52 RFIC element
53 control part
54 RFIC element
55 communication antenna
56 driving battery
80, 80a, 80b balanced-to-unbalanced transformer (balun)
81 power feeding circuit
70, 70a, 70b, 70c, 70d, 70n, 70p, 70q, 70r antenna device
100 merchandise management system

The invention claimed is:

1. An antenna device comprising:
a flat antenna comprising:
an antenna-side insulator that has a flat shape;
an antenna-side signal line path conductor that is disposed on the antenna-side insulator;
an antenna-side first ground conductor that is disposed on the antenna-side insulator along the antenna-side signal line path conductor, the antenna-side first ground conductor being arranged at a distance from the antenna-side signal line path conductor; and
a matching circuit that matches an impedance of the antenna-side signal line path conductor to an impedance of the antenna-side first ground conductor;
a signal transmission cable comprising:
a cable-side insulator;
a cable-side signal line path conductor that is disposed along a longitudinal direction of the cable-side insulator and has a first end connected to a power feeding circuit; and
a cable-side ground conductor that is arranged at a distance from the cable-side signal line path conductor and has a first end connected to a ground; and
a radiation area setting member disposed in a signal path from the signal transmission cable to the flat antenna, the radiation area setting member configured to demarcate the flat antenna as a radiation area and to set a signal path in the signal transmission cable as a non-radiation area,
wherein, in the antenna-side insulator, the antenna-side signal line path conductor is disposed to face the antenna-side first ground conductor at a predetermined interval therefrom,
wherein the signal transmission cable is a coaxial cable, and
wherein the radiation area setting member is a magnetic member.

2. The antenna device according to claim 1,
wherein the cable-side signal line path conductor is electrically connected to the antenna-side signal line path conductor,
wherein the cable-side ground conductor is electrically connected to the antenna-side first ground conductor, and
wherein the radiation area setting member covers at least a portion of the cable-side ground conductor.

3. The antenna device according to claim 1,
wherein the radiation area setting member comprises a balanced-to-unbalanced transformer,
wherein a balanced terminal of the balanced-to-unbalanced transformer is connected to each of the antenna-side signal line path conductor and the antenna-side first ground conductor, and wherein an unbalanced terminal of the balanced-to-unbalanced transformer is connected to each of the cable-side signal line path conductor and the cable-side ground conductor.

4. The antenna device according to claim 1, further comprising:
an antenna-side second ground conductor that is disposed on the antenna-side insulator along the antenna-side signal line path conductor, with the antenna-side second ground conductor being arranged at a distance from the antenna-side signal line path conductor, a first end of the antenna-side second ground conductor connected to the matching circuit, and a second end of the antenna-side second ground conductor connected to a ground line path,
wherein the antenna-side first ground conductor faces the antenna-side signal line path conductor in a thickness direction on a side of a principal surface of the antenna-side signal line path conductor.

5. The antenna device according to claim 1,
wherein the antenna-side first ground conductor faces the antenna-side signal line path conductor in a thickness direction on a principal surface of the antenna-side signal line path conductor, and
wherein the antenna device further comprises an antenna-side second ground conductor on another principal surface of the antenna-side signal line path conductor, with the antenna-side second ground conductor facing the antenna-side signal line path conductor in the thickness direction along the antenna-side signal line path conductor.

6. The antenna device according to claim 4, wherein the antenna-side first ground conductor is electrically connected to the antenna-side second ground conductor by an inter-layer connection conductor disposed on the antenna-side insulator.

7. The antenna device according to claim 4, wherein the antenna-side second ground conductor comprises a plurality of openings that face the antenna-side signal line path conductor in the thickness direction along the longitudinal direction of the antenna-side signal line path conductor.

8. The antenna device according to claim 1, wherein the matching circuit comprises:
a capacitance part that is disposed between the antenna-side signal line path conductor and the antenna-side first ground conductor; and
an inductance part that is disposed on the antenna-side signal line path conductor.

9. The antenna device according to claim 8, wherein the antenna-side first ground conductor comprises an opening or a cutout in an area that faces the conductance part of the matching circuit in the thickness direction.

10. The antenna device according to claim 1, wherein the antenna-side first ground conductor is adjacent to the antenna-side signal line path conductor in a width direction to sandwich the antenna-side signal line path conductor therebetween.

11. The antenna device according to any one of claim 1,
wherein the antenna-side first ground conductor faces the antenna-side signal line path conductor in a thickness direction on a first principal surface of the antenna-side signal line path conductor, and
wherein the antenna device further comprises an antenna-side second ground conductor adjacent to the antenna-side signal line path conductor in a width direction to sandwich the antenna-side signal line path conductor therebetween.

12. The antenna device according to claim 11, wherein the antenna-side first ground conductor comprises a plurality of openings that face the antenna-side signal line path conductor in the thickness direction along a longitudinal direction of the antenna-side signal line path conductor.

13. The antenna device according to claim 1, wherein the antenna-side insulator comprises a laminated structure having a plurality of insulating layers.

14. The antenna device according to claim 1, wherein a radiation part of the flat antenna comprises a meandering shape.

15. The antenna device according to claim 1, wherein the antenna-side insulator has a band-like shape along the antenna-side signal line path conductor.

16. The antenna device according to claim 1,
wherein the antenna-side insulator comprises a substantially flat face that has predetermined broadening, and
wherein the antenna-side signal line path conductor is disposed on the antenna-side insulator and has one of a meandering shape or a spiral shape.

17. The antenna device according to claim 16,
wherein the antenna device comprises at least two flat antennas that each include the antenna-side insulator, the antenna-side signal line path conductor, the antenna-side first ground conductor, and the matching circuit,
wherein pattern shapes of the antenna-side signal line path conductors in the flat antennas are arranged to avoid overlapping each other.

18. The antenna device according to claim 17, wherein a high frequency signal from the power feeding circuit to each of the flat antennas is switched therebetween every predetermined time period.

19. The antenna device according to claim 3, wherein the radiation area setting member comprises one of a balanced-to-unbalanced transformer of a wire-wound transformer type, a merchant type, or a lumped-parameter type.

20. An electronic instrument comprising:
a housing;
an antenna device disposed inside the housing and including:
a flat antenna comprising:
an antenna-side insulator that has a flat shape;
an antenna-side signal line path conductor that is disposed on the antenna-side insulator;
an antenna-side first ground conductor that is disposed on the antenna-side insulator along the antenna-side signal line path conductor and disposed at a distance from the antenna-side signal line path conductor; and
a matching circuit that matches an impedance of the antenna-side signal line path conductor to an impedance of the antenna-side first ground conductor;
a signal transmission cable comprising:
a cable-side insulator;
a cable-side signal line path conductor that is disposed along a longitudinal direction of the cable-side insulator with a first end connected to a power feeding circuit; and
a cable-side ground conductor disposed at a distance from the cable-side signal line path conductor with a first end connected to a ground; and
a radiation area setting member disposed in a signal path from the signal transmission cable to the flat antenna, with the radiation area setting member configured to demarcate the flat antenna as a radiation area and to set a signal path in the signal transmission cable as a non-radiation area, wherein, in the antenna-side insulator, the antenna-side signal line path conductor is disposed to face the antenna-side first ground conductor at a predetermined interval therefrom, wherein the signal transmission cable is a coaxial cable, and wherein the radiation area setting member is a magnetic member.

21. The electronic instrument according to claim 20, wherein the housing comprises a battery pack therein, and the flat antenna is disposed on the battery pack for communication in an RFID system.

22. A rack for displaying merchandise each having an RFID tag attached thereto, the rack comprising:
- an antenna device configured to communicate with the RFID tag and being disposed in a space having the merchandise displayed therein or laid facing the space, wherein the antenna device comprises:
- a flat antenna comprising:
  - an antenna-side insulator that has a flat shape;
  - an antenna-side signal line path conductor disposed on the antenna-side insulator;
  - an antenna-side first ground conductor disposed on the antenna-side insulator along the antenna-side signal line path conductor and disposed at a distance from the antenna-side signal line path conductor; and
  - a matching circuit that matches an impedance of the antenna-side signal line path conductor to an impedance of the antenna-side first ground conductor;
- a signal transmission cable comprising:
  - a cable-side insulator;
  - a cable-side signal line path conductor disposed along a longitudinal direction of the cable-side insulator with a first end connected to a power feeding circuit; and
  - a cable-side ground conductor disposed at a distance from the cable-side signal line path conductor with a first end connected to a ground; and
- a radiation area setting member disposed in a signal path from the signal transmission cable to the flat antenna, with the radiation area setting member configured to demarcate the flat antenna as a radiation area and to set a signal path in the signal transmission cable as a non-radiation area, wherein, in the antenna-side insulator, the antenna-side signal line path conductor is disposed to face the antenna-side first ground conductor at a predetermined interval therefrom, wherein the signal transmission cable is a coaxial cable, and wherein the radiation area setting member is a magnetic member.

\* \* \* \* \*